(12) United States Patent
Shim et al.

(10) Patent No.: US 12,327,757 B2
(45) Date of Patent: Jun. 10, 2025

(54) THREE-DIMENSIONAL SEMICONDUCTOR DEVICE

(71) Applicant: Samsung Electronics Co., Ltd., Suwon-si (KR)

(72) Inventors: Sunil Shim, Seoul (KR); Shinhwan Kang, Seoul (KR); Younghwan Son, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 215 days.

(21) Appl. No.: 17/496,902

(22) Filed: Oct. 8, 2021

(65) Prior Publication Data

US 2022/0028731 A1    Jan. 27, 2022

Related U.S. Application Data

(63) Continuation of application No. 15/954,912, filed on Apr. 17, 2018, now abandoned.

(30) Foreign Application Priority Data

Aug. 21, 2017   (KR) .......................... 10-2017-0105666

(51) Int. Cl.
*H01L 21/762*   (2006.01)
*H01L 21/761*   (2006.01)
(Continued)

(52) U.S. Cl.
CPC ...... *H01L 21/76264* (2013.01); *H01L 21/761* (2013.01); *H10B 41/10* (2023.02);
(Continued)

(58) Field of Classification Search
CPC ........ H10B 43/40; H10B 43/50; H10B 43/27; H10B 43/20; H10B 43/23; H10B 43/10;
(Continued)

(56) References Cited

U.S. PATENT DOCUMENTS 3,725,683 A  *  4/1973  Andersen ............ H01L 27/0641
                                                        148/DIG. 96
4,246,594 A  *  1/1981  Mori .................... H01L 27/1027
                                                        257/547
(Continued)

FOREIGN PATENT DOCUMENTS

JP         2007-116190 A     5/2007
JP         6067907 B2        1/2017
(Continued)

*Primary Examiner* — Sophia T Nguyen
(74) *Attorney, Agent, or Firm* — Muir Patent Law, PLLC

(57) ABSTRACT

Disclosed is a three-dimensional semiconductor device including a horizontal semiconductor layer including a plurality of well regions having a first conductivity and a separation impurity region having a second conductivity, and a plurality of cell array structures provided on the well regions of the horizontal semiconductor layer, respectively. The separation impurity region is between and in contact with the well regions. Each of the cell array structures comprises a stack structure including a plurality of stacked electrodes in a vertical direction to a top surface of the horizontal semiconductor layer, and a plurality of vertical structures penetrating the stack structure and connected to a corresponding well region.

19 Claims, 37 Drawing Sheets

(51) Int. Cl.
*H10B 41/10* (2023.01)
*H10B 41/27* (2023.01)
*H10B 41/35* (2023.01)
*H10B 41/41* (2023.01)
*H10B 41/50* (2023.01)
*H10B 43/10* (2023.01)
*H10B 43/27* (2023.01)
*H10B 43/35* (2023.01)
*H10B 43/40* (2023.01)
*H10B 43/50* (2023.01)
*H10B 63/00* (2023.01)

(52) U.S. Cl.
CPC .......... *H10B 41/27* (2023.02); *H10B 41/35* (2023.02); *H10B 41/41* (2023.02); *H10B 41/50* (2023.02); *H10B 43/10* (2023.02); *H10B 43/27* (2023.02); *H10B 43/35* (2023.02); *H10B 43/40* (2023.02); *H10B 43/50* (2023.02); *H10B 63/34* (2023.02); *H10B 63/84* (2023.02)

(58) Field of Classification Search
CPC ........ H10B 41/20; H10B 41/23; H10B 41/27; H10B 41/30; H10B 41/35; H10B 41/50; H10B 41/40; H10B 41/41; H10B 41/10
See application file for complete search history.

(56) References Cited

U.S. PATENT DOCUMENTS

| | | | | |
|---|---|---|---|---|
| RE34,025 E | * | 8/1992 | Takagi | H01L 27/0623 257/560 |
| 5,416,347 A | * | 5/1995 | Katto | H01L 23/522 257/296 |
| 6,066,886 A | * | 5/2000 | Egawa | H10D 89/10 257/E27.097 |
| 6,337,506 B2 | | 1/2002 | Morishita et al. | |
| 6,870,201 B1 | * | 3/2005 | Deboy | H01L 29/7811 257/E29.198 |
| 7,084,437 B2 | | 8/2006 | Kitamura et al. | |
| 7,212,434 B2 | | 5/2007 | Umezawa | |
| 7,304,356 B2 | * | 12/2007 | Takahashi | H01L 29/7395 257/E29.198 |
| 7,518,921 B2 | | 4/2009 | Maejima et al. | |
| 7,528,046 B2 | | 5/2009 | Ichige et al. | |
| 7,737,526 B2 | | 6/2010 | Williams et al. | |
| 7,846,805 B2 | * | 12/2010 | Zhang | H10D 84/673 438/312 |
| 7,852,675 B2 | | 12/2010 | Maejima | |
| 7,855,407 B2 | * | 12/2010 | Shim | H01L 27/14689 438/220 |
| 7,915,667 B2 | * | 3/2011 | Knoefler | H01L 29/40117 438/257 |
| 8,310,034 B2 | * | 11/2012 | Uchida | H01L 23/564 257/659 |
| 8,395,206 B2 | * | 3/2013 | Lee | H10B 41/27 257/324 |
| 8,432,744 B2 | | 4/2013 | Umezawa et al. | |
| 8,546,887 B2 | * | 10/2013 | Baek | H01L 27/0207 257/E27.06 |
| 8,569,182 B2 | * | 10/2013 | Park | H01L 21/31144 438/257 |
| 8,581,323 B2 | * | 11/2013 | Uenaka | H10B 43/20 257/316 |
| 8,643,080 B2 | * | 2/2014 | Lee | H10B 43/20 438/102 |
| 8,759,942 B2 | | 6/2014 | Hoelke et al. | |
| 8,872,183 B2 | | 10/2014 | Chang et al. | |
| 8,912,592 B2 | | 12/2014 | Lim et al. | |
| 8,956,968 B2 | | 2/2015 | Higashitani et al. | |
| 9,019,739 B2 | | 4/2015 | Park et al. | |
| 9,035,371 B2 | | 5/2015 | Nakajima | |
| 9,053,977 B2 | | 6/2015 | Choi et al. | |
| 9,099,347 B2 | * | 8/2015 | Yun | H10B 43/27 |
| 9,111,799 B2 | * | 8/2015 | Hwang | H10B 43/20 |
| 9,165,938 B1 | | 10/2015 | Kim et al. | |
| 9,224,488 B2 | | 12/2015 | Shikata et al. | |
| 9,224,747 B2 | * | 12/2015 | Mizutani | H10B 43/35 |
| 9,230,987 B2 | | 1/2016 | Pachamuthu | |
| 9,263,461 B2 | * | 2/2016 | Tanzawa | H10B 41/35 |
| 9,331,095 B2 | * | 5/2016 | Shim | H10B 43/27 |
| 9,337,040 B1 | | 5/2016 | Renau et al. | |
| 9,406,543 B2 | * | 8/2016 | Lee | H01L 29/0619 |
| 9,412,732 B2 | * | 8/2016 | Yamaji | H01L 21/761 |
| 9,412,749 B1 | | 8/2016 | Shimabukuro et al. | |
| 9,419,009 B1 | * | 8/2016 | Oh | H10B 41/27 |
| 9,425,209 B1 | | 8/2016 | Yang et al. | |
| 9,437,483 B2 | | 9/2016 | Lee et al. | |
| 9,472,568 B2 | | 10/2016 | Shin et al. | |
| 9,478,561 B2 | | 10/2016 | Kim et al. | |
| 9,484,354 B2 | | 11/2016 | Lee et al. | |
| 9,502,429 B2 | * | 11/2016 | Hironaga | H01L 21/76838 |
| 9,515,087 B2 | * | 12/2016 | Son | H10B 41/27 |
| 9,524,755 B1 | | 12/2016 | Naito et al. | |
| 9,530,789 B2 | * | 12/2016 | Lee | H10B 43/35 |
| 9,536,897 B2 | | 1/2017 | Yoo et al. | |
| 9,543,307 B2 | | 1/2017 | Kim et al. | |
| 9,559,116 B2 | * | 1/2017 | Kim | H10B 43/27 |
| 9,576,612 B2 | | 2/2017 | Park et al. | |
| 9,576,966 B1 | | 2/2017 | Peri et al. | |
| 9,583,500 B2 | | 2/2017 | Pachamuthu et al. | |
| 9,601,204 B2 | | 3/2017 | Park et al. | |
| 9,601,370 B2 | * | 3/2017 | Kato | H01L 21/76816 |
| 9,601,577 B1 | | 3/2017 | Lee et al. | |
| 9,634,023 B2 | | 4/2017 | Lee | |
| 9,646,981 B2 | | 5/2017 | Nishikawa et al. | |
| 9,666,281 B2 | | 5/2017 | Sakakibara | |
| 9,666,289 B2 | * | 5/2017 | Lee | H10B 43/40 |
| 9,666,525 B2 | | 5/2017 | Kim et al. | |
| 9,673,214 B2 | * | 6/2017 | Hatano | H01L 23/585 |
| 9,691,782 B1 | * | 6/2017 | Hwang | H10D 89/811 |
| 9,691,786 B1 | * | 6/2017 | Tsuji | H10B 43/10 |
| 9,698,066 B2 | | 7/2017 | Lee et al. | |
| 9,698,151 B2 | | 7/2017 | Lee et al. | |
| 9,698,154 B2 | | 7/2017 | Lim et al. | |
| 9,728,549 B2 | * | 8/2017 | Yun | H10B 43/50 |
| 9,741,733 B2 | | 8/2017 | Lim et al. | |
| 9,754,966 B1 | * | 9/2017 | Yuan | H01L 23/528 |
| 9,780,104 B2 | | 10/2017 | Nomachi et al. | |
| 9,780,113 B2 | * | 10/2017 | Im | H10B 43/50 |
| 9,824,966 B1 | | 11/2017 | Kanakamedala et al. | |
| 9,831,260 B2 | | 11/2017 | Zhang et al. | |
| 9,847,341 B2 | * | 12/2017 | Shin | H10B 43/50 |
| 9,853,051 B1 | * | 12/2017 | Lee | H10B 43/50 |
| 9,953,992 B1 | * | 4/2018 | Ogawa | H10B 43/27 |
| 9,960,181 B1 | * | 5/2018 | Cui | H10B 43/50 |
| 9,997,530 B2 | * | 6/2018 | Yon | H10B 41/27 |
| 10,026,749 B2 | | 7/2018 | Park et al. | |
| 10,032,787 B2 | * | 7/2018 | Shin | H10B 41/27 |
| 10,032,789 B2 | * | 7/2018 | Lee | H01L 29/167 |
| 10,056,404 B2 | | 8/2018 | Lee et al. | |
| 10,074,661 B2 | | 9/2018 | Sakakibara et al. | |
| 10,115,667 B2 | * | 10/2018 | Yun | H10B 43/40 |
| 10,199,326 B1 | * | 2/2019 | Ohsaki | H10B 43/20 |
| 10,217,757 B2 | * | 2/2019 | Shimojo | H10B 43/10 |
| 10,249,640 B2 | * | 4/2019 | Yu | H01L 23/5283 |
| 10,332,900 B2 | | 6/2019 | Yun et al. | |
| 10,340,222 B2 | | 7/2019 | Hu et al. | |
| 10,367,003 B2 | * | 7/2019 | Kang | H01L 21/76816 |
| 10,373,673 B2 | | 8/2019 | Shin et al. | |
| 10,373,970 B2 | | 8/2019 | Lee | |
| 10,381,370 B2 | * | 8/2019 | Shin | H10B 41/27 |
| 10,446,575 B2 | * | 10/2019 | Kim | H10B 43/27 |
| 10,483,280 B1 | | 11/2019 | Xiao et al. | |
| 10,515,819 B2 | * | 12/2019 | Park | H10B 43/50 |
| 10,522,228 B2 | * | 12/2019 | Tanaka | G11C 16/0466 |
| 10,553,604 B2 | * | 2/2020 | Lu | H01L 23/535 |
| 10,566,336 B1 | | 2/2020 | Guo et al. | |
| 10,658,375 B2 | * | 5/2020 | Yon | H10B 43/20 |
| 10,685,953 B2 | * | 6/2020 | Kim | H10N 59/00 |
| 10,763,277 B2 | | 9/2020 | Oike et al. | |

(56) References Cited

U.S. PATENT DOCUMENTS

| | | | |
|---|---|---|---|
| 10,847,534 B2 | 11/2020 | Chu | |
| 10,910,395 B2* | 2/2021 | Lee | H10B 41/27 |
| 10,930,666 B2* | 2/2021 | Lee | H01L 21/76879 |
| 11,031,413 B2* | 6/2021 | Xiao | H10B 43/10 |
| 11,069,709 B2* | 7/2021 | Kanamori | G11C 5/06 |
| 11,289,504 B2* | 3/2022 | Yang | H01L 29/66545 |
| 11,404,434 B2* | 8/2022 | Sim | H10B 41/27 |
| 11,637,019 B2* | 4/2023 | Hwang | H10B 43/27 257/314 |
| 11,729,985 B2* | 8/2023 | Shimizu | H10B 43/27 |
| 11,930,639 B2* | 3/2024 | Yang | H10D 64/017 |
| 2004/0084777 A1* | 5/2004 | Yamanoue | H01L 24/05 257/E21.244 |
| 2005/0073007 A1 | 4/2005 | Chen et al. | |
| 2005/0281117 A1* | 12/2005 | Takizawa | H10B 41/40 365/230.01 |
| 2006/0038271 A1* | 2/2006 | Hsu | H01L 29/10 257/E29.043 |
| 2006/0226499 A1 | 10/2006 | Shimizu | |
| 2007/0196986 A1 | 8/2007 | Ichige et al. | |
| 2008/0093697 A1 | 4/2008 | Kaneda et al. | |
| 2008/0157150 A1* | 7/2008 | Shim | H01L 27/14641 257/292 |
| 2009/0175081 A1 | 7/2009 | Kim | |
| 2009/0267128 A1* | 10/2009 | Maejima | H10B 43/20 257/314 |
| 2009/0268522 A1* | 10/2009 | Maejima | H10B 41/27 365/185.11 |
| 2009/0302440 A1* | 12/2009 | Secareanu | H01L 21/765 257/547 |
| 2009/0310415 A1* | 12/2009 | Jin | H10D 64/037 438/689 |
| 2010/0090286 A1 | 4/2010 | Lee et al. | |
| 2010/0213527 A1 | 8/2010 | Shim et al. | |
| 2010/0223585 A1* | 9/2010 | Chern | H01L 29/0692 716/52 |
| 2010/0314727 A1* | 12/2010 | Uchida | H01L 24/05 257/659 |
| 2011/0115010 A1* | 5/2011 | Shim | H01L 21/02365 257/E27.098 |
| 2011/0121403 A1* | 5/2011 | Lee | H10B 41/27 257/E27.06 |
| 2011/0169071 A1* | 7/2011 | Uenaka | H10B 43/20 257/326 |
| 2011/0199346 A1* | 8/2011 | Ko | H01L 21/761 345/204 |
| 2011/0204420 A1* | 8/2011 | Kim | H10B 43/10 257/211 |
| 2011/0248317 A1 | 10/2011 | Kim et al. | |
| 2011/0298038 A1 | 12/2011 | Son et al. | |
| 2011/0310670 A1* | 12/2011 | Shim | G11C 16/0408 365/185.05 |
| 2012/0064682 A1 | 3/2012 | Jang et al. | |
| 2012/0146055 A1* | 6/2012 | Mitani | H01L 29/0692 257/77 |
| 2012/0208347 A1* | 8/2012 | Hwang | H01L 21/762 257/E21.546 |
| 2012/0238093 A1 | 9/2012 | Park et al. | |
| 2012/0280299 A1* | 11/2012 | Yun | H10B 43/40 257/314 |
| 2012/0292712 A1* | 11/2012 | Baek | H01L 27/088 257/E27.06 |
| 2013/0094294 A1 | 4/2013 | Kwak et al. | |
| 2013/0100738 A1 | 4/2013 | Choi | |
| 2013/0126957 A1* | 5/2013 | Higashitani | H10B 43/40 257/E27.06 |
| 2013/0130468 A1* | 5/2013 | Higashitani | H10B 43/35 257/E21.004 |
| 2013/0161821 A1 | 6/2013 | Hwang et al. | |
| 2013/0320498 A1* | 12/2013 | Salcedo | H10D 89/711 257/E29.174 |
| 2014/0015128 A1* | 1/2014 | Chae | H01L 23/49844 257/737 |
| 2014/0070295 A1* | 3/2014 | Fukuda | H10B 43/40 257/306 |
| 2014/0183756 A1 | 7/2014 | Hwang et al. | |
| 2014/0241065 A1 | 8/2014 | Shim et al. | |
| 2014/0264548 A1 | 9/2014 | Lee et al. | |
| 2015/0008506 A1 | 1/2015 | Yang et al. | |
| 2015/0061068 A1 | 3/2015 | Akutsu et al. | |
| 2015/0129878 A1* | 5/2015 | Shin | H10B 41/20 257/329 |
| 2015/0145015 A1* | 5/2015 | Shin | H10B 43/40 257/314 |
| 2015/0162343 A1* | 6/2015 | Park | H10B 41/41 257/329 |
| 2015/0162423 A1* | 6/2015 | Lee | H01L 29/7397 438/135 |
| 2015/0179662 A1 | 6/2015 | Makala et al. | |
| 2015/0236038 A1 | 8/2015 | Pachamuthu et al. | |
| 2015/0279852 A1 | 10/2015 | Mizutani et al. | |
| 2015/0294977 A1* | 10/2015 | Kim | H10B 43/40 257/314 |
| 2015/0303209 A1* | 10/2015 | Park | H10B 43/40 257/316 |
| 2015/0303214 A1* | 10/2015 | Kim | H01L 29/7827 257/329 |
| 2015/0318301 A1 | 11/2015 | Lee et al. | |
| 2015/0325301 A1 | 11/2015 | Nam | |
| 2015/0348987 A1* | 12/2015 | Lee | H10B 43/10 257/326 |
| 2015/0372005 A1 | 12/2015 | Yon et al. | |
| 2016/0027795 A1 | 1/2016 | Jung et al. | |
| 2016/0027796 A1 | 1/2016 | Yang et al. | |
| 2016/0049422 A1 | 2/2016 | Kim et al. | |
| 2016/0049423 A1* | 2/2016 | Yoo | H10B 43/40 257/329 |
| 2016/0056171 A1 | 2/2016 | Manorotkul et al. | |
| 2016/0056172 A1 | 2/2016 | Shim et al. | |
| 2016/0071861 A1 | 3/2016 | Serov et al. | |
| 2016/0071877 A1* | 3/2016 | Kim | H10B 43/27 257/314 |
| 2016/0118399 A1 | 4/2016 | Son et al. | |
| 2016/0133630 A1 | 5/2016 | Kim et al. | |
| 2016/0148835 A1* | 5/2016 | Shimabukuro | H01L 21/76816 257/314 |
| 2016/0155751 A1 | 6/2016 | Shin et al. | |
| 2016/0163386 A1* | 6/2016 | Hwang | G11C 16/0466 365/185.12 |
| 2016/0163635 A1* | 6/2016 | Yun | H01L 23/3192 257/659 |
| 2016/0163686 A1* | 6/2016 | Lee | H10B 41/27 257/314 |
| 2016/0163726 A1* | 6/2016 | Tanzawa | H10B 41/35 257/314 |
| 2016/0163730 A1* | 6/2016 | Lim | H10B 43/50 257/314 |
| 2016/0163732 A1* | 6/2016 | Lim | H10B 43/27 257/314 |
| 2016/0204117 A1* | 7/2016 | Liu | H10D 30/0411 257/324 |
| 2016/0225714 A1* | 8/2016 | Yun | H10B 43/27 |
| 2016/0225785 A1* | 8/2016 | Kim | H01L 29/42348 |
| 2016/0233229 A1* | 8/2016 | Oh | H10B 43/50 |
| 2016/0268220 A1 | 9/2016 | Tsai et al. | |
| 2016/0268290 A1* | 9/2016 | Matsunaga | H10B 43/50 |
| 2016/0276362 A1* | 9/2016 | Noda | H10B 43/10 |
| 2016/0284713 A1 | 9/2016 | Kihara | |
| 2016/0293625 A1 | 10/2016 | Kang et al. | |
| 2016/0307632 A1* | 10/2016 | Lee | H01L 23/53271 |
| 2016/0307910 A1* | 10/2016 | Son | H10B 43/40 |
| 2016/0315095 A1 | 10/2016 | Sel et al. | |
| 2016/0315096 A1 | 10/2016 | Imamura | |
| 2016/0329340 A1 | 10/2016 | Hwang et al. | |
| 2016/0343450 A1* | 11/2016 | Lee | G11C 16/10 |
| 2016/0343718 A1 | 11/2016 | Lu et al. | |
| 2016/0365351 A1 | 12/2016 | Nishikawa et al. | |
| 2016/0372322 A1 | 12/2016 | Oh et al. | |
| 2017/0011996 A1 | 1/2017 | Lee et al. | |
| 2017/0033117 A1 | 2/2017 | Lee | |

(56) References Cited

U.S. PATENT DOCUMENTS

| | | | |
|---|---|---|---|
| 2017/0040337 A1* | 2/2017 | Kim | H10B 41/35 |
| 2017/0047343 A1 | 2/2017 | Lee et al. | |
| 2017/0062453 A1* | 3/2017 | Son | H01L 25/18 |
| 2017/0077119 A1* | 3/2017 | Sawabe | H10B 43/35 |
| 2017/0084601 A1* | 3/2017 | Yao | H01L 29/866 |
| 2017/0084624 A1* | 3/2017 | Lee | H10B 41/35 |
| 2017/0084626 A1* | 3/2017 | Kim | H01L 21/76831 |
| 2017/0084696 A1 | 3/2017 | Lee et al. | |
| 2017/0098658 A1* | 4/2017 | Matsuda | H10B 41/10 |
| 2017/0103993 A1 | 4/2017 | Lee et al. | |
| 2017/0103995 A1* | 4/2017 | Hatano | H10B 41/40 |
| 2017/0125430 A1 | 5/2017 | Nishikawa et al. | |
| 2017/0148677 A1 | 5/2017 | Shin | |
| 2017/0148748 A1* | 5/2017 | Jeong | H01L 23/562 |
| 2017/0186648 A1* | 6/2017 | Lian | H10D 84/038 |
| 2017/0200736 A1* | 7/2017 | Park | H01L 27/0207 |
| 2017/0207234 A1* | 7/2017 | Park | H10B 43/27 |
| 2017/0221813 A1 | 8/2017 | Kim | |
| 2017/0236746 A1* | 8/2017 | Yu | G11C 16/24 |
| | | | 257/314 |
| 2017/0243879 A1 | 8/2017 | Yu et al. | |
| 2017/0263556 A1 | 9/2017 | Tessariol et al. | |
| 2017/0287930 A1* | 10/2017 | Lee | H10B 43/27 |
| 2017/0294383 A1 | 10/2017 | Tanzawa | |
| 2017/0317088 A1* | 11/2017 | Lee | H10B 41/50 |
| 2017/0317096 A1 | 11/2017 | Shin et al. | |
| 2018/0076211 A1 | 3/2018 | Inatsuka et al. | |
| 2018/0114794 A1* | 4/2018 | Jang | H10D 64/037 |
| 2018/0166454 A1* | 6/2018 | Pyon | H10B 41/20 |
| 2018/0182747 A1* | 6/2018 | Kim | H10B 61/00 |
| 2018/0226471 A1 | 8/2018 | Hille et al. | |
| 2018/0233185 A1* | 8/2018 | Futatsuyama | H10B 43/50 |
| 2018/0233513 A1 | 8/2018 | Zhang et al. | |
| 2018/0247940 A1* | 8/2018 | Kim | H10B 43/10 |
| 2018/0254284 A1* | 9/2018 | Hwang | H10B 41/50 |
| 2018/0261626 A1* | 9/2018 | Yon | H10B 43/27 |
| 2018/0268892 A1* | 9/2018 | Kim | G11C 8/08 |
| 2018/0268902 A1* | 9/2018 | Tanaka | H10B 43/35 |
| 2018/0277499 A1* | 9/2018 | Oshiki | H10B 43/10 |
| 2018/0350831 A1 | 12/2018 | Kim et al. | |
| 2018/0358371 A1 | 12/2018 | Hwang et al. | |
| 2018/0366487 A1 | 12/2018 | Okizumi et al. | |
| 2018/0374869 A1 | 12/2018 | Kim et al. | |
| 2019/0013206 A1* | 1/2019 | Park | H01L 21/28141 |
| 2019/0027492 A1* | 1/2019 | Lee | H10B 43/10 |
| 2019/0027555 A1* | 1/2019 | Maeta | H01L 29/66712 |
| 2019/0035725 A1* | 1/2019 | Yun | H10B 43/40 |
| 2019/0043872 A1 | 2/2019 | Oh et al. | |
| 2019/0057898 A1* | 2/2019 | Shim | H10B 43/50 |
| 2019/0067314 A1 | 2/2019 | Lu et al. | |
| 2019/0067320 A1 | 2/2019 | Cho et al. | |
| 2019/0172838 A1 | 6/2019 | Jo et al. | |
| 2019/0198513 A1* | 6/2019 | Park | G11C 16/08 |
| 2019/0304991 A1 | 10/2019 | Seo et al. | |
| 2019/0319038 A1 | 10/2019 | Zhang | |
| 2019/0326319 A1 | 10/2019 | Yun et al. | |
| 2019/0371728 A1 | 12/2019 | Gossman et al. | |
| 2020/0020714 A1* | 1/2020 | Oh | H10B 43/50 |
| 2020/0058635 A1* | 2/2020 | Qiu | H01L 27/088 |
| 2020/0058670 A1 | 2/2020 | Oh | |
| 2020/0066742 A1 | 2/2020 | Kim et al. | |
| 2020/0098799 A1 | 3/2020 | Tsai et al. | |
| 2020/0168547 A1 | 5/2020 | Lim et al. | |
| 2020/0185408 A1* | 6/2020 | Song | H01L 29/1037 |
| 2020/0350330 A1* | 11/2020 | Ahn | H10B 43/27 |
| 2021/0028186 A1* | 1/2021 | Lim | H10B 41/27 |
| 2021/0036010 A1* | 2/2021 | Sim | H10B 43/10 |
| 2021/0125928 A1* | 4/2021 | Kim | H01L 21/76877 |
| 2021/0210498 A1* | 7/2021 | Leobandung | G11C 16/24 |
| 2022/0028731 A1* | 1/2022 | Shim | H10B 41/35 |
| 2022/0139952 A1* | 5/2022 | Kim | H10B 41/27 |
| | | | 257/314 |
| 2022/0285262 A1* | 9/2022 | Yun | H01L 27/0688 |
| 2022/0344267 A1* | 10/2022 | Kim | H01L 21/76831 |
| 2022/0392956 A1* | 12/2022 | Bateman | H10N 70/8836 |
| 2023/0180480 A1* | 6/2023 | Chung | H01L 25/0657 |
| | | | 257/324 |
| 2023/0397417 A1* | 12/2023 | Tagami | H10B 43/35 |

FOREIGN PATENT DOCUMENTS

| | | |
|---|---|---|
| KR | 10-0641667 B1 | 11/2006 |
| KR | 20150053628 A | 5/2015 |
| KR | 20150129940 A | 11/2015 |
| KR | 20160124294 A | 10/2016 |
| KR | 20170018245 A | 2/2017 |
| KR | 20170019541 A | 2/2017 |
| KR | 20170083187 A | 7/2017 |

\* cited by examiner

THREE-DIMENSIONAL SEMICONDUCTOR DEVICE

CROSS-REFERENCE TO RELATED APPLICATIONS

This U.S. nonprovisional patent application is a continuation of U.S. patent application Ser. No. 15/954,912, filed Apr. 17, 2018, in the U.S. Patent and Trademark Office, which claims priority under 35 U.S.C. § 119 of Korean Patent Application No. 10-2017-0105666, filed on Aug. 21, 2017, in the Korean Intellectual Property Office, the entire contents of both of which are hereby incorporated by reference.

BACKGROUND

The present disclosure relates to a three-dimensional semiconductor device and a method of fabricating the same, and more particularly, to a highly-integrated three-dimensional semiconductor device and a method of fabricating the same.

Semiconductor devices have been highly integrated for satisfying high performance and low manufacture costs which are required by consumers. Since integration of the semiconductor devices is an important factor in determining product price, high integration is increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may impose practical limitations on increasing the integration of the two-dimensional or planar semiconductor devices. Therefore, there have been proposed three-dimensional semiconductor memory devices having three-dimensionally arranged memory cells.

SUMMARY

Some exemplary embodiments of the present concepts provide a highly-integrated three-dimensional semiconductor device and a method of fabricating the same.

According to exemplary embodiments, a three-dimensional semiconductor memory device may include a horizontal semiconductor layer including a plurality of well regions having a first conductivity and a separation impurity region having a second conductivity, the separation impurity region being between and in contact with the plurality of well regions; and a plurality of cell array structures provided on the plurality of well regions of the horizontal semiconductor layer, respectively. Each of the cell array structures may comprise: a stack structure including a plurality of stacked electrodes stacked in a vertical direction on a top surface of the horizontal semiconductor layer; and a plurality of vertical structures penetrating the stack structure and connected to a corresponding well region.

According to exemplary embodiments of the present inventive concepts, a three-dimensional semiconductor memory device may include a peripheral logic structure including a peripheral logic circuit integrated on a semiconductor substrate; a horizontal semiconductor layer on the peripheral logic structure and including a plurality of well regions and a separation impurity region between adjacent well regions, the plurality of well regions being doped with first conductivity impurities and the separation impurity region being doped with second conductivity impurities; and a plurality of cell array structures on corresponding well regions of the horizontal semiconductor layer, each of the cell array structures including a plurality of three-dimensionally arranged memory cells.

DETAILED DESCRIPTION OF EMBODIMENTS

It will be discussed hereinafter a three-dimensional semiconductor device and a method of fabricating the same according to exemplary embodiments in conjunction with the accompanying drawings.

Figure 1:
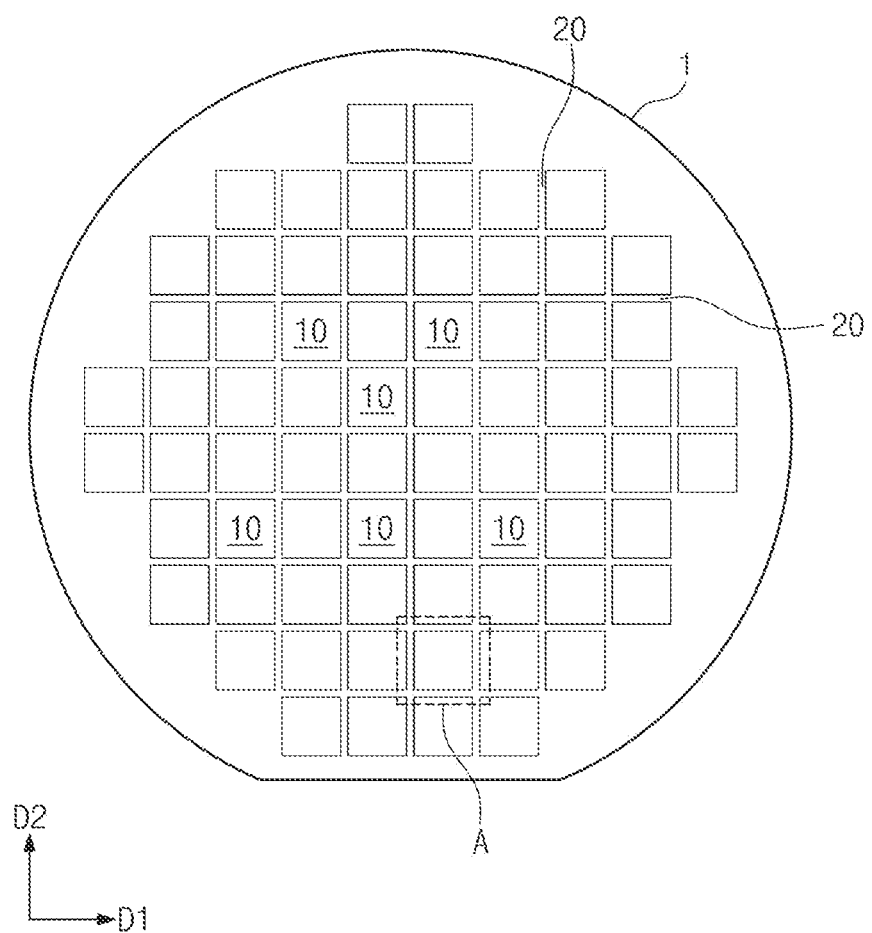
FIG. 1 illustrates a plan view showing a substrate with integrated three-dimensional semiconductor devices, according to exemplary embodiments.

FIG. 1 illustrates a plan view showing a substrate with integrated three-dimensional semiconductor devices, according to exemplary embodiments.

Referring to FIG. 1, a semiconductor substrate 1 (e.g., wafer) may include chip regions 10 on which semiconductor chips are formed and a scribe line region 20 between the chip regions 10. The chip regions 10 may be two-dimensionally arranged along first and second directions D1 and D2 crossing each other (e.g., perpendicular to each other). The scribe line region 20 may surround each of the chip regions 10, extending parallel to the perimeters of the chip regions 10. For example, the scribe line region 20 may lie between the chip regions 10 adjacent to each other in the first direction D1 and between the chip regions 10 adjacent to each other in the second direction D2. The scribe line region 20 may serve as the boundary between adjacent chip regions 10. For example, the scribe line region 20 may be the area in which a semiconductor substrate 1 is cut, thereby allowing the chip regions 10 to be physically separated from one another (e.g., to form separate semiconductor chips).

The semiconductor substrate 1 may be a bulk silicon substrate, a silicon-on-insulator (SOI) substrate, a germanium substrate, a germanium-on-insulator (GOI) substrate, a silicon-germanium substrate, or an epitaxial thin substrate obtained by performing a selective epitaxial growth (SEG) process. The semiconductor substrate 1 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof.

In some embodiments, each chip region 10 of the semiconductor substrate 1 may be provided thereon with a three-dimensional semiconductor memory device including three-dimensionally arranged memory cells.

Figure 2:
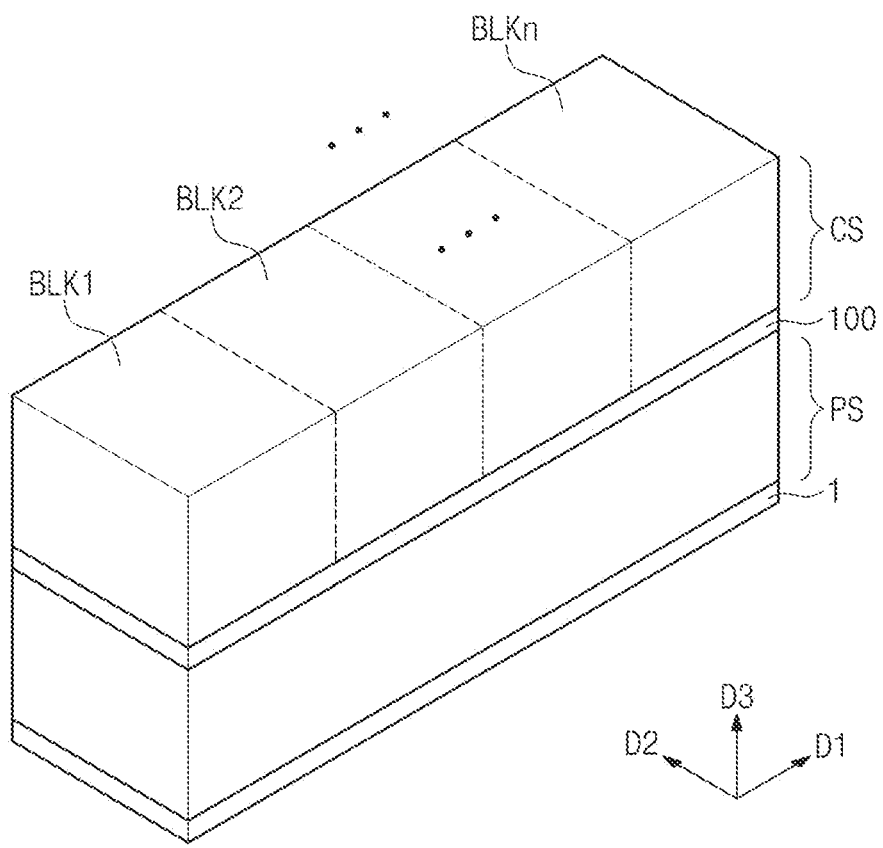
FIG. 2 illustrates a simplified perspective view showing a three-dimensional semiconductor device, according to exemplary embodiments.

FIG. 2 illustrates a simplified perspective view showing a three-dimensional semiconductor device, according to exemplary embodiments. In some embodiment, the three-dimensional semiconductor device of FIG. 2 may be provided on a chip region 10 of a semiconductor substrate 1, such as disclosed above in connection with FIG. 1.

Referring to FIG. 2, a three-dimensional semiconductor device may include a peripheral logic structure PS and a cell array structure CS, which is stacked on the peripheral logic structure PS. For example, when viewed in a plan view, the peripheral logic structure PS and the cell array structure CS may overlap each other.

Although not illustrated in FIG. 2, the peripheral logic structure PS may include a row decoder, a column decoder, a page buffer, and a control circuit that controls a cell array. The integrated peripheral logic circuits constituting the peripheral logic structure PS may be provided on the semiconductor substrate 1.

The cell array structure CS may include a cell array consisting of a plurality of three-dimensionally arranged memory cells. In some embodiments, the cell array may be integrated on a horizontal semiconductor layer 100.

The cell array structure CS may include one or more mats, each of which includes a plurality of memory blocks BLK0 to BLKn. For example, each memory block BLK may be a data erase unit (e.g., the smallest unit of memory that can be erased in a single erase operation). Each of the memory blocks BLK0 to BLKn may include three-dimensionally arranged memory cells. For example, each of the memory blocks BLK0 to BLKn may include stacked structures stacked along a third direction D3 on the horizontal semiconductor layer 100, and these stacked structures may be repeated along first and second directions D1 and D2, such that multiple stacked structures are located in each of the first and second directions D1 and D2.

Figure 3:
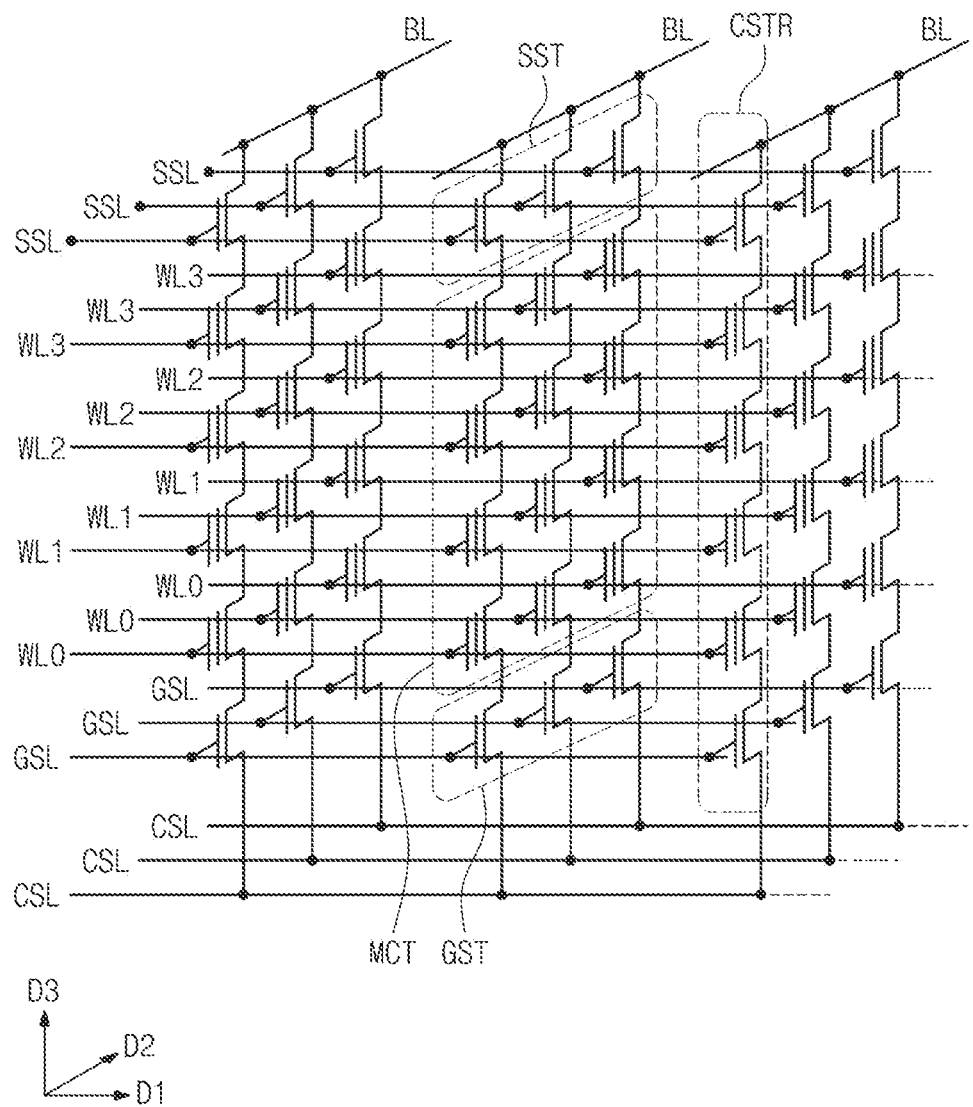
FIG. 3 illustrates a circuit diagram showing a cell array of a three-dimensional semiconductor device, according to exemplary embodiments.

FIG. 3 illustrates a circuit diagram showing a cell array of a three-dimensional semiconductor device according to exemplary embodiments.

Referring to FIG. 3, a three-dimensional semiconductor device according to exemplary embodiments may be a three-dimensional NAND Flash memory device. As shown in FIG. 3, a cell array of the three-dimensional NAND Flash memory device may include a common source line CSL, a plurality of bit lines BL, and a plurality of cell strings CSTR between the common source line CSL and the bit lines BL. The cell strings CSTR may extend along a third direction D3 perpendicular to first and second directions D1 and D2.

The bit lines BL may be arranged two-dimensionally (e.g., in the D1 and D2 directions), and a plurality of the cell strings CSTR may be connected in parallel with one another to each of the bit lines BL. The cell strings CSTR may be connected in common to the common source line CSL. For example, a plurality of the cell strings CSTR may be disposed between a plurality of the bit lines BL and one common source line CSL. The common source line CSL may be provided in plural, and the plurality of the common source lines CSL may be arranged two-dimensionally. The common source lines CSL may be supplied with the same voltage or electrically controlled independently of each other.

Each of the cell strings CSTR may include a ground select transistor GST coupled to the common source line CSL, a string select transistor SST coupled to the bit line BL, and a plurality of memory cell transistors MCT between the ground and string select transistors GST and SST. The ground select transistor GST, the string select transistor SST, and the memory cell transistors MCT may be connected in series. The common source line CSL may be connected in common to sources of the ground select transistors GST.

A ground select line GSL, a plurality of word lines WL0 to WL3, and a plurality of string select lines SSL between the common source line CSL and the bit lines BL may be used as gate electrodes of the ground select transistor GST, the memory cell transistors MCT, and the string select transistor SST, respectively. Each of the memory cell transistors MCT may include a data storage element.

Figure 4A:
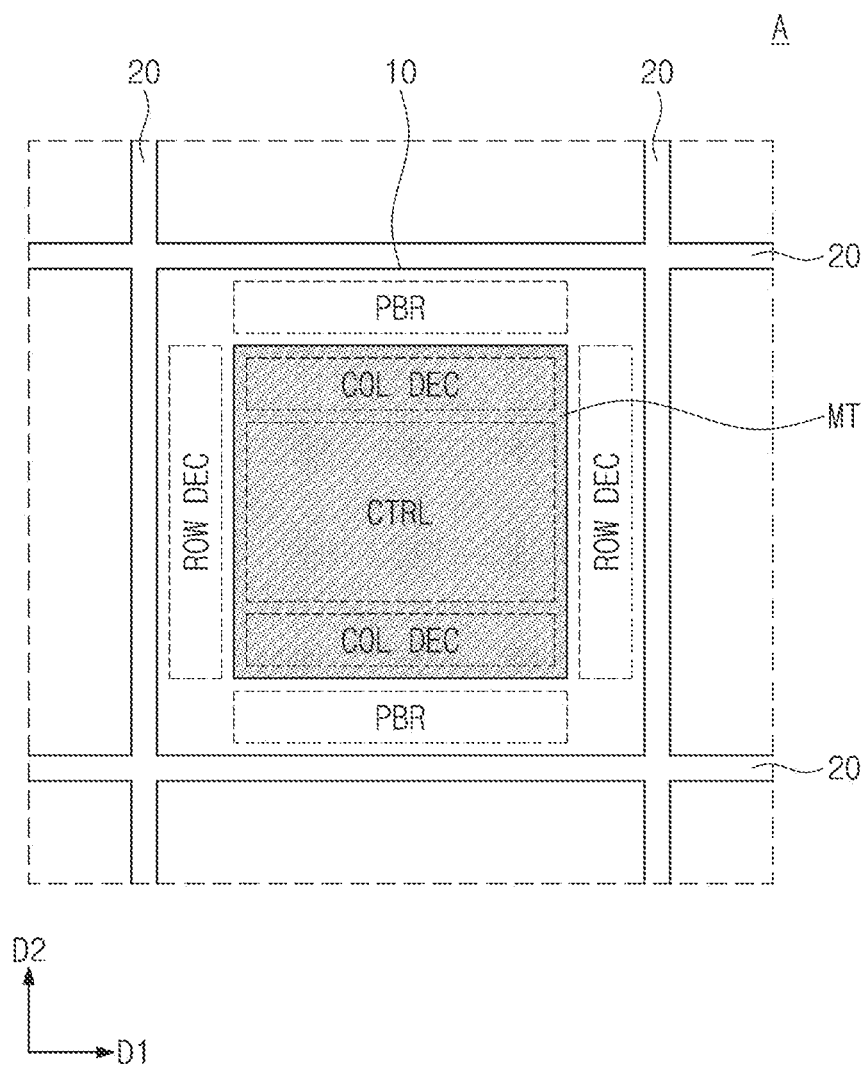
FIGS. 4A and 4B illustrate simplified enlarged plan views showing section A of the three-dimensional semiconductor device of FIG. 1, according to exemplary embodiments.
Figure 4B:
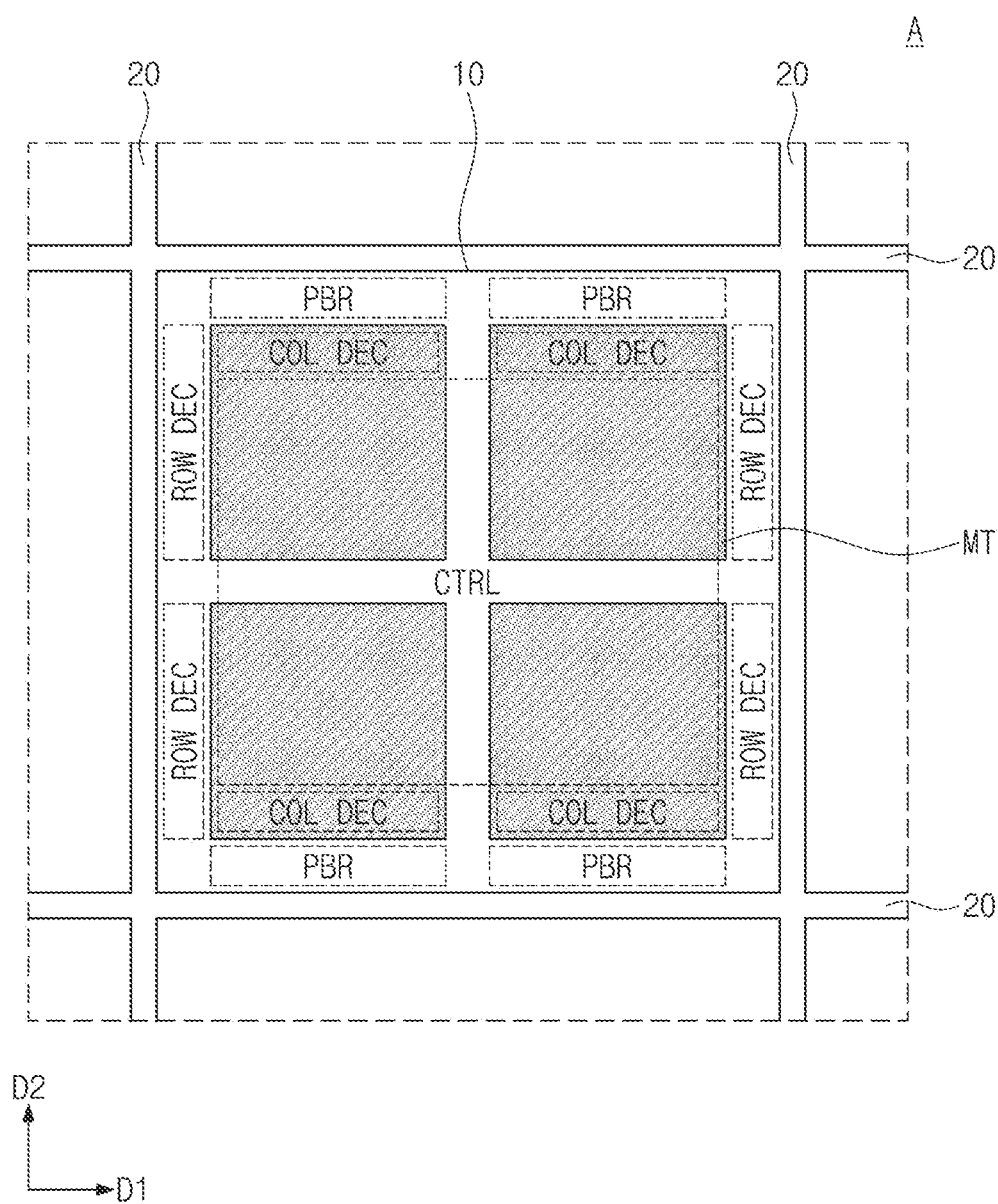

FIGS. 4A and 4B illustrate simplified enlarged plan views showing section A of a three-dimensional semiconductor device according to exemplary embodiments.

Referring to FIGS. 1, 4A, and 4B, each chip region 10 of the semiconductor substrate 1 may be provided thereon with a peripheral logic structure (see PS of FIG. 2) and a cell array structure (see CS of FIG. 2), as discussed with reference to FIG. 2.

Each chip region 10 of the semiconductor substrate 1 may be provided thereon with a peripheral logic structure (see PS of FIG. 2) constituted by row decoders ROW DEC, column decoders COL DEC, page buffers PBR, and control circuits CTRL.

Referring to FIG. 4A, each chip region 10 may be provided thereon with one mat MT or one block that constitutes the cell array structure (see CS of FIG. 2). In some embodiments, the mat MT may be provided on a single horizontal semiconductor layer (see 100 of FIG. 2). One mat MT may be disposed to partially overlap (e.g., in a vertical direction) the peripheral logic structure (see PS of FIG. 2). For example, the row decoders ROW DEC and the page buffers PBR may be located around the mat MT. The column decoders COL DEC and the control circuit CTRL may overlap the mat MT. In some embodiments, peripheral logic circuits constituting the peripheral logic structure (see PS of FIG. 2) may be freely or arbitrarily disposed beneath the mat MT.

Referring to FIG. 4B, each chip region 10 may be provided thereon with a plurality of mats MT or a plurality of blocks that constitute the cell array structure (see CS of FIG. 2). The plurality of mats MT may be arranged along first and second directions D1 and D2. In some embodiments, the plurality of mats MT may be provided on a single horizontal semiconductor layer (see 100 of FIG. 2).

Figure 5:
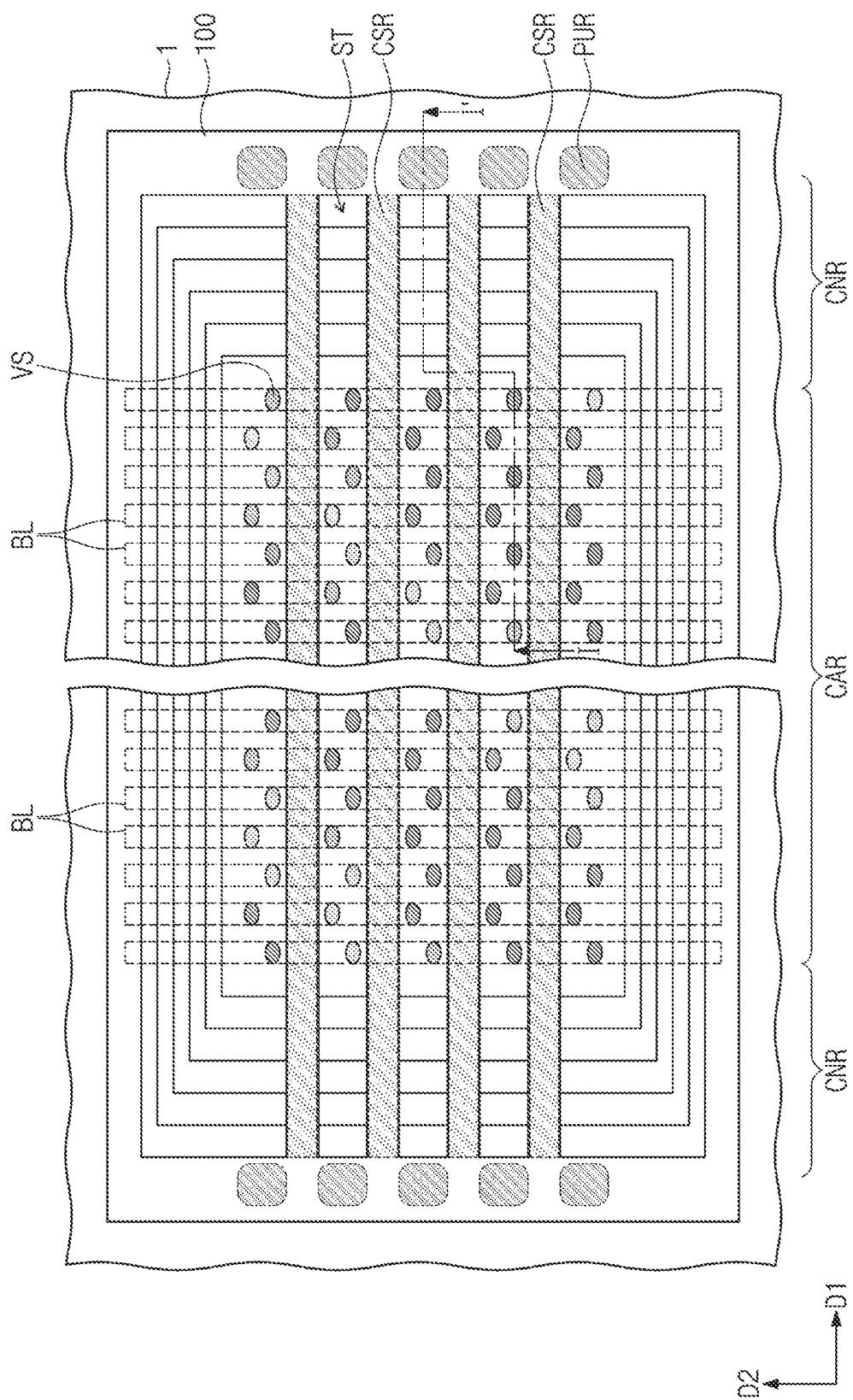
FIG. 5 illustrates a plan view showing a three-dimensional semiconductor device, according to exemplary embodiments.
Figure 6A:
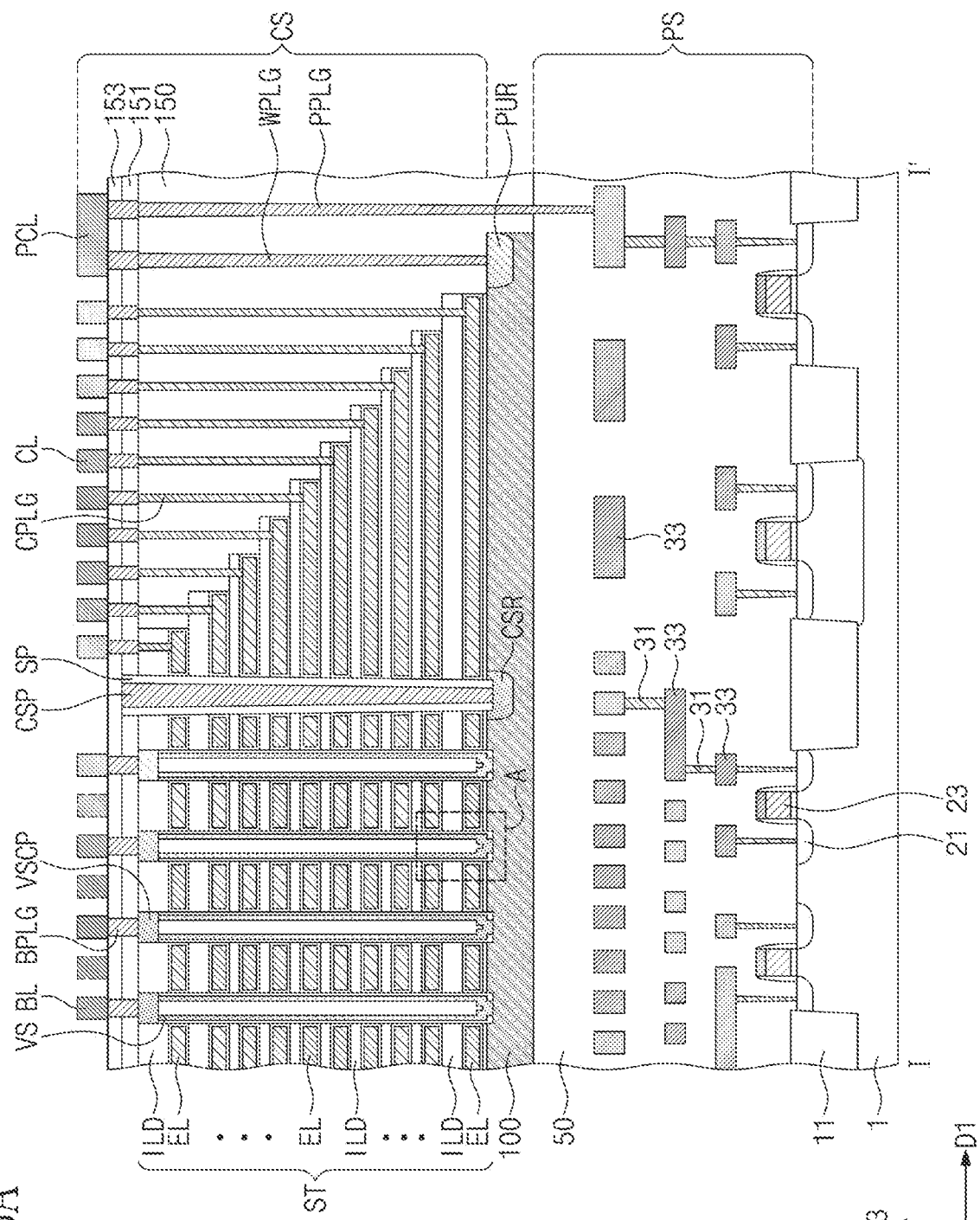
FIGS. 6A and 6B illustrate cross sectional views taken along line I-I' of FIG. 5, showing a three-dimensional semiconductor device, according to exemplary embodiments.
Figure 6B:
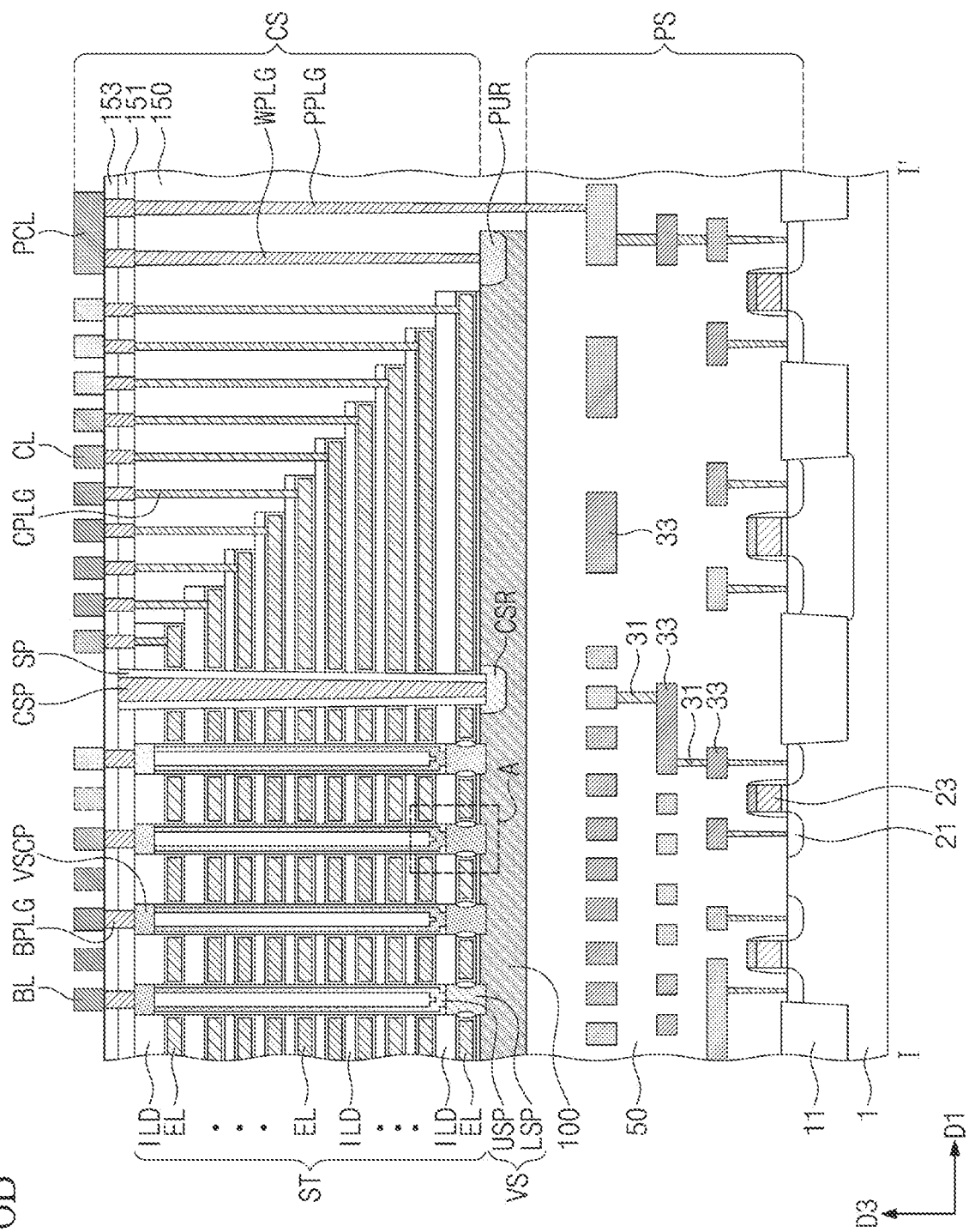
Figure 7A:
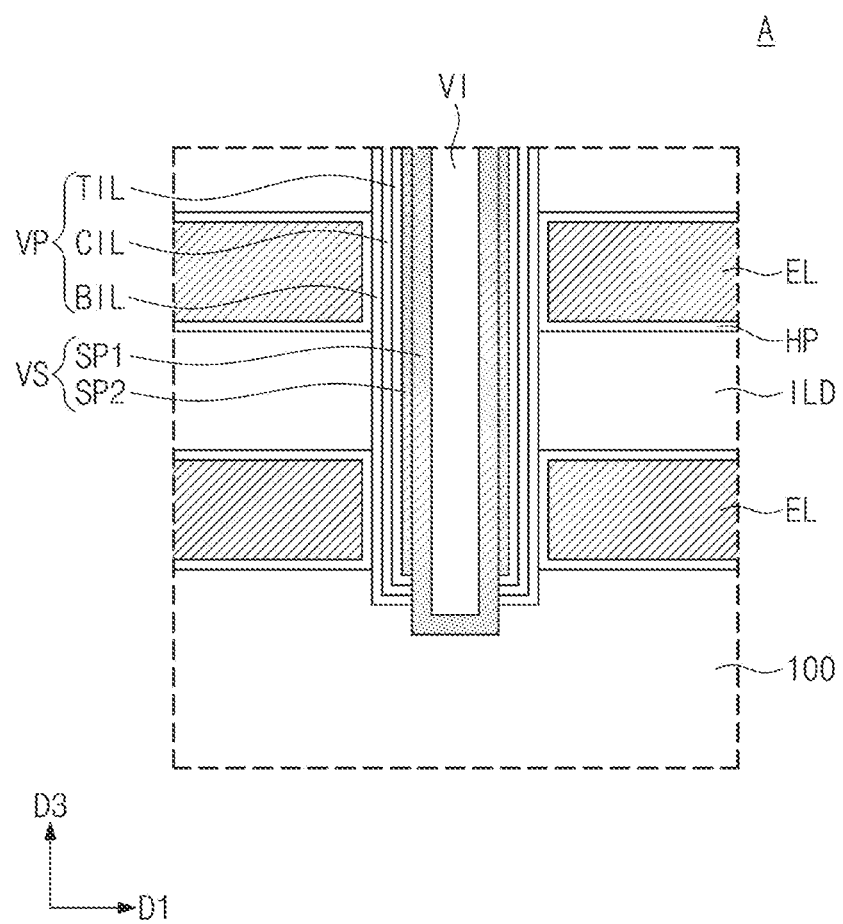
FIG. 7A illustrates an enlarged cross-sectional view showing section A of FIG. 6A.
Figure 7B:
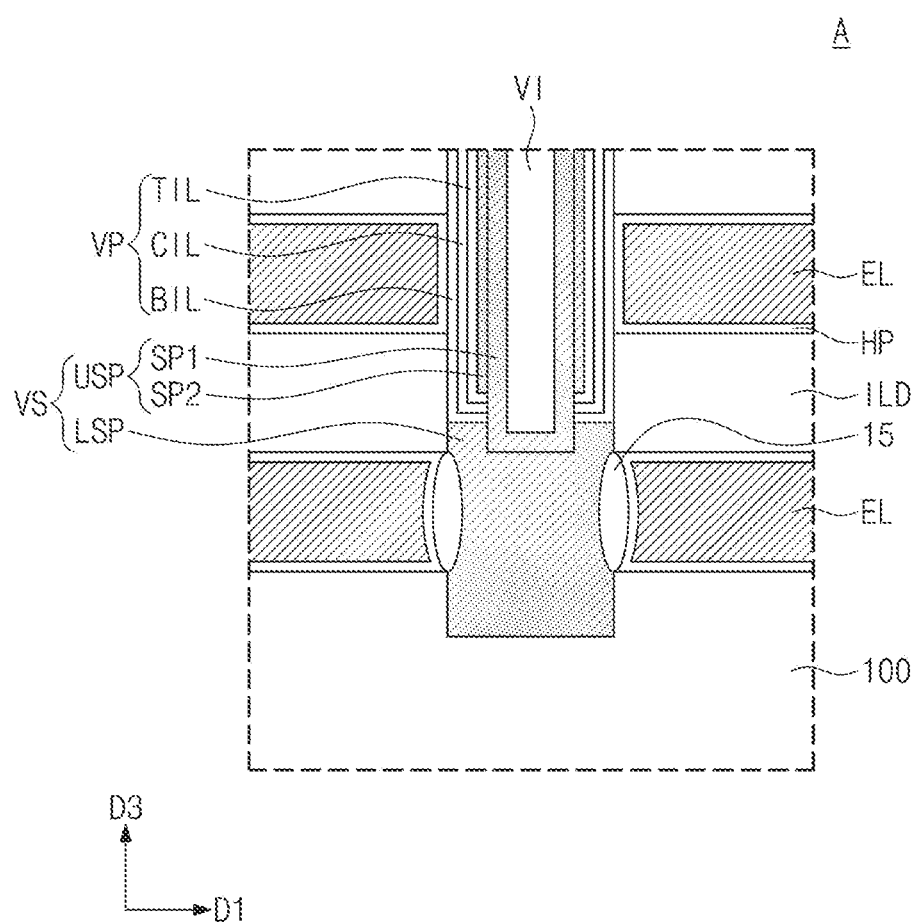
FIG. 7B illustrates an enlarged cross-sectional view showing section A of FIG. 6B.

FIG. 5 illustrates a plan view showing a three-dimensional semiconductor device according to exemplary embodiments. FIGS. 6A and 6B illustrate cross sectional views taken along line I-I' of FIG. 5, showing a three-dimensional semiconductor device according to exemplary embodiments. FIG. 7A illustrates an enlarged cross-sectional view showing section A of FIG. 6A. FIG. 7B illustrates an enlarged cross-sectional view showing section A of FIG. 6B.

Referring to FIGS. 5, 6A, and 6B, a semiconductor substrate 1 may be a silicon substrate, a silicon-germanium substrate, a germanium substrate, or a single-crystalline epitaxial layer grown on a single-crystalline silicon substrate. For example, the semiconductor substrate 1 may be a silicon substrate having a first conductivity (e.g., p-type conductivity), and may include well regions (not shown).

A peripheral logic structure PS may include peripheral logic circuits integrated on an entire surface of the semiconductor substrate 1 and a lower buried insulation layer 50 covering the peripheral logic circuits.

The peripheral logic circuits may be, as discussed above, row and column decoders, a page buffer, and a control circuit, and may include NMOS and PMOS transistors, low- and high-voltage transistors, and a resistor that are integrated on the semiconductor substrate 1.

In more detail, the semiconductor substrate 1 may be provided therein with a device isolation layer 11 defining active regions. The semiconductor substrate 1 of the active regions may be provided thereon with peripheral gate electrodes 23 and gate dielectric layers interposed between the peripheral gate electrodes 23 and the semiconductor substrate 1. Source/drain regions 21 may be provided in the semiconductor substrate 1 on opposite sides of each of the peripheral gate electrodes 23. Peripheral circuit lines 33 may be electrically connected through peripheral circuit contact plugs 31 to the peripheral logic circuits. For example, the peripheral circuit contact plugs 31 and the peripheral circuit lines 33 may be coupled to the NMOS and PMOS transistors.

The lower buried insulation layer 50 may cover the peripheral gate electrodes 23, the peripheral circuit contact plugs 31, and the peripheral circuit lines 33. The lower buried insulation layer 50 may include a plurality of stacked insulation layers. For example, the lower buried insulation layer 50 may include a silicon oxide layer, a silicon nitride layer, a silicon oxynitride layer, and/or a low-k dielectric layer.

A horizontal semiconductor layer 100 may be provided on an entire top surface of the lower buried insulation layer 50 covering the peripheral logic circuits. For example, the horizontal semiconductor layer 100 may be a single layer extending across first and second directions D1 and D2, where the first and second directions D1 and D2 are perpendicular to one another. The horizontal semiconductor layer 100 may have a bottom surface in contact with a top surface of the lower buried insulation layer 50. Components described herein as "contacting" each other, or "in contact with" each other, are directly connected together, without intervening elements (e.g., are touching).

The horizontal semiconductor layer 100 may consist of a semiconductor material including, for example, silicon (Si), germanium (Ge), silicon germanium (SiGe), gallium arsenic (GaAs), indium gallium arsenic (InGaAs), aluminum gallium arsenic (AlGaAs), or a mixture thereof. Alternatively or additionally, the horizontal semiconductor layer 100 may include a semiconductor doped with first conductivity impurities or an undoped intrinsic semiconductor. Further alternatively or additionally, the horizontal semiconductor layer 100 may have a single crystalline structure, an amorphous structure, and a polycrystalline structure, or a combination thereof.

In some embodiments, the horizontal semiconductor layer 100 may be a polycrystalline or single crystalline silicon layer deposited on the lower buried insulation layer 50 using a deposition process. Alternatively or additionally, the horizontal semiconductor layer 100 may be a polycrystalline or single crystalline silicon layer doped with n-type or p-type impurities.

In some embodiments, the horizontal semiconductor layer 100 may include a cell array region CAR and a connection region CNR around the cell array region CAR. The horizontal semiconductor layer 100 according to exemplary embodiments will be discussed below in detail with reference to FIGS. 8A to 17.

In some embodiments, a cell array structure CS may be provided on the horizontal semiconductor layer 100, and may include stack structures ST, vertical structures VS, and connection line structures CPLG, CL, WPLG, PPLG, and PCL.

On the horizontal semiconductor layer 100, the stack structures ST may extend in the first direction D1, being stacked in parallel with one another in the third direction D3, and may be arranged spaced apart from each other in the second direction D2. Each of the stack structures ST may include electrodes EL vertically stacked on the horizontal semiconductor layer 100 and insulation layers ILD interposed between the electrodes EL. The insulation layers ILD of the stack structures ST may have thicknesses that can be changed depending on characteristics of semiconductor memory devices. For example, one or more of the insulation layers ILD may be formed thicker than other ones of the insulation layers ILD. The insulation layers ILD may include silicon oxide. The electrodes EL may include a conductive material such as a semiconductor layer, a metal silicon layer, a metal layer, a metal nitride layer, or a combination thereof.

The stack structures ST may extend from the cell array region CAR to the connection region CNR along the first direction D1, and may have stepwise structures on the connection region CNR. The electrodes EL of the stack structures ST may have lengths in the first direction D1 that decrease with increasing distance from the horizontal semiconductor layer 100. For example, a length in the first direction D1 of individual ones of the vertically stacked electrodes EL may incrementally decrease from the bottommost one of the stacked electrodes EL to the topmost one of the stacked electrodes EL, such that the length of each electrode EL progressively decreases the closer the electrode EL is to the top of the stacked structure ST. The stack structures ST may have variously shaped stepwise structures on the connection region CNR.

In some embodiments, a three-dimensional semiconductor device may be a three-dimensional NAND Flash memory device, and cell strings (see CSTR of FIG. 3) may be integrated on the horizontal semiconductor layer 100. In this case, the stack structures ST may be configured such that topmost and bottommost electrodes EL may serve as gate electrodes of select transistors (see SST and GST of FIG. 3). For example, the topmost electrode EL may serve as a gate electrode of a string selector transistor (see SST of FIG. 3) that controls an electrical connection between a bit line BL and the vertical structures VS, and the bottommost electrode EL may serve as a gate electrode of a ground select transistor (see GST of FIG. 3) that controls an electrical connection between a common source line (see CSL of FIG. 3) and the vertical structures VS. Other electrodes EL between the topmost and bottommost electrodes EL may serve as control gate electrodes of memory cells and word lines (see WL0 to WL3 of FIG. 3) connecting the control gate electrodes.

The vertical structures VS may penetrate the stack structures ST to come into contact with the horizontal semiconductor layer 100 on the cell array region CAR. The vertical structures VS may be electrically connected to the horizontal semiconductor layer 100. As used herein, items described as being "connected" may be physically connected and/or electrically connected such that an electrical signal can be passed from one item to the other. For example, an electrically conductive component (e.g., a wire, pad, internal electrical line, etc.) physically connected to another electrically conductive component (e.g., a wire, pad, internal electrical line, etc.) may also be electrically connected to that component.

When viewed in a plan view, the vertical structures VS may be arranged along one direction or in a zigzag fashion. For example, the vertical structures VS may be arranged along straight lines in the first and/or second direction D1 and D2, or arranged in diagonal directions between adjacent ones of the vertical structures VS. On the connection region CNR, dummy vertical structures (not shown) may be provided to have substantially the same structure as those of the vertical structures VS.

The vertical structures VS may include a semiconductor material such as silicon (Si), germanium (Ge), or a mixture thereof. Alternatively or additionally, the vertical structures VS may include an impurity-doped semiconductor or an undoped intrinsic semiconductor. The vertical structures VS including a semiconductor material may serve as channels of the select transistors SST and GST and the memory cell transistors MCT discussed with reference to FIG. 3. The vertical structures VS may have bottom surfaces between top and bottom surfaces of the horizontal semiconductor layer 100. For example, bottom surfaces of the vertical structures VS may be below the top surface of the horizontal semiconductor layer 100 and above the bottom surface of the horizontal semiconductor layer 100. The vertical structures VS may each be provided at or on its upper end with a contact pad VSCP coupled to a bit line contact plugs BPLG. The conductive pad VSCP may be an impurity-doped region or may consist of a conductive material.

As illustrated in FIG. 7A, each of the vertical structures VS may include a first semiconductor pattern SP1 in contact with the horizontal semiconductor layer 100 and a second semiconductor pattern SP2 interposed between the first semiconductor pattern SP1 and a vertical insulation pattern VP. The first semiconductor pattern SP1 may have a hollow pipe shape or a macaroni shape. The first semiconductor pattern SP1 may have a closed bottom end and may have an inside filled with a buried insulation pattern VI. The first semiconductor pattern SP1 may be in contact with an inner wall of the second semiconductor pattern SP2 and the top surface of the horizontal semiconductor layer 100. The closed bottom end of the first semiconductor pattern SP1 may have a bottom surface in contact with the horizontal semiconductor layer 100. The first and second semiconductor patterns SP1 and SP2 may be undoped or doped with impurities whose conductivity is the same as that of the horizontal semiconductor layer 100. The first and second semiconductor patterns SP1 and SP2 may be polycrystalline or single crystalline.

In other embodiments, referring to FIGS. 6B and 7B, the vertical structures VS may include a lower semiconductor pattern LSP, which penetrates a lower portion of the stack structure ST to come into contact with the horizontal semiconductor layer 100, and an upper semiconductor pattern USP, which penetrates an upper portion of the stack structure ST to come into connection with the lower semiconductor pattern LSP.

The lower semiconductor pattern LSP may be an epitaxial pattern, and may consist of a semiconductor material having the same conductivity as that of the horizontal semiconductor layer 100. For example, the lower semiconductor pattern LSP may have a pillar shape penetrating the bottommost electrode EL. The lower semiconductor pattern LSP may have a bottom surface lower than the top surface of the horizontal semiconductor layer 100. The lower semiconductor pattern LSP may have a top surface higher than a top surface of the bottommost electrode EL. In some embodiments, the lower semiconductor pattern LSP may serve as a channel region of the ground select transistor GST discussed with reference to FIG. 3.

The upper semiconductor pattern USP may have a hollow pipe shape or a macaroni shape. The upper semiconductor pattern USP may have a closed bottom end. The upper semiconductor pattern USP may have an inside filled with a buried insulation pattern VI. The upper semiconductor pattern USP may have a bottom surface lower than a topmost surface of the lower semiconductor pattern LSP. For example, the upper semiconductor pattern USP may have a structure inserted into the lower semiconductor pattern LSP. The upper semiconductor pattern USP may include a semiconductor material. For example, the upper semiconductor pattern USP may include silicon (Si), germanium (Ge), or a mixture thereof, and may be an impurity-doped semiconductor or an undoped intrinsic semiconductor. The upper semiconductor pattern USP may have a single crystalline structure, an amorphous structure, a polycrystalline structure, a combination thereof. The upper semiconductor pattern USP may have a conductive pad at or on its upper end. The conductive pad may be an impurity-doped region or may consist of a conductive material.

In more detail, the upper semiconductor pattern USP may include a first semiconductor pattern SP1 and a second semiconductor pattern SP2. The first semiconductor pattern SP1 may be coupled to the lower semiconductor pattern LSP and may have a macaroni or pipe shape whose bottom end is closed. In some embodiments, a bottom surface of the closed bottom end of the first semiconductor pattern SP1 may be below a topmost surface of the lower semiconductor pattern LSP. For example, the structure inserted into the lower semiconductor pattern LSP may be the closed bottom end of the first semiconductor pattern SP1. The first semiconductor pattern SP1 may have an inside filled with a buried insulation pattern VI. The first semiconductor pattern SP1 may be in contact with an inner wall of the second semiconductor pattern SP2 and a top surface of the lower semiconductor pattern LSP.

Referring to FIGS. 7A and 7B, a vertical insulation pattern VP may be disposed between the stack structure ST and the vertical structure VS. In the embodiment illustrated in FIG. 7A, the vertical insulation pattern VP may extend in a third direction D3 and may surround a sidewall of the vertical structure VS. In the embodiment illustrated in FIG. 7B, the vertical insulation pattern VP may extend in the third direction D3 and may surround a sidewall of upper semiconductor pattern USP. For example, the vertical insulation pattern VP may have a macaroni shape or a pipe shape whose top and bottom ends are opened. In the embodiments of FIGS. 7A and 7B, the vertical insulation pattern VP may surround a sidewall of the first semiconductor pattern SP2 for the entire length of the first semiconductor pattern SP2 in the third direction D3, and the vertical insulation pattern VP may surround an upper portion of the sidewall of the second semiconductor pattern SP1 in the third direction D3. For example, the vertical insulation pattern VP may not cover a lower portion of the sidewall and bottom surface of the second semiconductor pattern SP1.

The vertical insulation pattern VP may consist of a single thin layer or a plurality of thin layers. In some embodiments, the vertical insulation pattern VP may be a portion of a data storage layer. For example, the vertical insulation pattern VP may include a tunnel insulation layer TIL, a charge storage layer CIL, and a blocking insulation layer BIL, which constitute a data storage layer of a NAND Flash memory device. For example, the charge storage layer CIL may be a trap insulation layer, a floating gate electrode, or an insulation layer including conductive nanodots. In more detail, the charge storage layer CIL may include one or more of a silicon nitride layer, a silicon oxynitride layer, a silicon-rich nitride layer, a nanocrystalline silicon layer, and a laminated trap layer. The tunnel insulation layer TIL may be one of materials having a band gap greater than that of the charge storage layer CIL, and the blocking insulation layer BIL may be a high-k dielectric layer such as an aluminum oxide layer and a hafnium oxide layer. Alternatively, the vertical insulation pattern VP may include a thin layer for a phase change memory device or for a changeable resistance memory device.

A horizontal insulation pattern HP may be provided between the vertical insulation pattern VP and sidewalls of the electrodes EL. The horizontal insulation pattern HP may extend onto top and bottom surfaces of the electrodes EL from the sidewalls of the electrodes EL. In the embodiment illustrated in FIG. 7B, the horizontal insulation pattern HP may have a portion that extends onto top and bottom surfaces of the bottommost electrode EL from between the bottommost electrode EL and a gate dielectric layer 15 on a side of the lower semiconductor pattern LSP. The horizontal insulation pattern HP may include a charge storage layer and a blocking insulation layer that are portions of a data storage layer of an NAND Flash memory device. Alternatively, the horizontal insulation pattern HP may include a blocking insulation layer.

Referring back to FIGS. 5, 6A, and 6B, common source regions CSR may be disposed in the horizontal semiconductor layer 100 between the stack structures ST adjacent to each other. The common source regions CSR may extend parallel to the stack structures ST in the first direction D1. The common source regions CSR may be formed by doping the horizontal semiconductor layer 100 with second conductivity impurities. The common source regions CSR may include, for example, n-type impurities (e.g., arsenic (As) or phosphorous (P)).

A common source plug CSP may be coupled to the common source region CSR. A sidewall insulation spacer SP may be interposed between the common source plug CSP and the stack structures ST. In a read or program operation of a three-dimensional NAND Flash memory device, a ground voltage may be applied through the common source plug CSP to the common source region CSR.

An upper buried insulation layer 150 may be disposed on the horizontal semiconductor layer 100 and may cover stepwise ends of the electrodes EL. A first interlayer dielectric layer 151 may cover top surfaces of the vertical structures VS, and may be provided thereon with a second interlayer dielectric layer 153 covering a top surface of the common source plug CSP. For example, top surfaces of the vertical structures VS may be coplanar with a top surface of the upper buried insulation layer 150, and a bottom surface of the first interlayer dielectric layer 151 may be in contact with top surfaces of the vertical structures VS and the upper buried insulation layer 150. Top surfaces of the common source plugs CSP may be coplanar with a top surface of the first interlayer dielectric layer 151, and a bottom surface of the second interlayer dielectric layer 153 may be in contact with top surfaces of the common source plugs CSP and the first interlayer dielectric layer 151. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Bit lines BL may be provided on the second interlayer dielectric layer 153, and may extend in the second direction D2 to thereby cross over the stack structures ST. The bit line BL may be electrically connected through bit line contact plug BPLG to the vertical structure VS. For example, a bottom surface of the bit line BL may be in contact with a top surface of the bit line contact plug BPLG, and a bottom surface of the bit line contact plug BPLG may be in contact with a top surface of the contact pad VSCP provided at or on the upper end of the vertical structure VS.

The stepwise ends of the stack structures ST may be provided thereon with a connection line structure that electrically connects the cell array structure CS to the peripheral logic structure PS. The connection line structure may include cell contact plugs CPLG that penetrate the upper buried insulation layer 150 and the first and second interlayer dielectric layers 151 and 153 to come into connection with corresponding ends of the electrodes EL, and may further include connection lines CL that are provided on the second interlayer dielectric layer 153 to come into connection with corresponding cell contact plugs CPLG. In some embodiments, each of the contact plugs CPLG may have substantially vertical sidewalls continuously extending from the top surface of the upper buried insulating layer 150 to the electrode EL to which the contact plug CPLG is connected.

In addition, the connection line structure may include well contact plugs WPLG that are coupled to well pick-up regions PUR in the horizontal semiconductor layer 100, connection contact plugs PPLG that penetrate the upper and lower buried insulation layers 150 and 50 to come into connection with peripheral circuit lines 33, and peripheral connection lines PCL that connect the well contact plugs WPLG to the connection contact plugs PPLG.

The well pick-up regions PUR may be disposed in the horizontal semiconductor layer 100, and may lie adjacent to opposite ends of each of the stack structures ST. A top surface of the well pick-up regions PUR may be coplanar with a top surface of the horizontal semiconductor layer 100. The well pick-up regions PUR may have the same conductivity as that of the horizontal semiconductor layer 100, and may have an impurity concentration greater than that of the horizontal semiconductor layer 100. For example, the well pick-up regions PUR may include heavily doped p-type impurities (e.g., boron (B)). In some embodiments, in an erase operation of a three-dimensional NAND Flash memory device, an erase voltage may be applied to the well pick-up regions PUR through the connection contact plugs PPLG and the well contact plugs WPLG.

FIGS. 8A to 8D illustrate plan views showing a horizontal semiconductor layer of a three-dimensional semiconductor device according to exemplary embodiments.

Figure 8A:
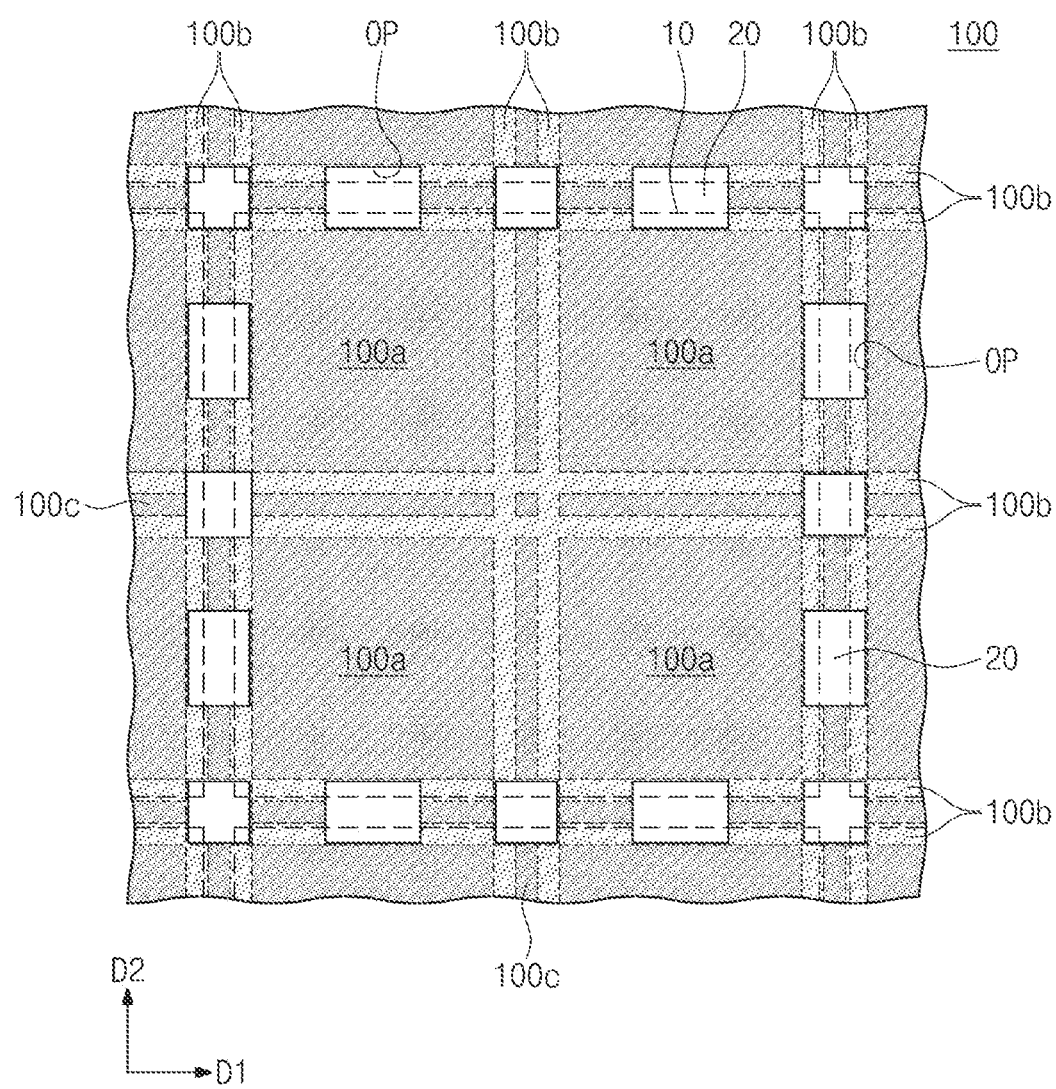
FIGS. 8A to 8D illustrate plan views showing a horizontal semiconductor layer of a three-dimensional semiconductor device, according to exemplary embodiments.
Figure 8B:
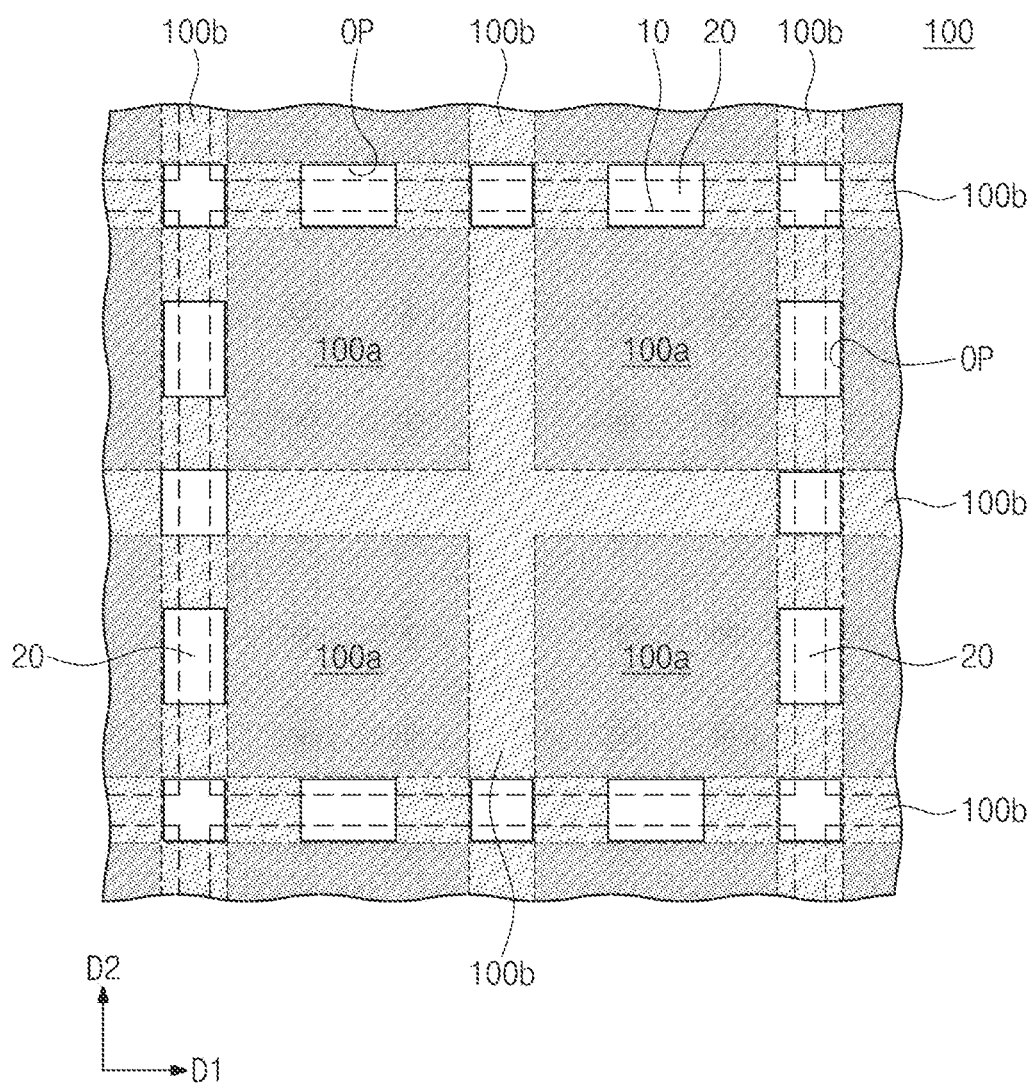

Referring to FIGS. 8A and 8B, the horizontal semiconductor layer 100 may consist of a single layer that extends in the first and second directions D1 and D2 on the entire surface of the semiconductor substrate 1 discussed with reference to FIG. 1. For example, the single layered horizontal semiconductor layer 100 may cover a plurality of the chip regions 10.

The horizontal semiconductor layer 100 may include a plurality of well regions 100a having a first conductivity and at least one separation impurity region 100b having a second conductivity different from the first conductivity. The separation impurity region 100b may be in contact with neighboring well regions 100a. The separation impurity region 100b may be provided around each of the well regions 100a. For example, when the plurality of well regions 100a are doped with p-type impurities, the separation impurity region 100b may be doped with n-type impurities. Alternatively, when the plurality of well regions 100a are doped with n-type impurities, the separation impurity region 100b may be doped with p-type impurities. In some embodiments, the separation impurity region 100b and the well regions 100a may be provided to form PN junctions. The separation impurity regions 100b may be regions that do not have memory cells formed vertically above them. For example, no cell array structures are formed above the separation impurity regions 100b, and no cell array structures are formed to overlap the separation impurity regions 100b, when viewed in a plan view.

As illustrated in FIGS. 8A and 8B, a plurality of the well regions 100a may be provided on each chip region 10. The well regions 100a may be arranged along the first and second directions D1 and D2.

Referring to FIG. 8A, a pair of the separation impurity regions 100b may be provided along the first and second directions D1 and D2 to thereby define the well regions 100a. For example, a pair of the separation impurity regions 100b may extend in the second direction D2 between the well regions 100a adjacent to each other in the first direction D1. In addition, another pair of the separation impurity regions 100b may extend in the first direction D1 between the well regions 100a adjacent to each other in the second direction D2. The pairs of separation impurity regions 100b may extend along all perimeter sides of the well regions 100a, and the separation impurity regions 100b may surround the well regions 100a.

In more detail, the separation impurity regions 100b may be provided spaced part from each other, and a dummy impurity region 100c may be provided between the separation impurity regions 100b and may be in contact with the separation impurity regions 100b. The dummy impurity region 100c may form PN junctions with the separation impurity regions 100b. The dummy impurity region 100c may have the same first conductivity as those of the well regions 100a, but a first-conductivity impurity concentration may be different between the dummy impurity region 100c and the well regions 100a. The different regions 100a, 100b, and 100c may be referred to herein as first, second, or third regions, to distinguish from each other (with the labels "first," "second," and "third" not necessarily corresponding respectively to the three regions). Labels such as "first," "second," "third," etc., may be used in the specification or claims to describe other elements herein to distinguish those elements from each other. In some embodiments, the first-conductivity impurity concentration of the dummy impurity region 100c may be less than those of the well regions 100a. In this case, a breakdown voltage may be securely obtained when a reverse bias is applied to the PN junction between the dummy impurity region 100c and the separation impurity region 100b.

Referring to FIG. 8B, a plurality of the well regions 100a may be defined by single separation impurity regions 100b extending in the first and second directions D1 and D2. For example, the separation impurity region 100b may be provided between the well regions 100a adjacent to each other in the first and second directions D1 and D2. The separation impurity region 100b may extend along all perimeter sides of the well regions 100a, and the separation impurity region 100b may surround the well regions 100a. In such a configuration, one separation impurity region 100b may form PN junctions with a plurality of the well regions 100a adjacent to each other.

In some embodiments, the horizontal semiconductor layer 100 may have openings OP between the chip regions 10, and may have bridge portions between the openings OP. For example, the bridge portions may be the portions between neighboring openings OP. The opening OP of the horizontal semiconductor layer 100 may expose the lower buried insulation layer 50 of the peripheral logic structure PS discussed with reference to FIGS. 5, 6A, and 6B. For example, the bridge portions of the horizontal semiconductor layer 100 may be provided to run across the scribe line region 20. The bridge portion of the horizontal semiconductor layer 100 may have a width less than that in the first or second direction D1 or D2 of the well region 100a. The width of the bridge portion may be the same as a width of the adjacent openings OP. In some embodiments, the separation impurity regions 100b may also be provided in the bridge portions of the horizontal semiconductor layer 100. For example, one or more of the separation impurity regions 100b may have a width less than those of the well regions 100a.

Figure 8C:
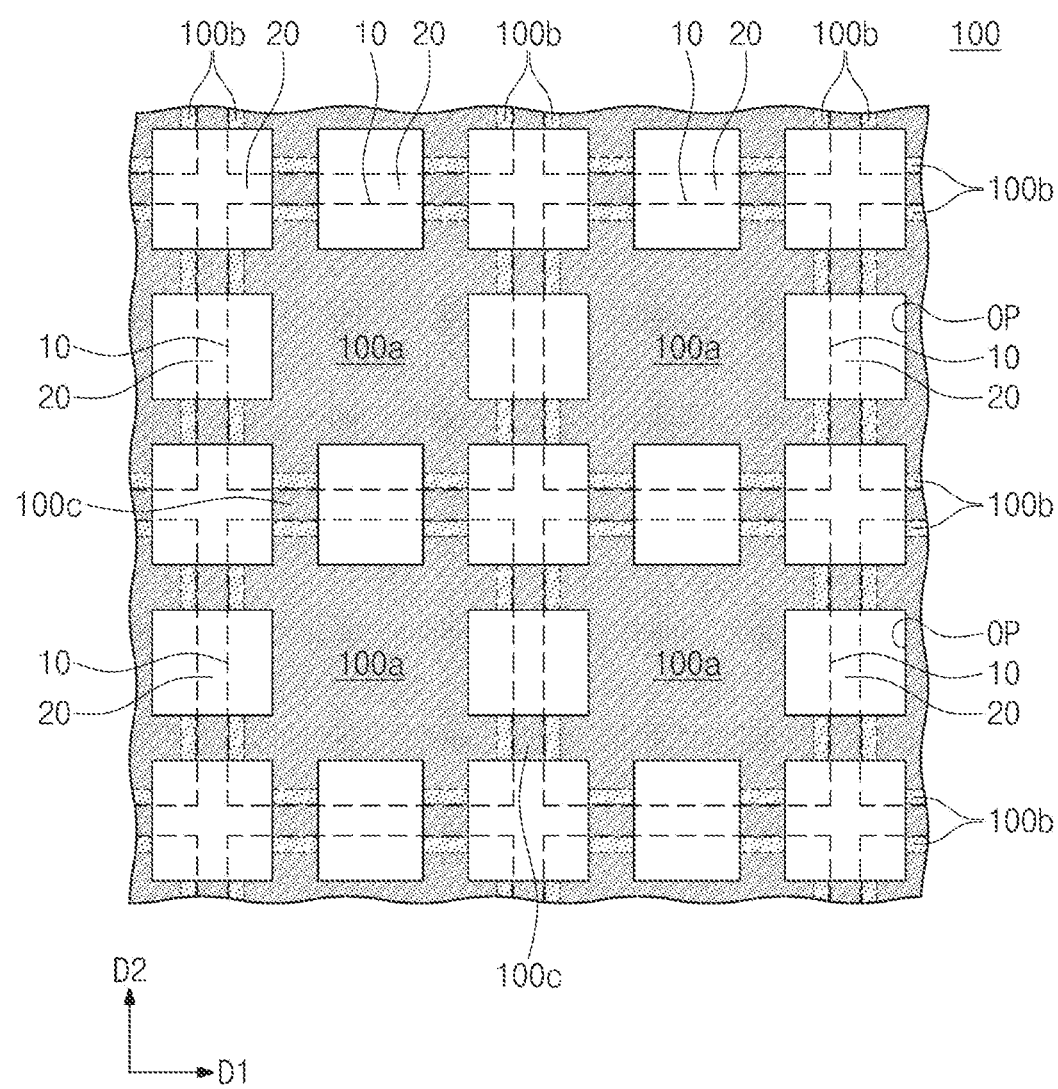
Figure 8D:
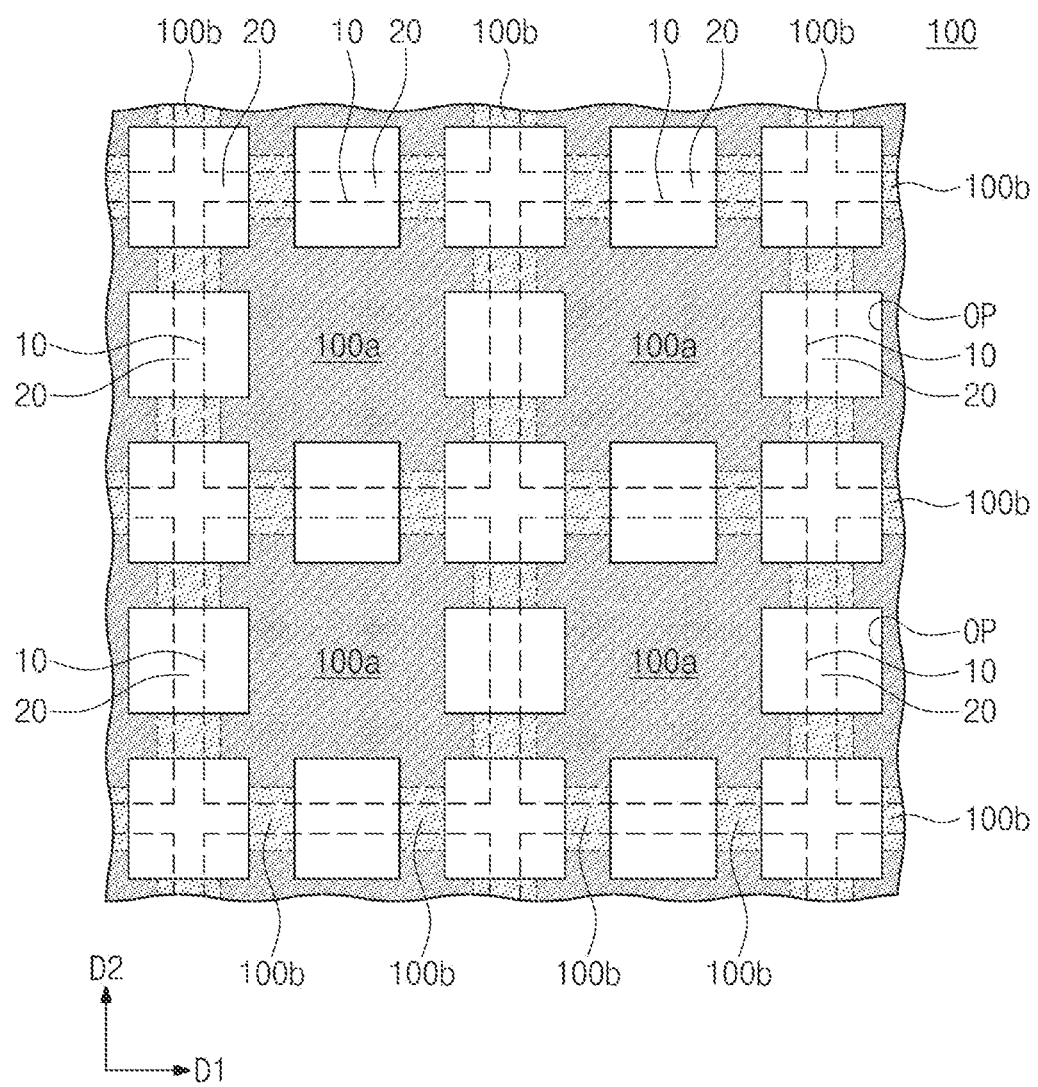

Referring to FIGS. 8C and 8D, the well regions 100a of the horizontal semiconductor layer 100 may correspond to corresponding chip regions 10. The separation impurity regions 100b may be provided between the chip regions 10.

Referring to FIG. 8C, the horizontal semiconductor layer 100 may include the well regions 100a provided on corresponding chip regions 10 and the separation impurity regions 100b provided between the chip regions 10. As discussed above, the horizontal semiconductor layer 100 may have the openings OP between the chip regions 10, or at an edge of the chip region 10. A portion of the scribe line region 20 may overlap the bridge portions and the openings OP of the horizontal semiconductor layer 100.

In the embodiment illustrated in FIG. 8C, a pair of the separation impurity regions 100b may be provided in each bridge portion of the horizontal semiconductor layer 100, and the dummy impurity region 100c may be provided between the separation impurity regions 100b. The pairs of separation impurity regions 100b may extend along all perimeter sides of the well regions 100a, and the separation impurity regions 100b may surround the well regions 100a. As discussed above in connection with FIG. 8A, the separation impurity regions 100b may be doped with second conductivity impurities, and the dummy impurity region 100c may be doped with first conductivity impurities. Alternatively, in the embodiment illustrated in FIG. 8D, one separation impurity region 100b may be provided in each bridge portion of the horizontal semiconductor layer 100. In such a configuration, the bridge portions of the horizontal semiconductor layer 100 may include at least one PN junction. The separation impurity region 100b may extend along all perimeter sides of the well regions 100a, and the separation impurity region 100b may surround the well regions 100a.

According to exemplary embodiments, each well region 100a of the horizontal semiconductor layer 100 discussed with reference to FIGS. 8A to 8D may be provided thereon with the cell array structure CS discussed with reference to FIGS. 5, 6A, and 6B. This will be described in detail with reference to FIGS. 9 to 17.

In the embodiments illustrated in FIGS. 8A to 8D, the semiconductor substrate 1 may be cut along the scribe line region 20, and may thus be separated into a plurality of semiconductor chips. The cutting may be done on portions of the horizontal semiconductor layer 100 that are formed on the scribe line region 20.

Figure 9:
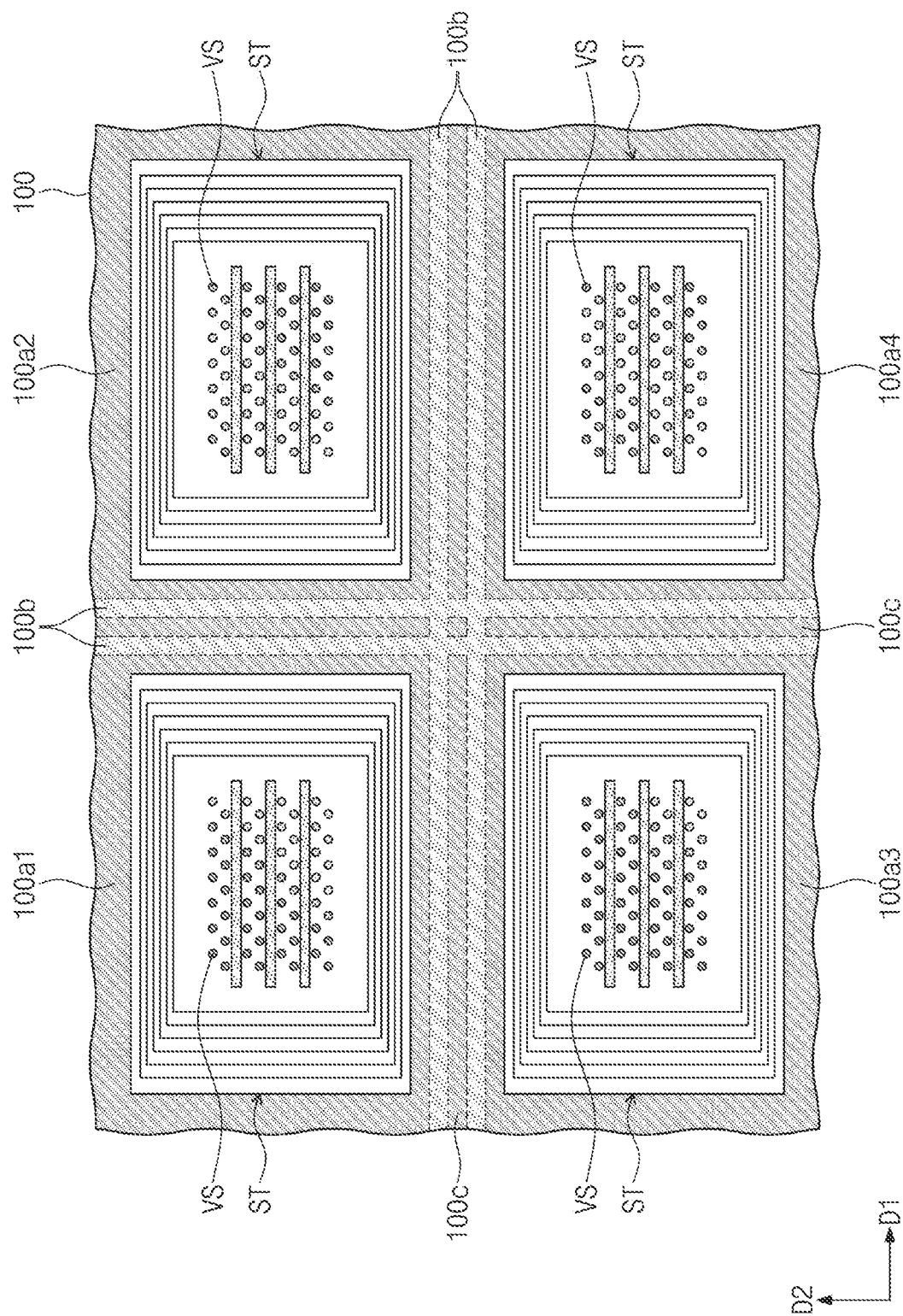
FIG. 9 illustrates a plan view showing a three-dimensional semiconductor device, according to exemplary embodiments.
Figure 10A:
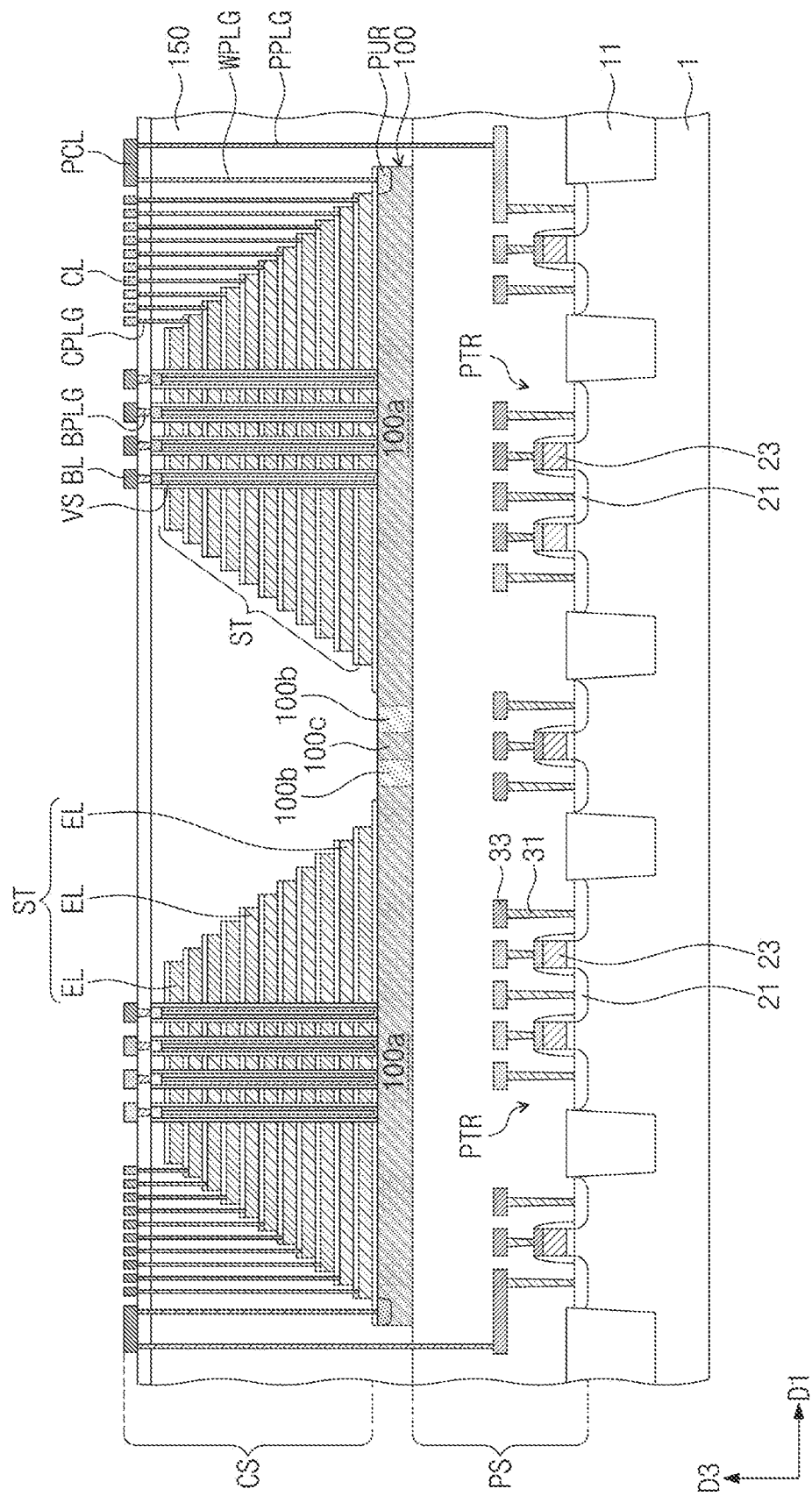
FIGS. 10A and 10B illustrate cross-sectional views showing the three-dimensional semiconductor device of FIG. 9, according to exemplary embodiments.
Figure 10B:
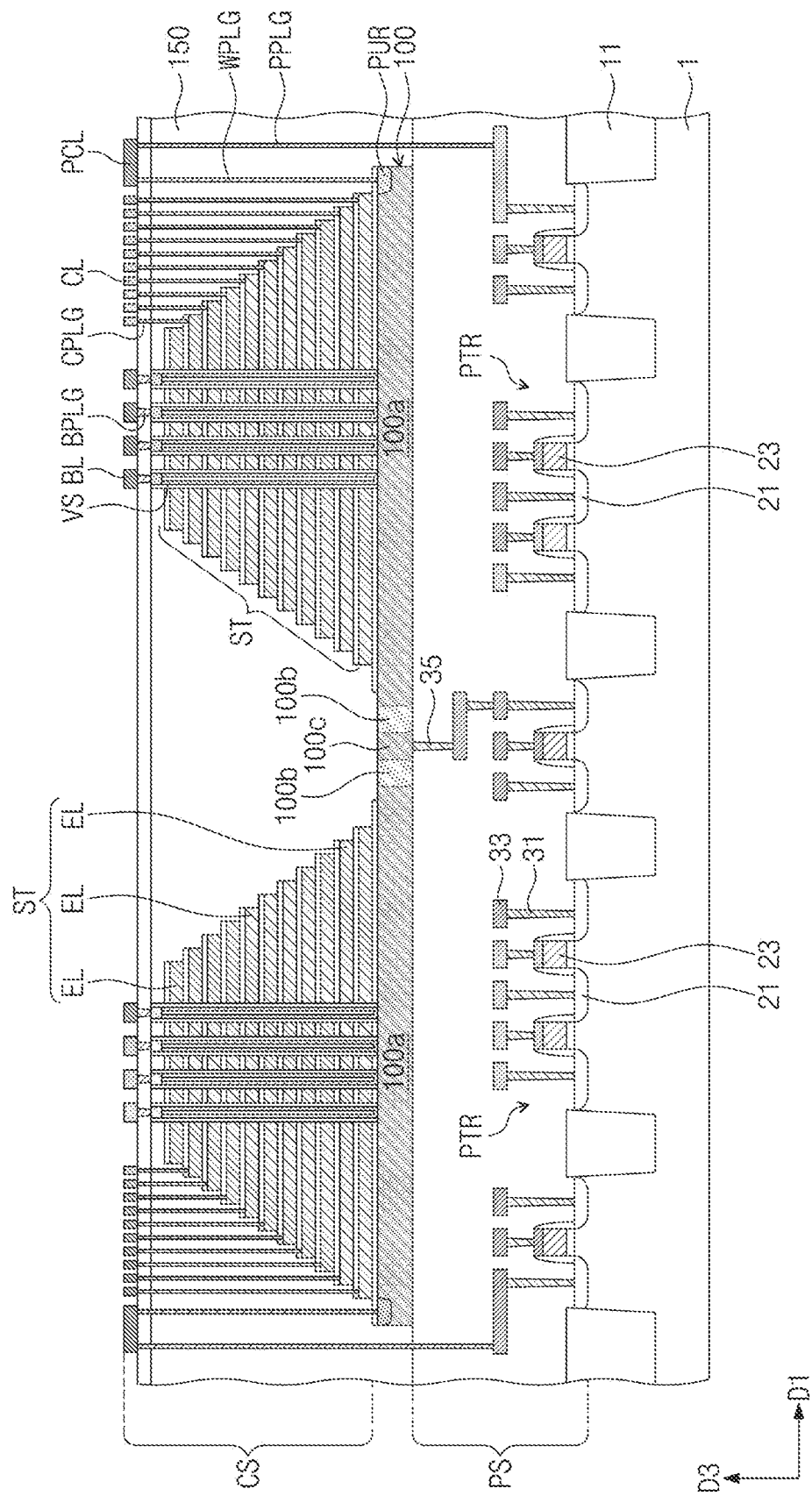

FIG. 9 illustrates a plan view showing a three-dimensional semiconductor device according to exemplary embodiments. FIGS. 10A and 10B illustrate cross-sectional views showing the three-dimensional semiconductor device shown in FIG. 9 according to exemplary embodiments. The description of technical features the same as those in the three-dimensional semiconductor devices discussed with reference to FIGS. 5, 6A, 6B, and 8A to 8D may be omitted in the interest of brevity of explanation.

Referring to FIGS. 9, 10A, and 10B, a semiconductor substrate 1 may be provided thereon with a peripheral logic structure PS including peripheral logic circuits PTR, and a horizontal semiconductor layer 100 may be provided on the peripheral logic structure PS.

The horizontal semiconductor layer 100 may extend along first and second directions D1 and D2. The horizontal semiconductor layer 100 may, as discussed above, include well regions 100a1, 100a2, 100a3, and 100a4 and separation impurity regions 100b between the well regions 100a1 to 100a4. As discussed above, any of the well regions 100a1 to 100a4 may have an opposite conductivity to that of any of the separation impurity regions 100b. Accordingly, the separation impurity regions 100b and the well regions 100a1 to 100a4 may be provided to form PN junctions.

In some embodiments, the well regions 100a1 to 100a4 may include a first well region 100a1, a second well region 100a2, a third well region 100a3, and a fourth well region 100a4. The separation impurity regions 100b may be pairs of separation impurity regions 100b, and may be spaced apart from each other between the first to fourth well regions 100a1 to 100a4, and may be provided therebetween with the dummy impurity region 100c having a first conductivity. The separation impurity regions 100b may form PN junctions with the first to fourth well regions 100a1 to 100a4, and the dummy impurity region 100c may form PN junctions with the separation impurity regions 100b. As discussed above, the dummy impurity region 100c and the first to fourth well regions 100a1 to 100a4 may have the same conductivity, but an impurity concentration of the dummy impurity region 100c may be less than those of the first to fourth well regions 100a1 to 100a4.

Each of the first to fourth well regions 100a1 to 100a4 of the horizontal semiconductor layer 100 may be provided thereon with a cell array structure CS discussed above. For example, a stack structure ST and its corresponding vertical structures VS may be provided on each of the first to fourth well regions 100a1 to 100a4.

The stack structures ST may have stepwise structures on corresponding edges of the first to fourth well regions 100a1 to 100a4. In some embodiments, the horizontal semiconductor layer 100 may be configured such that a central portion of each of the first to fourth well regions 100a1 to 100a4 may correspond to a cell array region (see CAR of FIG. 5), and an edge portion surrounding the central portion of each of the first to fourth well regions 100a1 to 100a4 may correspond to a connection region (see CNR of FIG. 5).

The separation impurity regions 100b may be provided between the stack structures ST adjacent to each other. On each of the first to fourth well regions 100a1 to 100a4, the vertical structures VS may penetrate the stack structures ST to come into connection with the first to fourth well regions 100a1 to 100a4 of the horizontal semiconductor layer 100. An upper buried insulation layer 150 may be provided on the horizontal semiconductor layer 100, and may cover the stack structures ST and the vertical structures VS. As discussed above, the horizontal semiconductor layer 100 may have one or more openings (see OP of FIGS. 8A to 8D) that expose the lower buried insulation layer 50. The opening may be provided at a side of each of the first to fourth well regions 100a1 to 100a4, and may be filled with the upper buried insulation layer 150.

A connection line structure may be provided on an edge portion of each of the first to fourth well regions 100a1 to 100a4. The connection line structure may include cell contact plugs CPLG coupled to electrodes EL of the stack structure ST, a well contact plug WPLG coupled to the horizontal semiconductor layer 100, and a connection contact plug PPLG penetrating the upper and lower buried insulation layers 150 and 50. The connection line structures provided on neighboring ones of the first to fourth well regions 100a1 to 100a4 may be arranged mirror-symmetric to each other. In an erase operation of a three-dimensional NAND Flash memory device, an erase voltage may be applied from the peripheral logic circuits PTR to well pick-up regions PUR of the horizontal semiconductor layer 100 through the well contact plug WPLG, the connection contact plug PPLG, and peripheral connection lines PCL.

In some embodiments, as illustrated in FIG. 10A, the separation impurity regions 100b and the dummy impurity region 100c may be electrically floated. Alternatively, referring to FIG. 10B, the dummy impurity region 100c may be connected to a peripheral contact plug 35 of the peripheral logic structure PS. In this case, when a three-dimensional semiconductor device is operated, a predetermined voltage may be applied from the peripheral logic circuit PTR to the dummy impurity region 100c.

Figure 11:
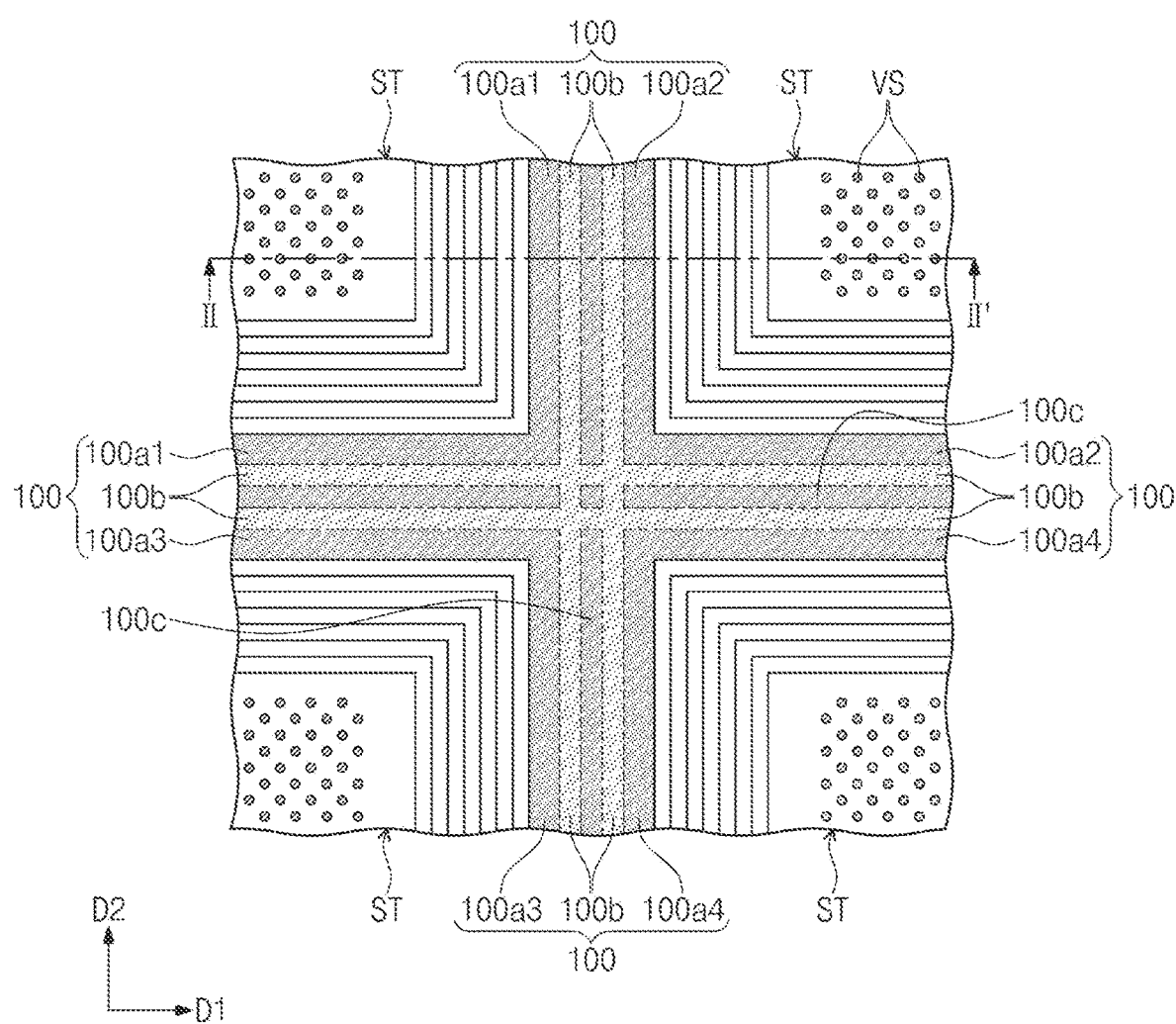
FIGS. 11, 12, and 13 illustrate plan views partially showing a three-dimensional semiconductor device, according to exemplary embodiments.
Figure 12:
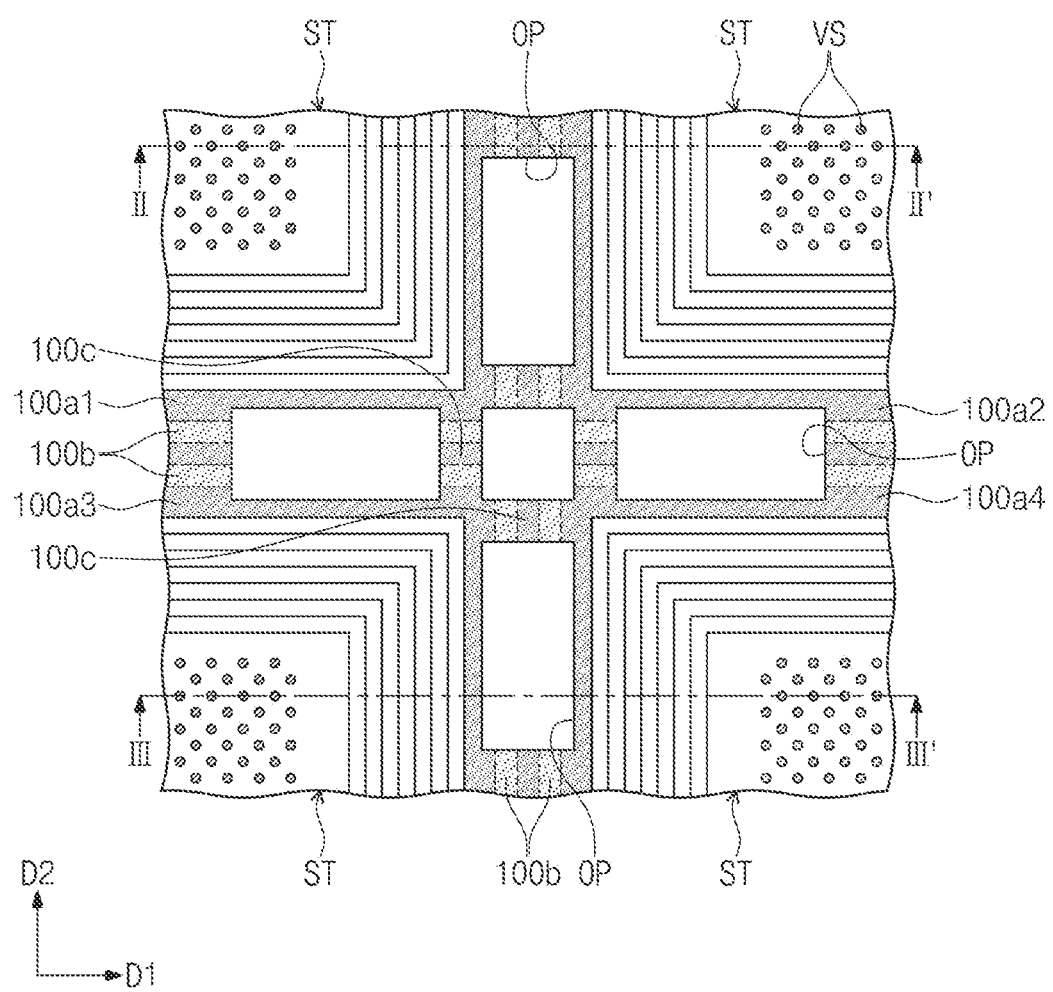
Figure 13:
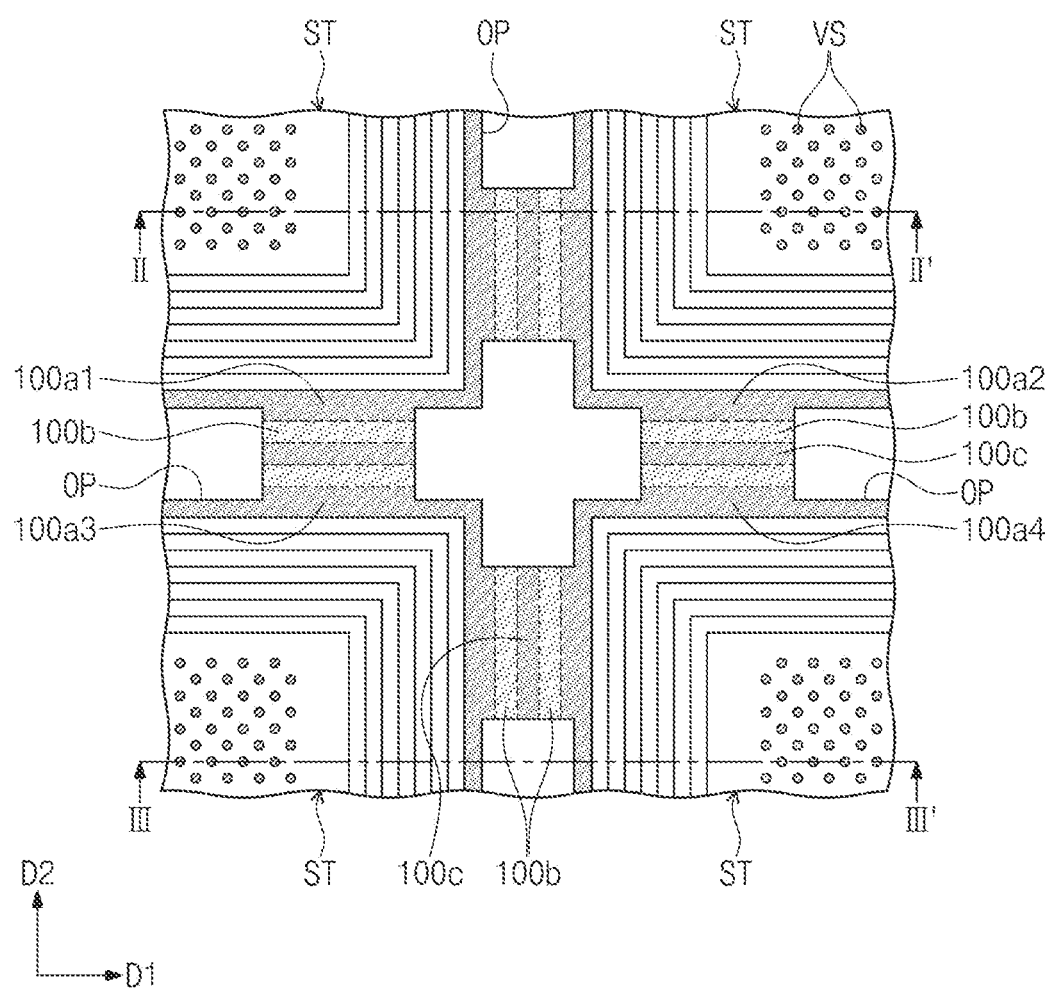
Figure 14:
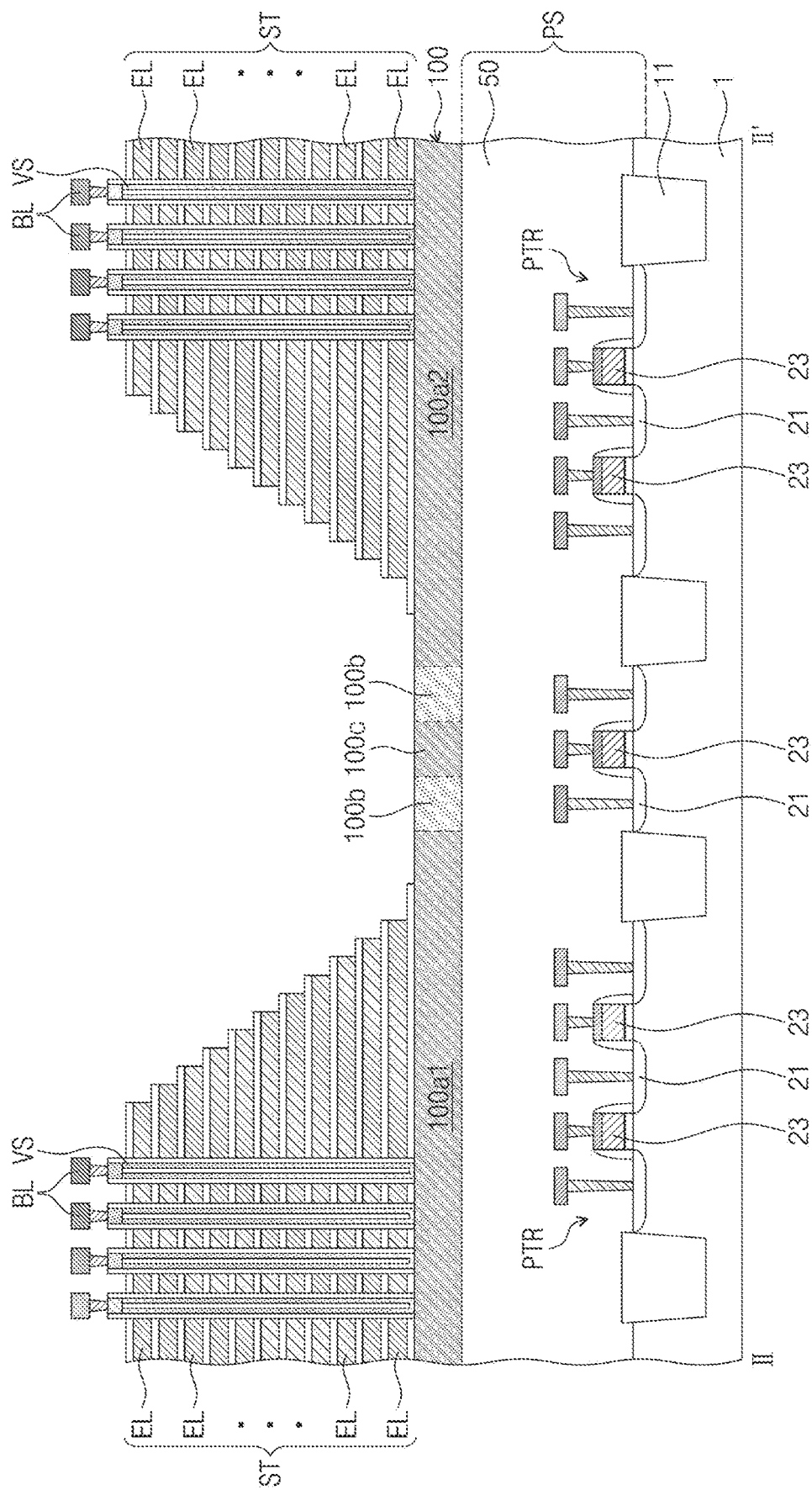
FIG. 14 illustrates a cross-sectional view taken along line II-II' of FIGS. 11, 12, and 13, showing a three-dimensional semiconductor device, according to exemplary embodiments.
Figure 15:
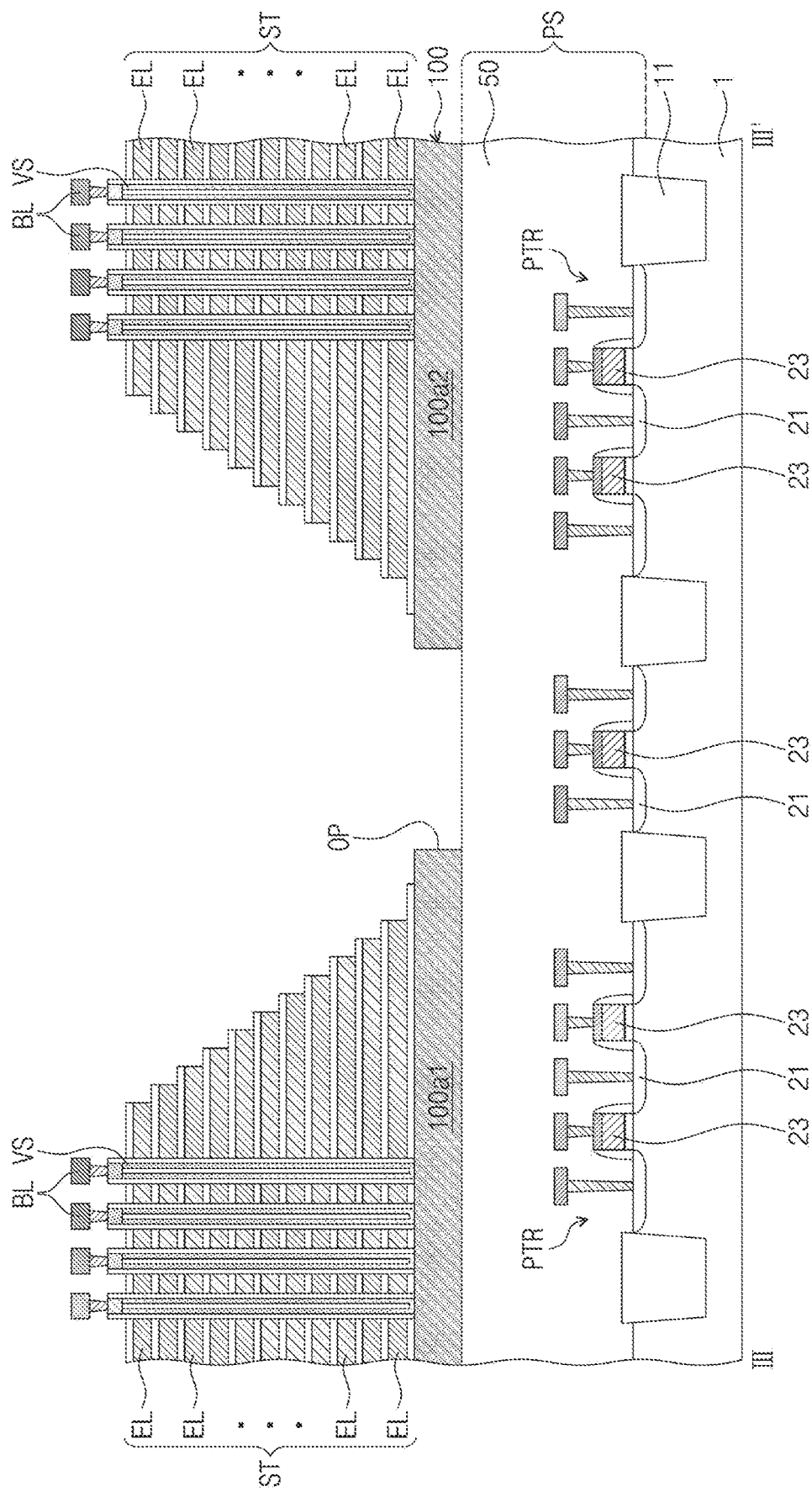
FIG. 15 illustrates a cross-sectional view taken along line III-III' of FIGS. 12 and 13, showing a three-dimensional semiconductor device, according to exemplary embodiments.
Figure 16:
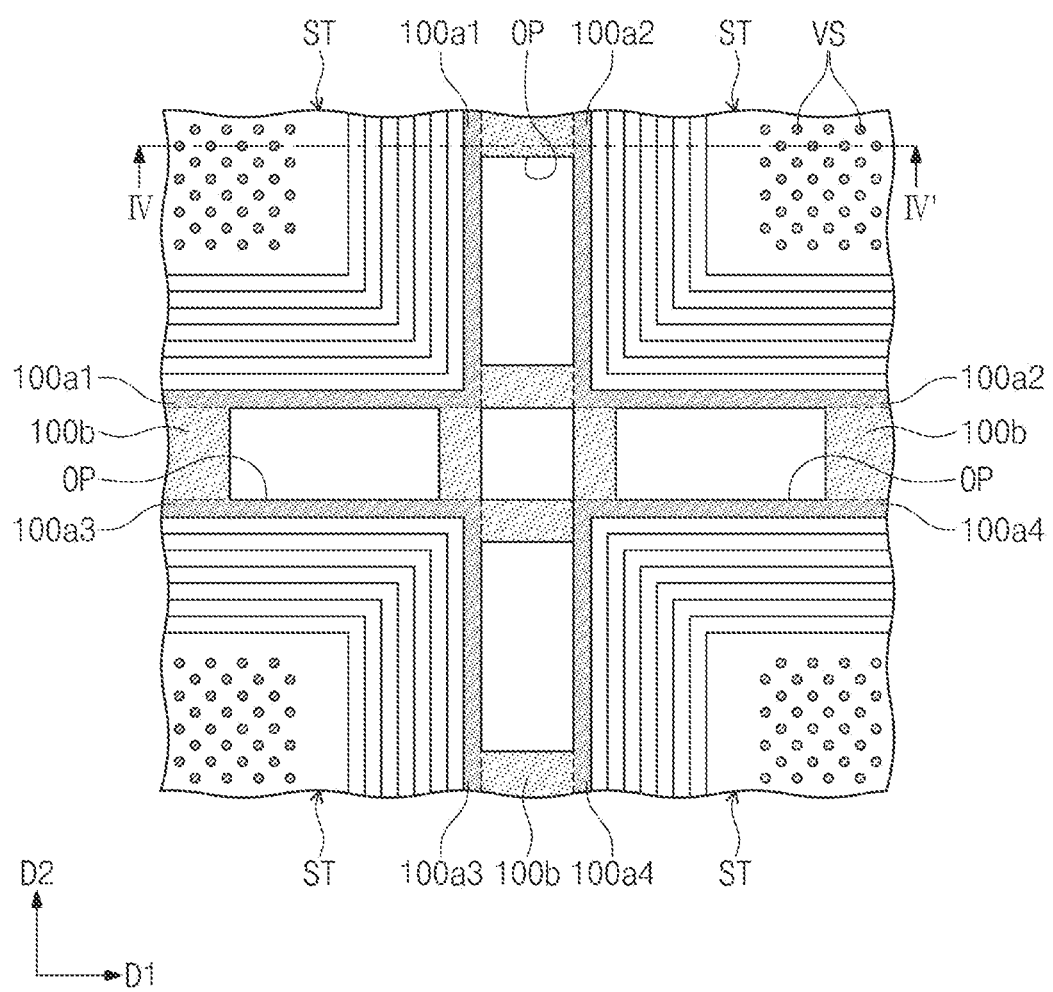
FIG. 16 illustrates a plan view partially showing a three-dimensional semiconductor device, according to exemplary embodiments.
Figure 17:
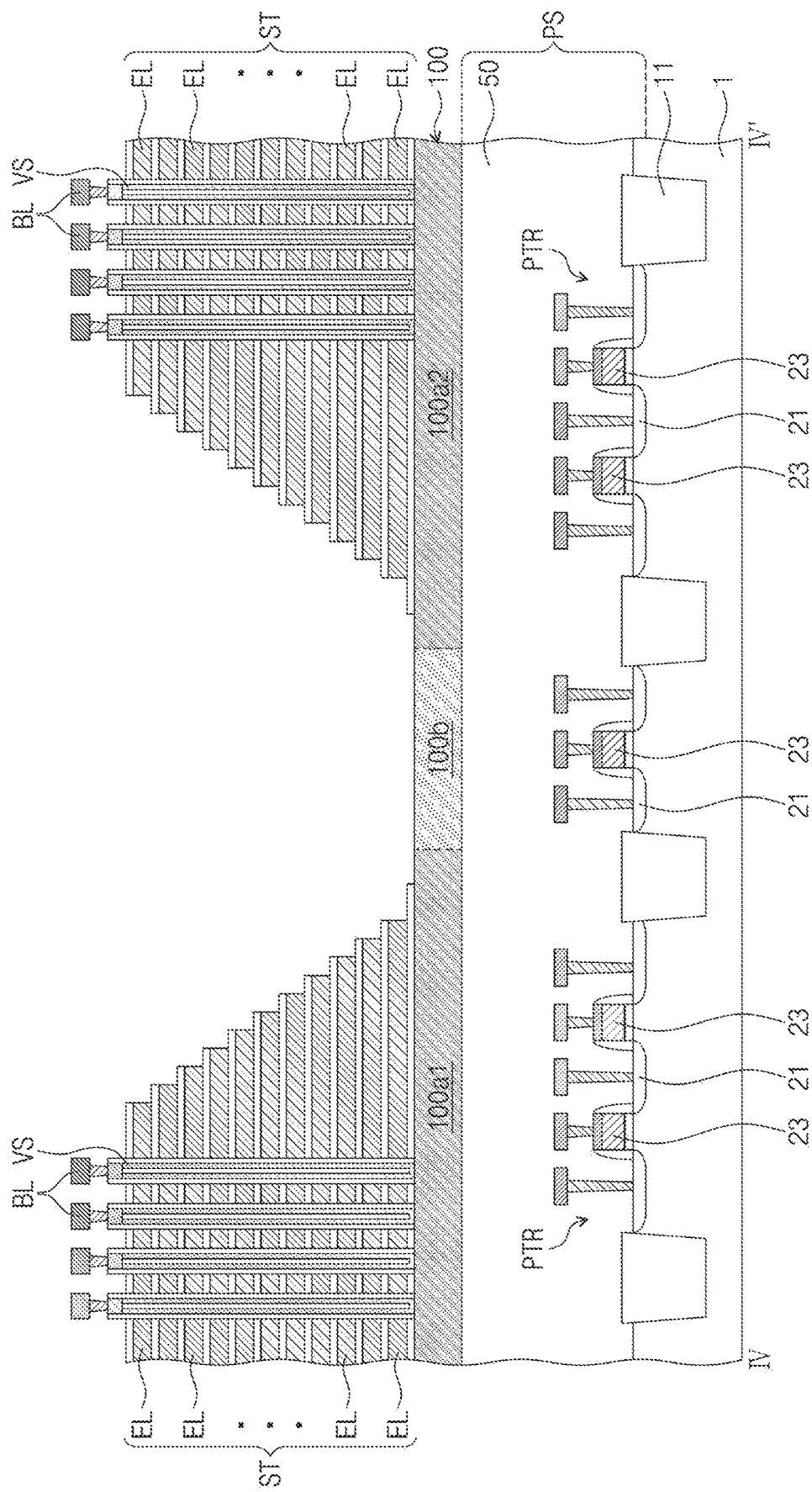
FIG. 17 illustrates a cross-sectional view taken along line IV-IV' of FIG. 16, showing a three-dimensional semiconductor device, according to exemplary embodiments.

FIGS. 11, 12, 13, and 16 illustrate plan views partially showing a three-dimensional semiconductor device according to exemplary embodiments. FIG. 14 illustrates a cross-sectional view taken along line II-II' of FIGS. 11, 12, and 13, showing a three-dimensional semiconductor device according to exemplary embodiments. FIG. 15 illustrates a cross-sectional view taken along line III-III' of FIGS. 12 and 13, showing a three-dimensional semiconductor device according to exemplary embodiments. FIG. 17 illustrates a cross-sectional view taken along line IV-IV' of FIG. 16, showing a three-dimensional semiconductor device according to exemplary embodiments. The description of technical features the same as those in the three-dimensional semiconductor devices discussed with reference to FIGS. 5, 6A, 6B, and 8A to 8D may be omitted in the interest of brevity of explanation.

Referring to FIGS. 11 and 14, the horizontal semiconductor layer 100 according to exemplary embodiments may be provided on the peripheral logic structure PS including the peripheral logic circuits PTR integrated on the semiconductor substrate 1.

For example, the horizontal semiconductor layer 100 may include the first to fourth well regions 100a1, 100a2, 100a3, and 100a4. A pair of the separation impurity regions 100b may be provided between the first to fourth well regions 100a1 to 100a4. As discussed above, any of the first to fourth well regions 100a1 to 100a4 may have an opposite conductivity to that of any of the separation impurity regions 100b. Each of the first to fourth well regions 100a1 to 100a4 may form PN junctions with the separation impurity regions 100b in the first and second directions D1 and D2.

Referring to FIGS. 12, 13, and 16, the separation impurity regions 100b may have a width in the first or second direction D1 or D2 less than that of each of the first to fourth well regions 100a1 to 100a4. For example, the separation impurity regions 100b may form PN junctions with a portion of each of the first to fourth well regions 100a1 to 100a4. The horizontal semiconductor layer 100 may have the openings OP between the first to fourth well regions 100a1 to 100a4. The openings OP may penetrate the horizontal semiconductor layer 100 to thereby expose the lower buried insulation layer 50. The openings OP may also be provided between the stack structures ST adjacent to each other.

Referring to FIGS. 16 and 17, the bridge portions may be provided between the chip regions 10 and the first to fourth well regions 100a1 to 100a4 each of which is provided on a corresponding one of the chip regions 10. In such a configuration, the separation impurity region 100b may be provided on the entirety of the bridge portions.

Figure 18:
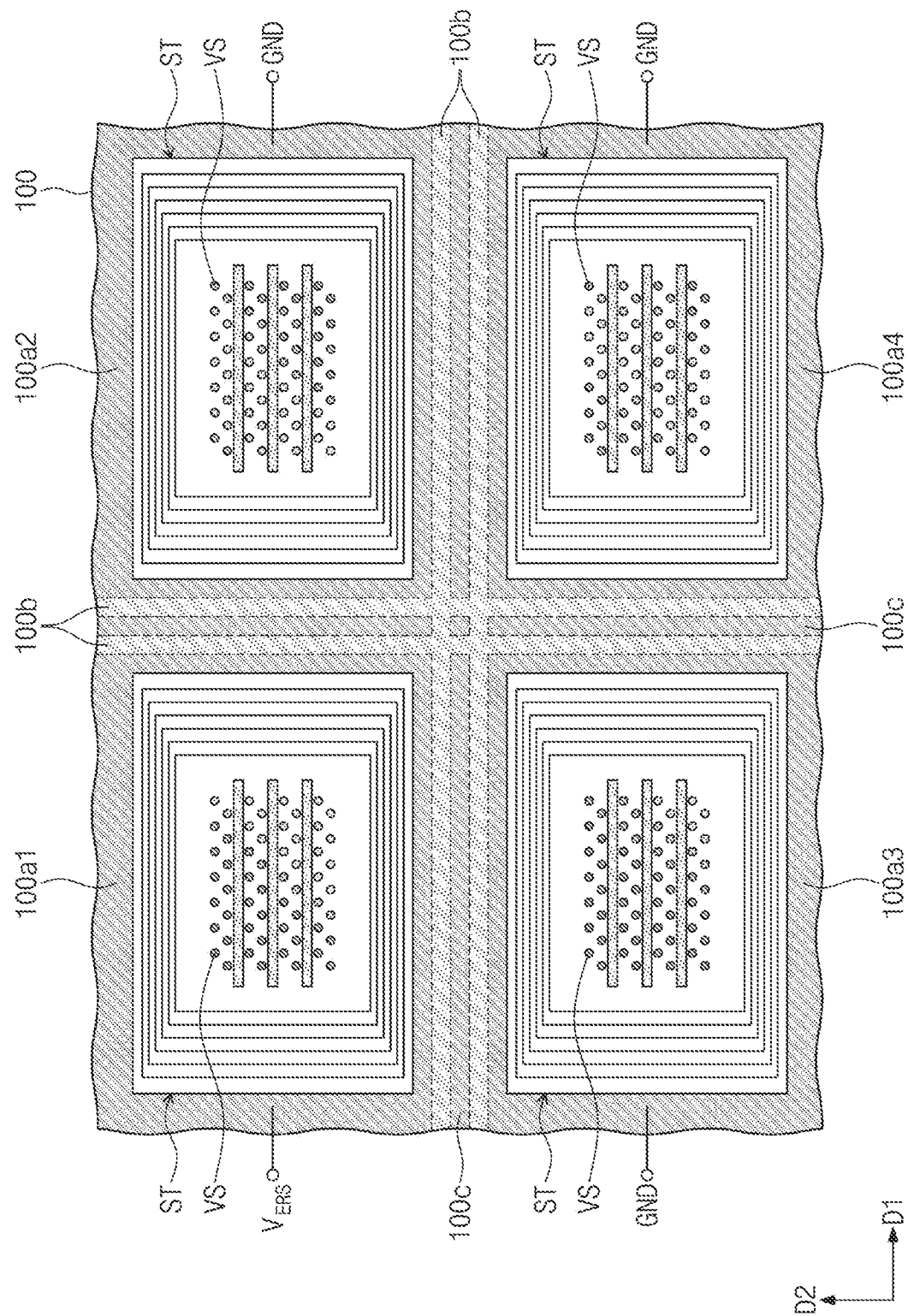
FIG. 18 illustrates a plan view showing an erase operation of a three-dimensional semiconductor device, according to exemplary embodiments.

FIG. 18 illustrates a plan view showing an erase operation of a three-dimensional semiconductor device according to exemplary embodiments. FIGS. 19A to 19D illustrate plan views showing an erase operation of a three-dimensional semiconductor device according to exemplary embodiments. In the embodiments that follow, a three-dimensional semiconductor device may be the three-dimensional NAND Flash memory device discussed with reference to FIG. 3. The description of technical features the same as those in the three-dimensional semiconductor devices discussed with reference to FIGS. 5, 6A, 6B, and 8A to 8D may be omitted in the interest of brevity of explanation.

Referring to FIGS. 18 and 19A to 19D, in an erase operation of a three-dimensional NAND Flash memory device, an erase voltage $V_{ERS}$ may be applied to a selected one of the first to fourth well regions 100a1 to 100a4, and thus the erase operation may be independently performed on each of the first to fourth well regions 100a1 to 100a4.

When the erase operation of a three-dimensional NAND Flash memory device is performed on each of the first to fourth well regions 100a1 to 100a4, a voltage difference may be provided between the vertical structure VS consisting of a semiconductor material and the electrodes EL constituting the stack structure ST, and thereby charges stored in the charge storage layer may be injected into the vertical structure VS.

In the erase operation of a three-dimensional NAND Flash memory device, the erase voltage $V_{ERS}$ (e.g., about 10 V to about 20 V) may be applied from the peripheral logic circuit PTR to the horizontal semiconductor layer 100. In some embodiments, the erase operation of a three-dimensional semiconductor device may be independently performed on each of the first to fourth well regions 100a1 to 100a4. For example, the erase voltage $V_{ERS}$ may be applied to a selected one of the first to fourth well regions 100a1 to 100a4, and a ground voltage GND may be applied to unselected ones of the first to fourth well regions 100a1 to 100a4. For example, the erase voltage $V_{ERS}$ may be applied to the first well region 100a1, and the ground voltage GND may be applied to remaining second to fourth well regions 100a2 to 100a4.

When the erase operation is performed on the selected first well region 100a1, the ground voltage GND (or 0 V) may be applied to the electrodes EL serving as word lines of the stack structure ST, and an electrical floating state may be provided to the bottommost electrode EL serving as a ground select line, the topmost electrode EL serving as a string select line, the bit line BL, and the common source line (see CSL of FIG. 3).

In some embodiments, when the erase operation is independently performed on each of the first to fourth well regions 100a1 to 100a4, at least one PN junction may be produced between the selected first well region 100a1 and the unselected second to fourth well regions 100a2 to 100a4, such that a reverse bias may be applied to the at least one PN junction produced between the first to fourth well regions 100a1 to 100a4. Accordingly, the selected first well region 100a1 may be electrically separated from the unselected second to fourth well regions 100a2 to 100a4.

Figure 19A:
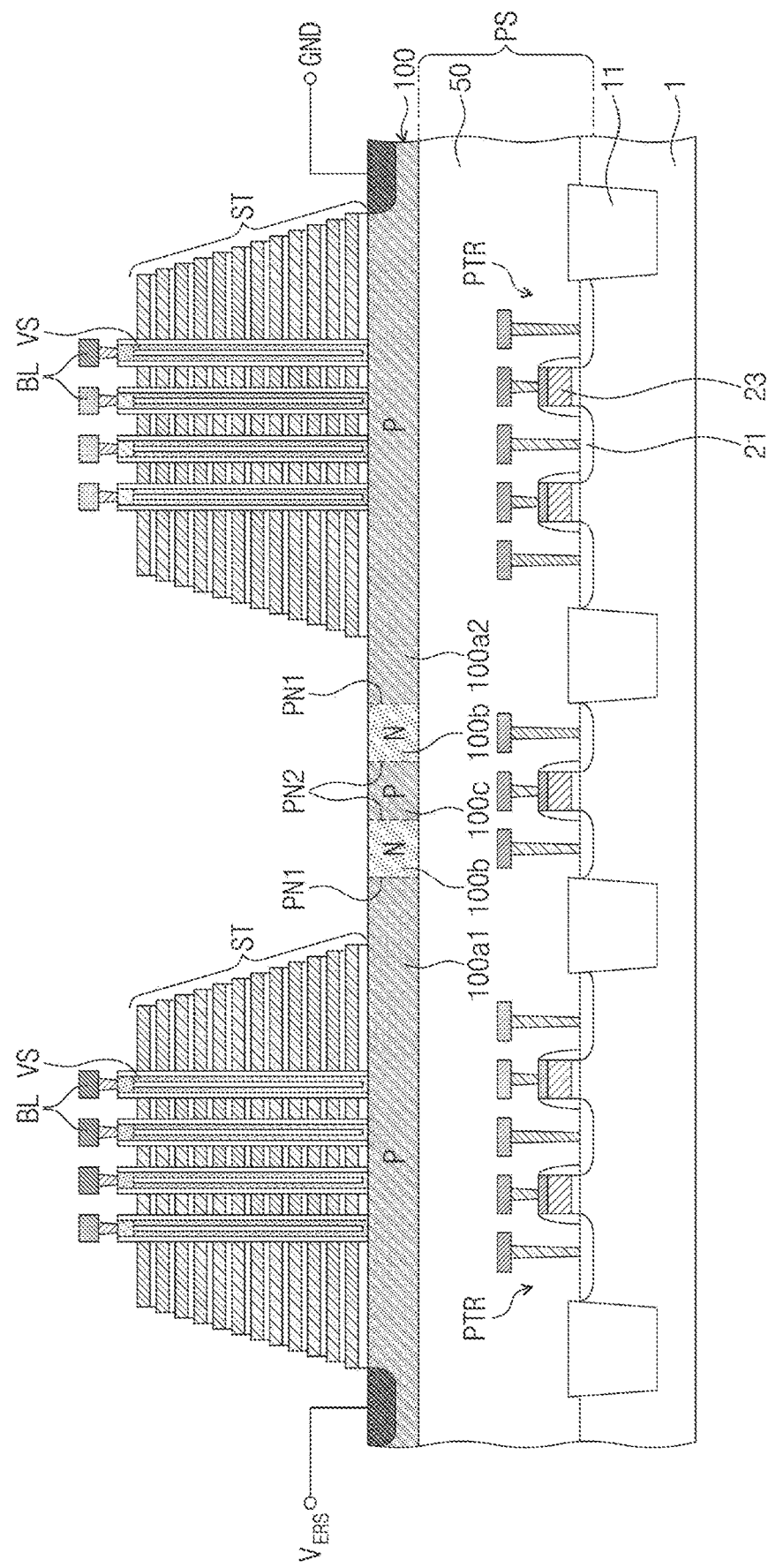
FIGS. 19A to 19D illustrate plan views showing an erase operation of a three-dimensional semiconductor device, according to exemplary embodiments.
Figure 19B:
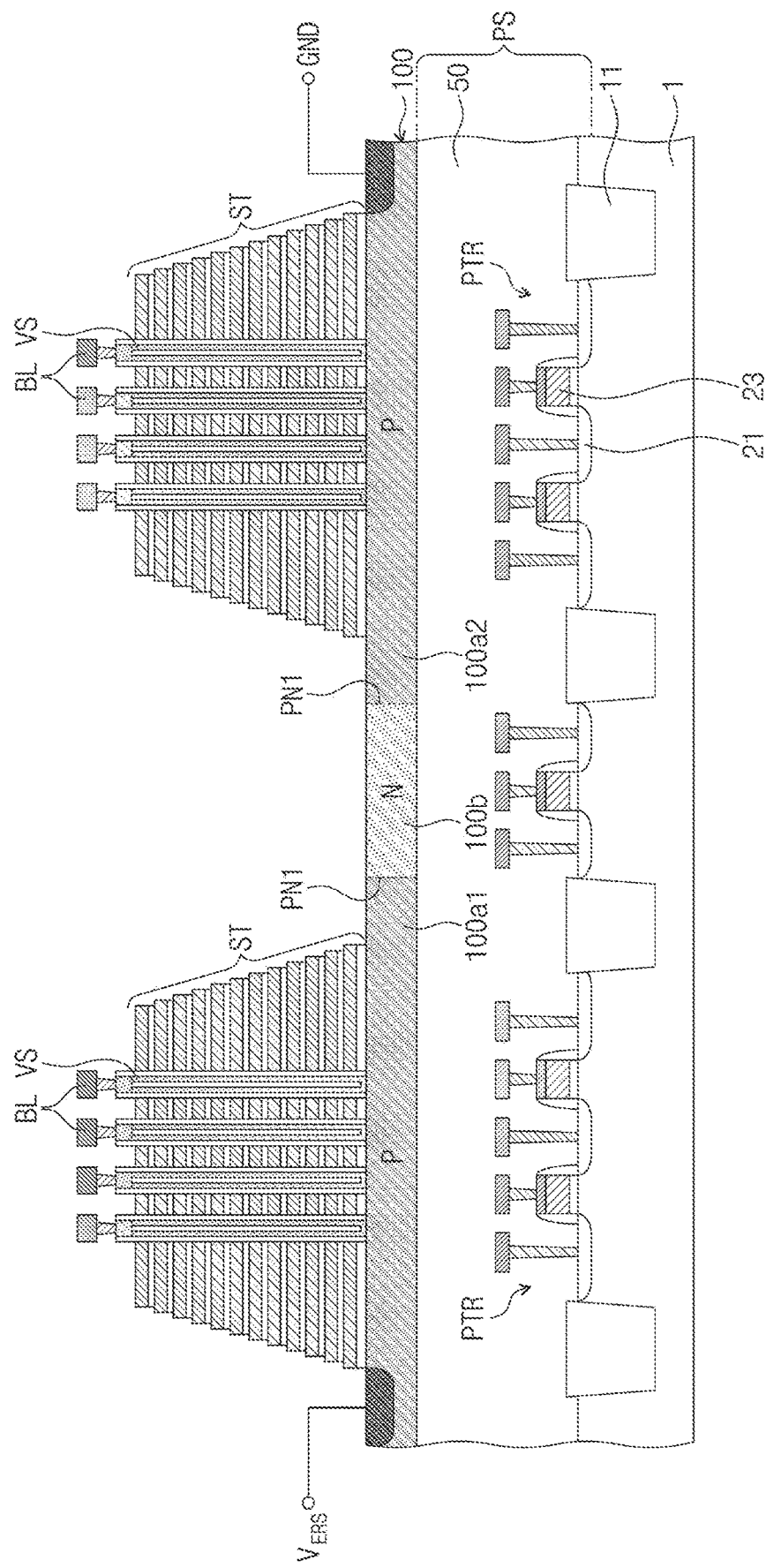

In detail, according to the embodiments illustrated in FIGS. 19A and 19B, the first to fourth well regions 100a1 to 100a4 may be doped with p-type impurities, and the separation impurity regions 100b may be doped with n-type impurities.

In the erase operation of a three-dimensional semiconductor device illustrated in FIG. 19A, a forward bias may be applied to a first PN junction PN1 between the selected first well region 100a1 and the separation impurity region 100b, and a reverse bias may be applied to a second PN junction PN2 between the separation impurity region 100b and the dummy impurity region 100c. In addition, a reverse bias may be applied to first PN junctions PN1 between the unselected second to fourth well regions 100a2 to 100a4 and the separation impurity region 100b in contact therewith. Accordingly, the single horizontal semiconductor layer 100 may be in a state that the selected first well region 100a1 is electrically separated from the unselected second to fourth well regions 100a2 to 100a4.

In the erase operation of a three-dimensional semiconductor device illustrated in FIG. 19B, a forward bias may be applied to a first PN junction PN1 between the selected first well region 100a1 and the separation impurity region 100b in contact therewith. A reverse bias may be applied to first PN junctions PN1 between the unselected second to fourth well regions 100a2 to 100a4 and the separation impurity region 100b in contact therewith. Accordingly, the selected first well region 100a1 may be electrically separated from the unselected second to fourth well regions 100a2 to 100a4.

In addition, according to the embodiments illustrated in FIGS. 19A and 19B, under the same erase voltage condition discussed above, the erase voltage $V_{ERS}$ may be transmitted to the vertical structures VS disposed on the selected first well region 100a1. Therefore, since a great difference in voltage is provided between the vertical structure VS and the word lines, the Fowler-Nordheim tunneling phenomenon may take place such that charges stored in the charge storage layer may be injected into the vertical structure VS.

Figure 19C:
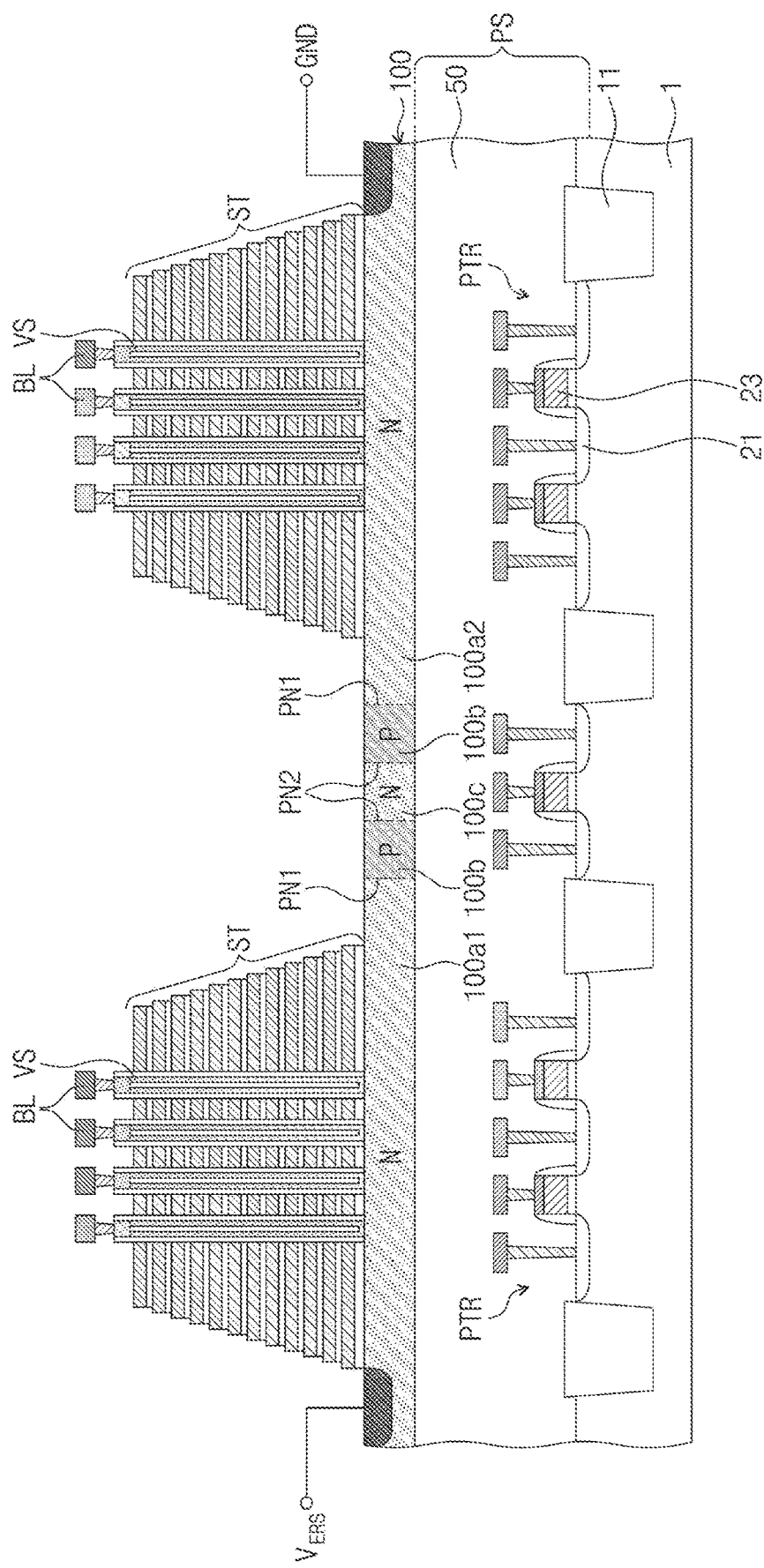
Figure 19D:
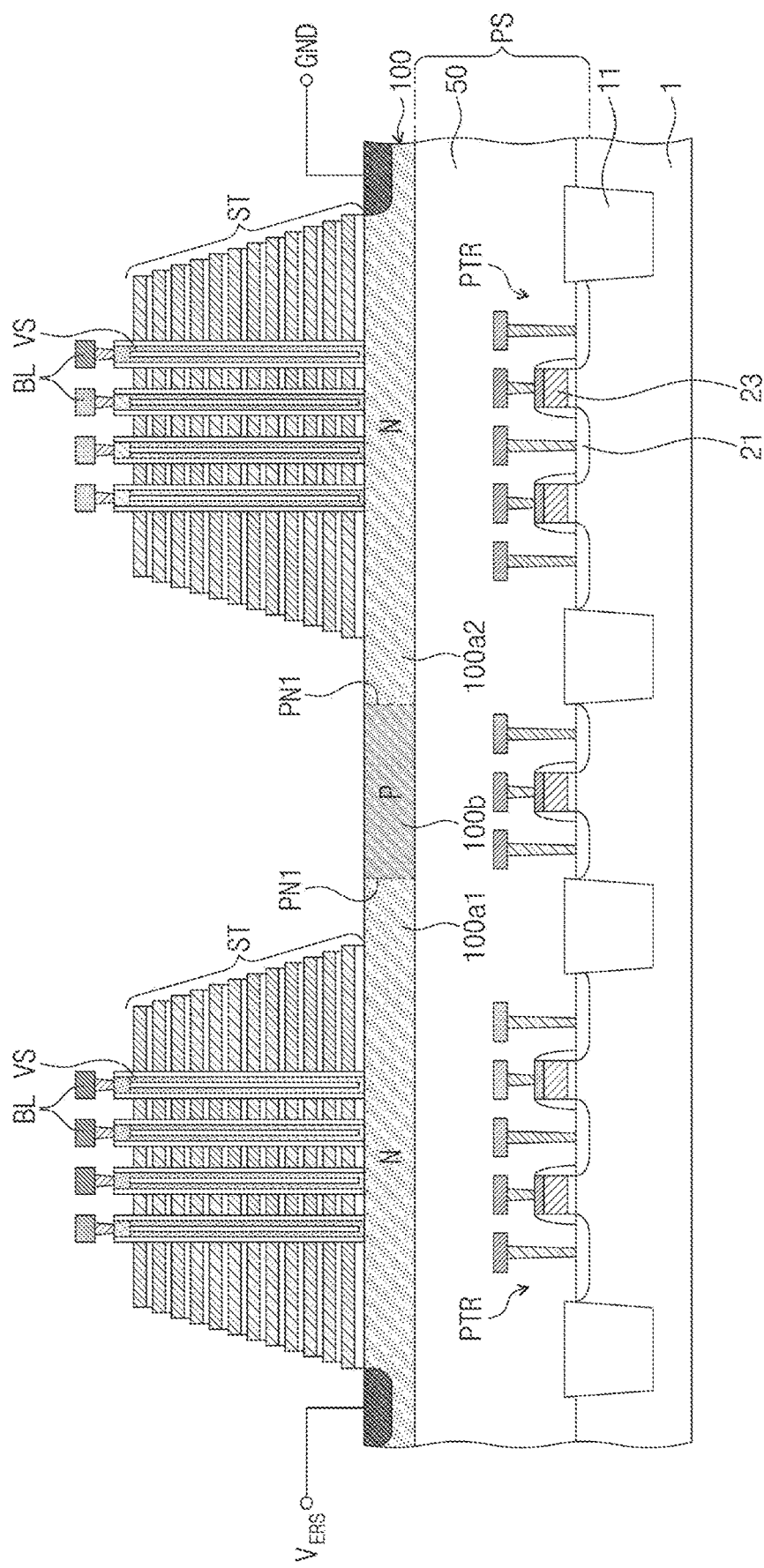

According to the embodiments illustrated in FIGS. 19C and 19D, the first to fourth well regions 100a1 to 100a4 may be doped with n-type impurities, and the separation impurity regions 100b may be doped with p-type impurities.

In an erase operation of the three-dimensional semiconductor device illustrated in FIG. 19C, a reverse bias may be applied to a first PN junction PN1 between the selected first well region 100a1 and the separation impurity region 100b in contact therewith. Accordingly, the single horizontal semiconductor layer 100 may be in a state that the selected first well region 100a1 is electrically separated from the unselected second to fourth well regions 100a2 to 100a4.

In the erase operation of a three-dimensional semiconductor device illustrated in FIG. 19D, a reverse bias may be applied to a first PN junction PN1 between the selected first well region 100a1 and the separation impurity region 100b in contact therewith. In addition, a forward bias may be applied to first PN junctions PN1 between the unselected second to fourth well regions 100a2 to 100a4 and the separation impurity region 100b in contact therewith. Since PN junctions, to which a reverse bias is applied, are produced between the selected first well region 100a1 and the unselected second to fourth well regions 100a2 to 100a4, the selected first well region 100a1 may be electrically separated from the unselected second to fourth well regions 100a2 to 100a4.

In addition, according to the embodiments illustrated in FIGS. 19C and 19D, under the same erase voltage condition discussed above, a gate induced drain leakage (GIDL) may be used to erase charges stored in the data storage layer. For example, when the erase voltage $V_{ERS}$ is applied to the selected first well region 100a1, holes may be created by the gate induced drain leakage (GIDL) occurred at the vertical structures VS adjacent to the bottommost electrode EL. The created holes may be injected into the vertical structures VS adjacent to the electrodes EL serving as word lines, and electrons may be injected into the selected first well region 100a1. In this case, charges stored in the charge storage layer may be injected into the vertical structures VS to thereby erase data.

FIGS. 20 to 28 illustrate cross-sectional views showing a method of fabricating a three-dimensional semiconductor device according to exemplary embodiments.

Figure 20:
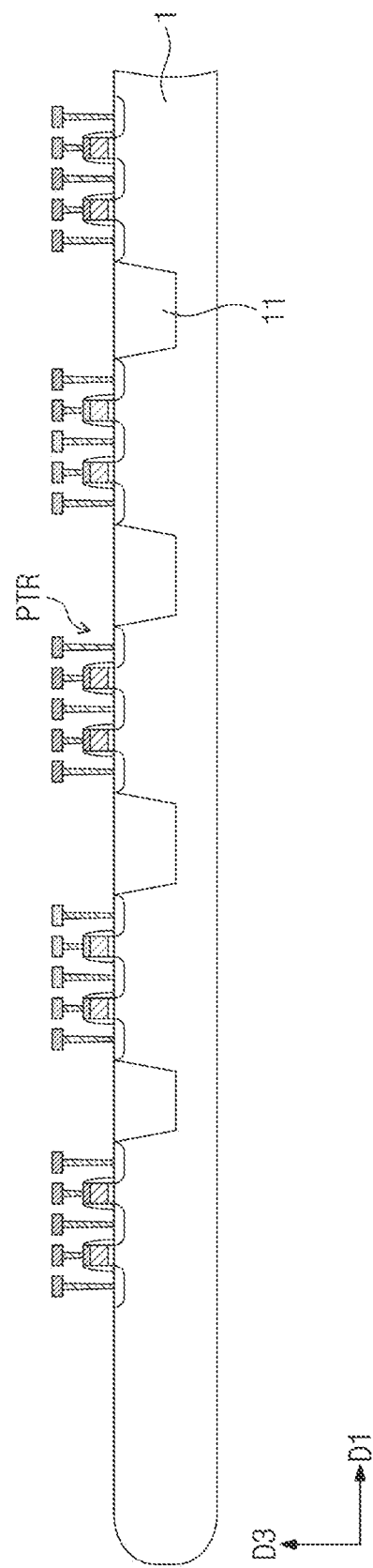
FIGS. 20 to 28 illustrate cross-sectional views showing a method of fabricating a three-dimensional semiconductor device, according to exemplary embodiments.

Referring to FIG. 20, as discussed above with reference to FIG. 1, a semiconductor substrate 1 may be prepared to include chip regions and a scribe line region. For example, the semiconductor substrate 1 may have a first conductivity (e.g., p-type conductivity). A well region (not shown) may be formed in the semiconductor substrate 1. A device isolation layer 11 may be provided in the semiconductor substrate 1 to define active regions.

Peripheral logic circuits PTR may be formed on the semiconductor substrate 1 of each of the chip regions. For example, peripheral logic circuits PTR may be formed in the active regions of the semiconductor substrate 1. Peripheral line structures, i.e., peripheral contact plugs and peripheral circuit lines, connected to the peripheral logic circuits PTR may further be formed on the semiconductor substrate 1 of each of the chip regions. For example, row and column decoders, page buffers, and control circuits may be formed on the semiconductor substrate 1 of each of the chip regions. The peripheral logic circuits PTR may include, for example, high- and low-voltage transistors.

The formation of the peripheral logic circuits PTR may include sequentially forming on the semiconductor substrate 1 a peripheral gate dielectric layer and a peripheral gate electrode 23 and then forming source/drain regions 21 by implanting impurities into the semiconductor substrate 1 on opposite sides of the peripheral gate electrode 23. A peripheral gate spacer may be formed on a sidewall of the peripheral gate electrode 23.

Figure 21:
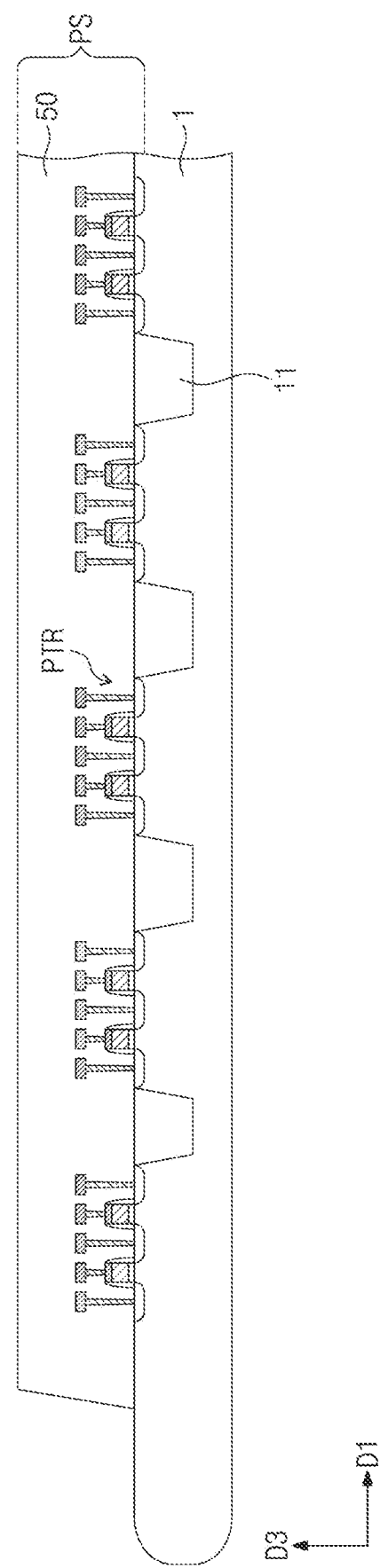

Referring to FIG. 21, after the peripheral logic circuits PTR and the peripheral line structures are formed, a lower buried insulation layer 50 may be formed to cover an entire surface of the semiconductor substrate 1. As such, the semiconductor substrate 1 may be provided thereon with a peripheral logic structure PS. The lower buried insulation layer 50 may have a flat top surface, and may be patterned to expose an edge top surface of the semiconductor substrate 1.

The lower buried insulation layer 50 may include a single insulation layer or a plurality of stacked insulation layers, such as a silicon oxide layer, a silicon nitride layer, a silicon oxynitride layer, and/or a low-k dielectric layer.

Figure 22:
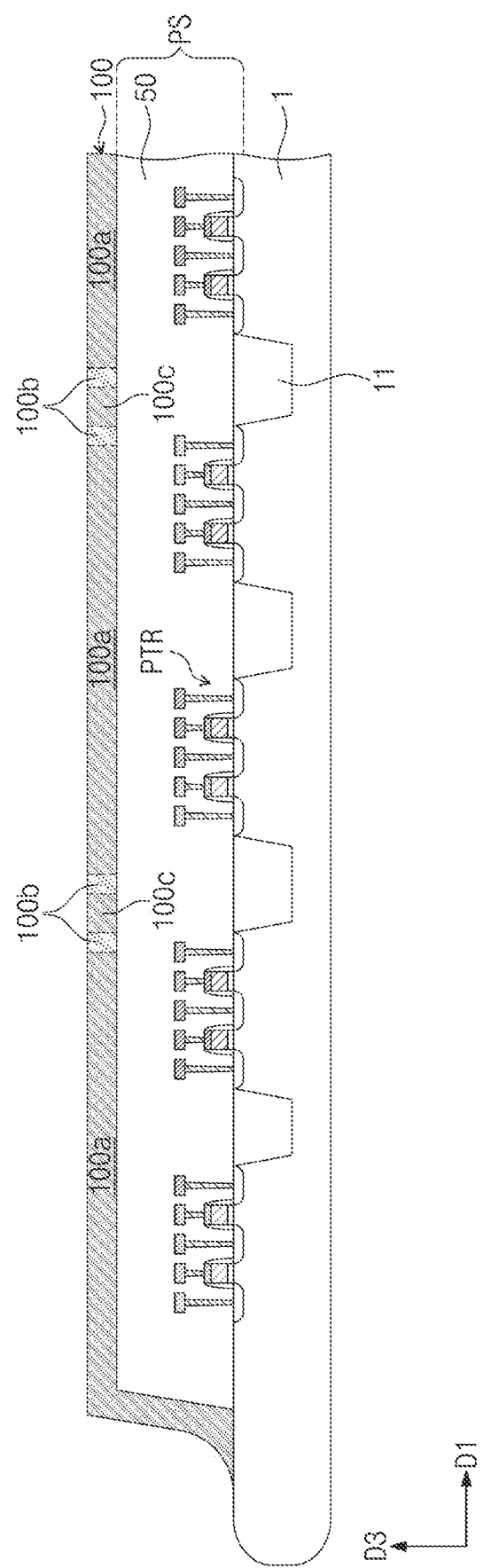

Referring to FIG. 22, a horizontal semiconductor layer 100 may be formed on the lower buried insulation layer 50. For example, the horizontal semiconductor layer 100 may extend along first and second directions D1 and D2. The horizontal semiconductor layer 100 may include a semiconductor material, and may have a single crystalline or polycrystalline structure. For example, a polysilicon layer may be deposited to cover the entire surface of the semiconductor substrate 1, which may form the horizontal semiconductor layer 100. In some embodiments, first conductivity impurities may be doped when the polysilicon layer is deposited. Alternatively, after an undoped polysilicon layer is deposited, first conductivity impurities may be doped into a lower portion of the horizontal semiconductor layer 100 to form the well regions 100a. After the polysilicon layer is deposited, a laser annealing process may be performed to reduce a grain boundary of the polysilicon layer.

In some embodiments, a deposition process may be employed to form the horizontal semiconductor layer 100, such that the horizontal semiconductor layer 100 may cover a top surface and a sidewall of the lower buried insulation layer 50 and the edge top surface of the semiconductor substrate 1. For example, the horizontal semiconductor layer 100 may be in direct contact with an edge of the semiconductor substrate 1.

Separation impurity regions 100b may be formed to define well regions 100a in the horizontal semiconductor layer 100. As discussed above with reference to FIGS. 8A to 8D, the separation impurity regions 100b may extend along the first and second directions D1 and D2, and may be formed between the well regions 100a adjacent to each other. The separation impurity regions 100b may be formed by doping the horizontal semiconductor layer 100 with impurities having opposite conductivity to that of the horizontal semiconductor layer 100, or to those of the well regions 100a. For example, when the horizontal semiconductor layer 100 is doped with first conductivity impurities (e.g., p-type conductivity impurities), the separation impurity regions 100b may be formed by doping second conductivity impurities (e.g., n-type conductivity impurities). The dummy impurity region 100c may be formed of the portions of the horizontal semiconductor layer 100 between pairs of the separation impurity regions 100b, and may be doped with the first conductivity impurities (e.g., p-type conductivity impurities).

After the separation impurity regions 100b are formed, as discussed above with reference to FIGS. 8A to 8D, the horizontal semiconductor layer 100 may be partially etched to form openings (see OP of FIGS. 8A to 8D) that expose the lower buried insulation layer 50. The openings may be formed between the well regions 100a. An insulating material may fill the openings formed in the horizontal semiconductor layer 100.

Figure 23:
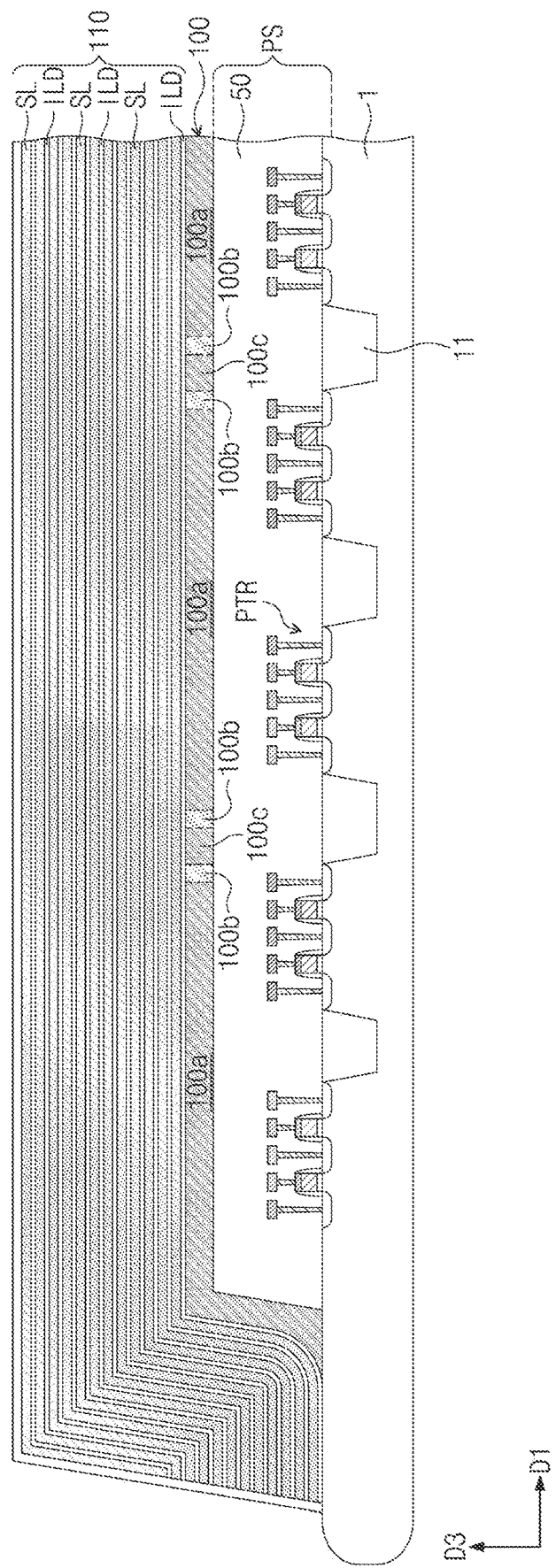

Referring to FIG. 23, a thin-layer structure 110 may be formed to cover an entire surface of the horizontal semiconductor layer 100. The thin-layer structure 110 may include sacrificial layers SL and insulation layers ILD alternately and repeatedly stacked. The sacrificial layers SL of the thin-layer structure 110 may have the same thickness. The sacrificial layers SL and the insulation layers ILD may be formed using a thermal chemical vapor deposition (CVD) process, a plasma enhanced CVD process, or an atomic layer deposition (ALD) process. Any of the deposition processes may be employed to form the thin-layer structure 110 that extends onto a top surface of the semiconductor substrate 1 from a top surface of the horizontal semiconductor layer 100.

The thin-layer structure 110 may be formed in such a way that the sacrificial layers SL are formed of a material that can be etched with an etch selectivity to the insulation layers ILD. For example, the sacrificial layers SL and the insulation layers ILD may exhibit a high etch selectivity to a chemical solution for wet etching and a low etch selectivity to an etching gas for dry etching. For example, the sacrificial layers SL and the insulation layers ILD may be formed of insulating materials exhibiting different etch selectivities from each other. For example, the sacrificial layers SL may be formed of a silicon nitride layer, and the insulation layers ILD may be formed of a silicon oxide layer.

Figure 24:
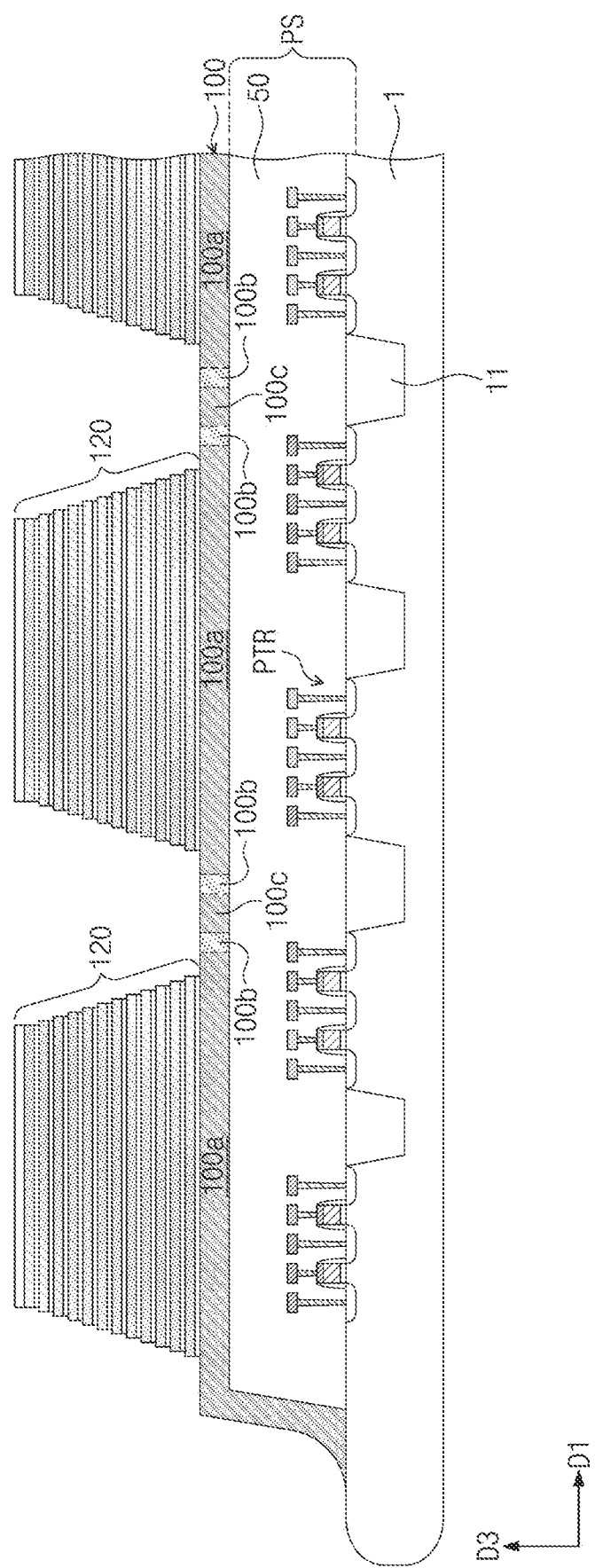

Referring to FIG. 24, the thin-layer structure 110 may experience a patterning process to form mold structures 120 on corresponding well regions 100a of the horizontal semiconductor layer 100. The mold structures 120 may be formed by performing a trimming process on the thin-layer structure 110. The trimming process may include forming a mask pattern (not shown) on the thin-layer structure 110, partially etching the thin-layer structure 110, reducing a horizontal area of the mask pattern, and alternately and repeatedly performing the etching and reducing steps. The trimming process may cause the mold structures 120 to have stepwise structures on corresponding edges of the well regions 100a. A portion of an outermost mold structure 120 may extend onto a sidewall of the peripheral logic structure PS from the edge of the semiconductor substrate 1, such that the portion of the outermost mold structure 120 may be in direct contact with the edge of the semiconductor substrate 1 (see FIG. 26).

Figure 25:
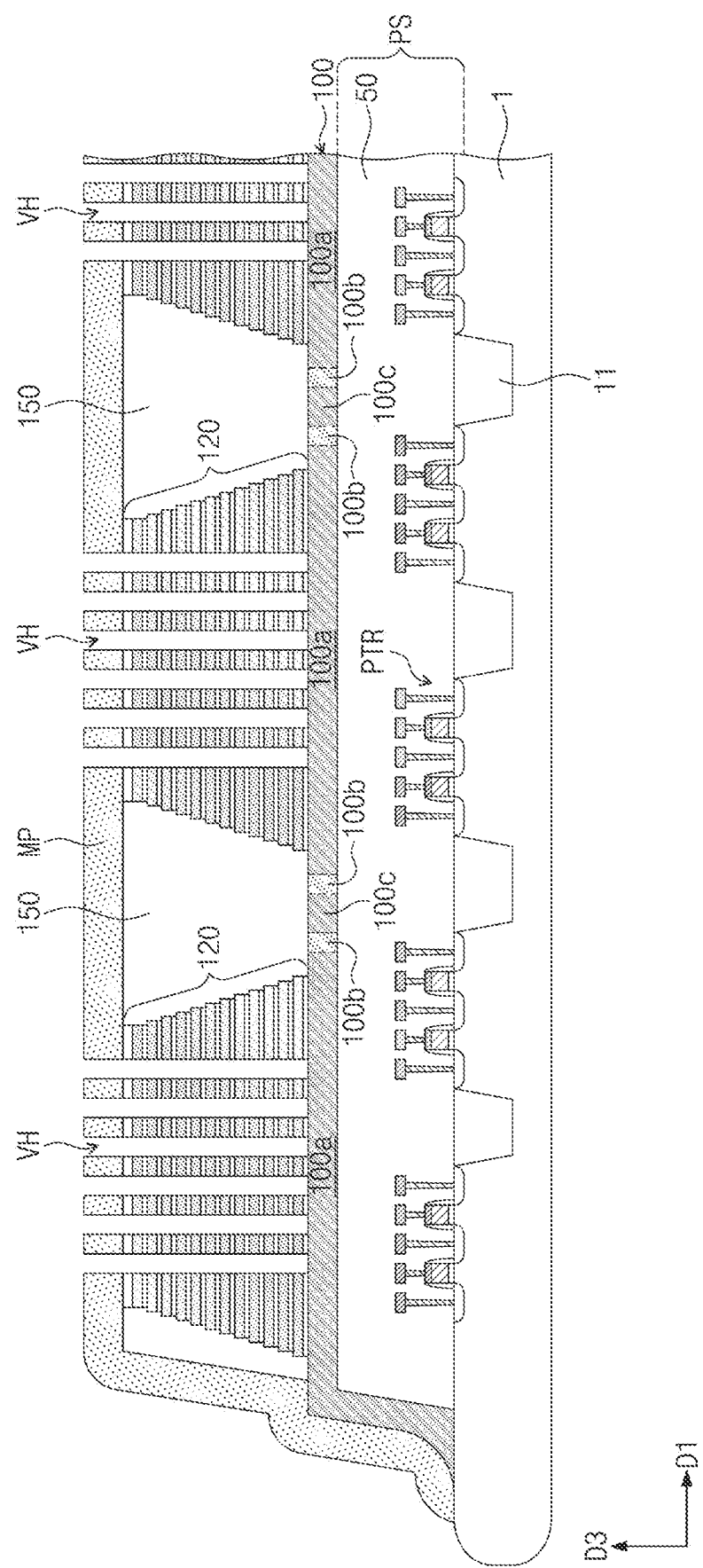
Figure 26:
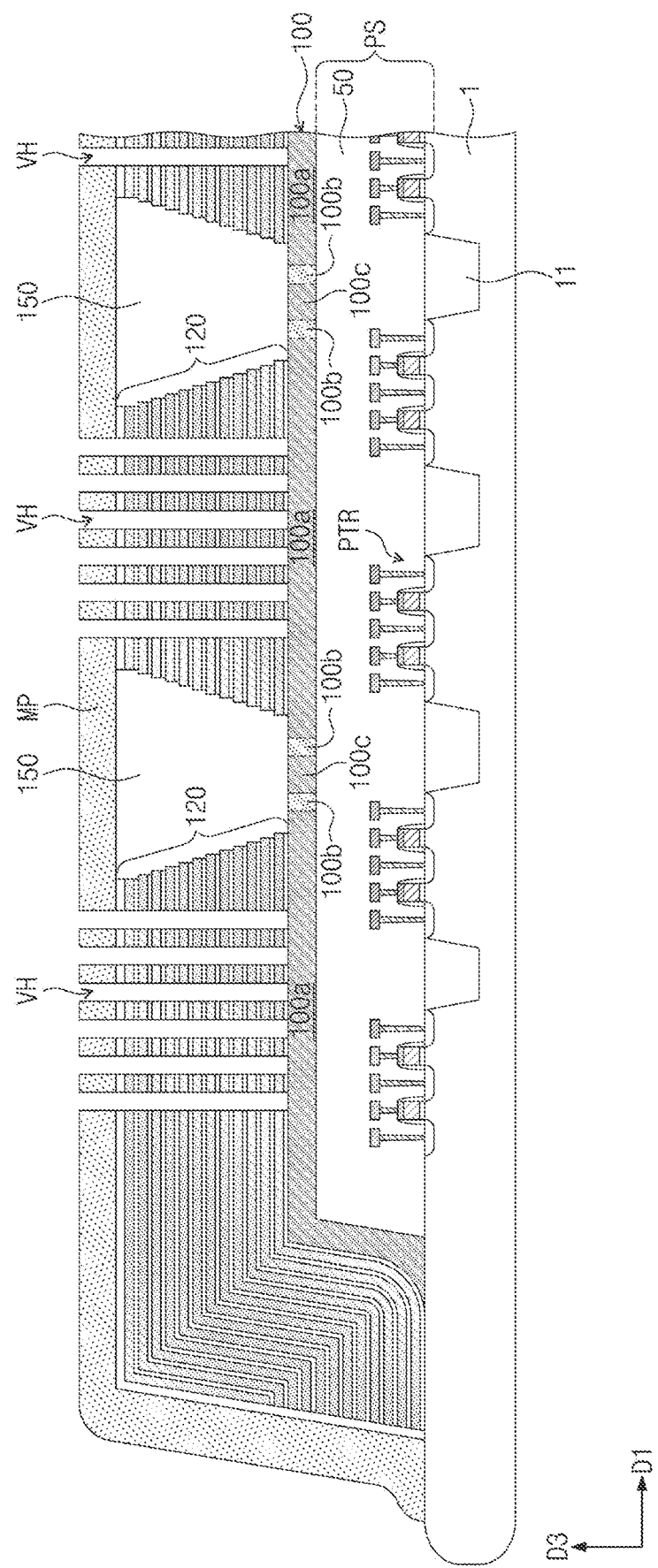

Referring to FIGS. 25 and 26, an upper buried insulation layer 150 may be formed on the horizontal semiconductor layer 100 on which the mold structures 120 are formed. The upper buried insulation layer 150 may be formed by depositing a thick insulation layer to cover the mold structures 120 and then performing a planarization process on the insulation layer. The upper buried insulation layer 150 may be formed of an insulating material exhibiting an etch selectivity to the sacrificial layers SL.

After the upper buried insulation layer 150 is formed, a hardmask layer MP may be formed to have openings that expose portions of each mold structure 120. The hardmask layer MP may include a silicon-containing material such as silicon oxide, silicon nitride, silicon oxynitride, or polysilicon; a carbon-containing material such as an amorphous carbon layer (ACL) or a spin-on-hardmask (SOH) layer; a metal-containing material such as tungsten; or an organic material.

In the embodiment illustrated in FIG. 25, the hardmask layer MP may be formed to cover the entire surface of the semiconductor substrate 1, and may have a portion, on the edge of the semiconductor substrate 1, in direct contact with the horizontal semiconductor layer 100 and the edge top surface of the semiconductor substrate 1.

In another embodiment illustrated in FIG. 26, when the portion of the outermost mold structure 120 extends onto the sidewall of the peripheral logic structure PS, the hardmask layer MP may be spaced apart from the horizontal semiconductor layer 100. For example, the hardmask layer MP may be separated from the semiconductor layer 100 by the mold structure 120.

Successively, the mold structures 120 may be anisotropically etched on their portions exposed to the openings of the hardmask layer MP to thereby form vertical holes VH in each mold structure 120 that expose a top surface of the well region 100a of the horizontal semiconductor layer 100. When viewed in a plan view, the vertical holes VH may be arranged along one direction or in a zigzag fashion. The anisotropic etching process on the mold structures 120 may be a plasma etching process, a reactive ion etching (RIE) process, a high-frequency inductively coupled plasma reactive ion etching (ICP-RIE) process, or an ion beam etching (IBE) process.

In some embodiments, when the anisotropic etching process is performed using plasma, ions included in plasma and/or positive charges induced from radicals may be charged or accumulated on a surface of the horizontal semiconductor layer 100 exposed to the vertical holes VH. Accordingly, the well regions 100a of the horizontal semiconductor layer 100 may have an increased potential.

In some embodiments, the semiconductor substrate 1 may be placed on a supporter (not shown) of semiconductor fabrication equipment when a three-dimensional semiconductor device is manufactured, and may be supplied with a ground voltage from the supporter when the anisotropic etching process is performed to form the vertical holes VH. According to exemplary embodiments, since the horizontal semiconductor layer 100 is a single continuous layer and in contact with the edge top surface of the semiconductor substrate 1, the accumulated positive charges may be discharged from the horizontal semiconductor layer 100 through the semiconductor substrate 1 when the vertical holes VH are formed. For example, when the anisotropic etching process is performed, the well regions 100a may have an increased potential due to the positive charges accumulated on the surface of the horizontal semiconductor layer 100, such that a reverse bias may be applied to PN junctions between the first to fourth well regions 100a1 to 100a4. In this case, a reverse leakage current of the PN junction may inject the accumulated positive charges from the horizontal semiconductor layer 100 into the semiconductor substrate 1. As such, since a ground voltage can be applied to the horizontal semiconductor layer 100 consisting of a single layer on the entire surface of the semiconductor substrate 1 when the vertical holes VH are formed, the horizontal semiconductor layer 100 may be prevented from arcing resulting from the positive charges accumulated in the horizontal semiconductor layer 100.

As illustrated in FIG. 25, the horizontal semiconductor layer 100 may be in direct contact with the hardmask layer MP on the edge of the semiconductor substrate 1. When the hardmask layer MP includes an amorphous carbon layer (ACL), negative charges may be charged or accumulated in the amorphous carbon layer during the anisotropic etching process using plasma. In this case, when the hardmask layer MP is in contact with the horizontal semiconductor layer 100, the negative charges of the hardmask layer MP may counterbalance the positive charges accumulated in the horizontal semiconductor layer 100.

Figure 27:
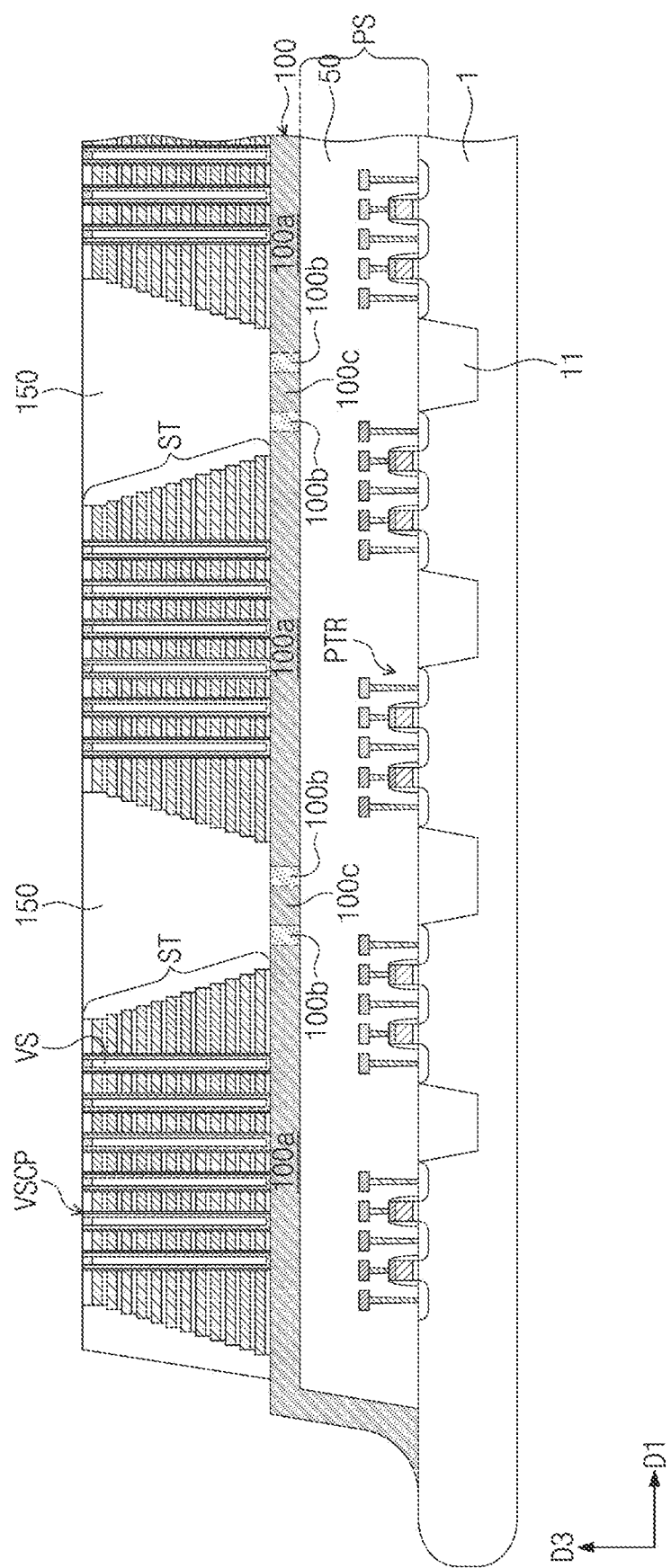

Referring to FIG. 27, vertical structures VS may be formed in the vertical holes VH. The vertical structures VS may, as discussed above, include a semiconductor material or a conductive material.

The formation of the vertical structures VS may include forming a semiconductor spacer to expose the horizontal semiconductor layer 100 and to cover sidewalls of the vertical holes VH and forming a semiconductor body connected to the horizontal semiconductor layer 100. The vertical structures VS may include silicon (Si), germanium (Ge), or a mixture thereof, and may be an impurity-doped semiconductor or an undoped intrinsic semiconductor. The vertical structures VS may be connected to the well regions 100a of the horizontal semiconductor layer 100. The vertical structure VS may have a conductive pad VSCP at or on its upper end. The conductive pad VSCP may be an impurity-doped region or may consist of a conductive material.

Before the vertical structures VS are formed in the vertical holes VH, as discussed with reference to FIGS. 7A and 7B, a vertical insulation pattern VP may be formed in the vertical hole VH. The vertical insulation pattern VP may consist of a single thin layer or a plurality of thin layers. In some embodiments, the vertical insulation pattern VP may be a portion of a data storage layer.

In other embodiments, as illustrated in FIGS. 6B and 7B, the formation of the vertical structures VS may include forming a lower semiconductor pattern LSP to fill a lower portion of the vertical hole VH, forming the vertical insulation pattern VP in the vertical hole VH provided with the lower semiconductor pattern LSP, and forming an upper semiconductor pattern USP connected to the lower semiconductor pattern LSP, in the vertical hole VH provided with the vertical insulation pattern VP.

After the vertical structures VS are formed, conductive layers may replace the sacrificial layers (see SL of FIG. 23) of the mold structures (see 120 of FIG. 24) such that stack structures ST may be formed to include electrodes (see EL of FIG. 6A) vertically stacked on the horizontal semiconductor layer 100.

In more detail, after the vertical structures VS are formed, the mold structures 120 may be patterned to form trenches that have linear shapes spaced apart from the vertical structures VS. The trenches may expose sidewalls of the insulation layers ILD and of the sacrificial layers SL included in the mold structures 120.

The sacrificial layers SL exposed to the trenches may be removed to form gate spaces between the insulation layers ILD. The gate spaces may be formed by isotropically etching the sacrificial layers SL using an etch recipe that has an etch selectivity to the insulation layers ILD, the vertical structures VS, and the horizontal semiconductor layer 100. For example, when the sacrificial layers SL are silicon nitride layers and the insulation layers ILD are silicon oxide layers, the isotropic etching process may be performed using an etchant inclusive of phosphoric acid.

The electrodes EL may be formed in the gate spaces. The electrodes EL may partially or completely fill the gate spaces. Each of the electrodes EL may include a barrier metal layer and a metal layer that are sequentially deposited. The barrier metal layer may include a metal nitride layer such as TiN, TaN, or WN. The metal layer may include a metallic material such as W, Al, Ti, Ta, Co, or Cu.

Before the electrodes EL are formed, as discussed with reference to FIGS. 7A and 7B, a horizontal insulation pattern HP may be formed to conformally cover inner sidewalls of the gate spaces. The horizontal insulation pattern HP may be a portion of a data storage layer in a NAND Flash memory transistor.

When the electrodes EL are formed, the stack structure ST may be formed on each of the well regions 100a of the horizontal semiconductor layer 100 and may have a stepwise structure on an edge of each well region 100a.

As discussed with reference to FIGS. 5, 6A, and 6B, common source regions CSR may be formed in the semiconductor substrate 1 exposed to the trenches. The common source regions CSR may include, for example, n-type impurities (e.g., arsenic (As) or phosphorous (P)). Common source plugs CSP may be formed to be coupled to the common source regions CSR.

Figure 28:
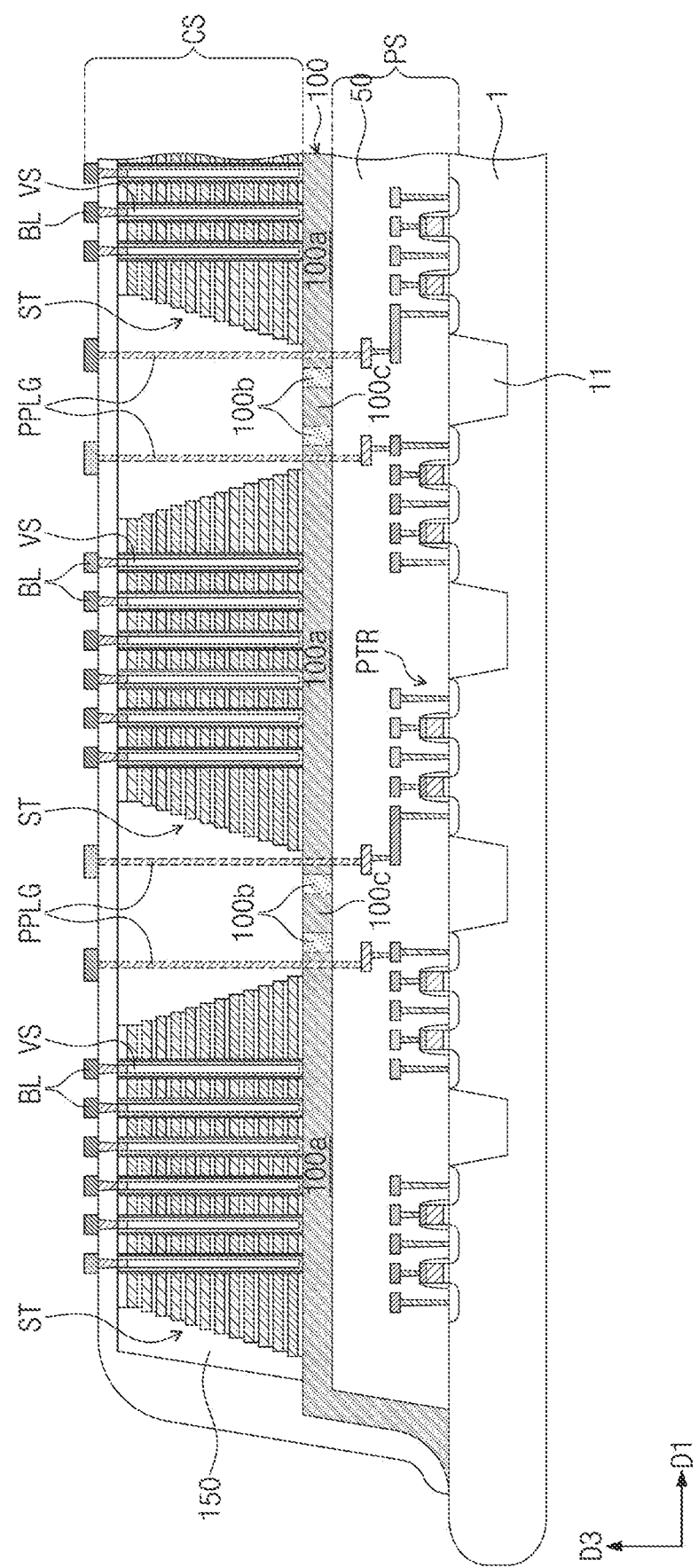

Referring to FIG. 28, an interlayer dielectric layer (not designated by a reference numeral) may be formed to cover the stack structures ST and the upper buried insulation layer 150, and then cell contact plugs CPLG, well contact plugs (not shown), and connection contact plugs PPLG may be formed to penetrate the interlayer dielectric layer and the upper buried insulation layer 150. In some embodiments, the contact plugs CPLG may each be a single homogeneous unit extending from the top surface of the upper buried insulating layer 150 to the top surface of the electrode EL to which the contact plug CPLG is connected. Therefore, the peripheral logic structure PS may be provided thereon with a cell array structure CS. The connection contact plugs PPLG connected to the peripheral logic structure PS may be formed, as discussed with reference to FIGS. 8A to 8D, in the openings (see OP of FIGS. 8A to 8D) of the horizontal semiconductor layer 100.

A cutting or sawing machine may be used to cut the semiconductor substrate 1 along a scribe line region, and thus three-dimensional semiconductor devices formed on the semiconductor substrate 1 may be divided into a plurality of semiconductor chips.

According to exemplary embodiments, a plurality of cell array structures may be formed on a single horizontal semiconductor layer. As a result, the horizontal semiconductor layer may be prevented from arcing resulting from positive charges that are charged or accumulated in the horizontal semiconductor layer when an etching process is performed to form three-dimensional semiconductor devices.

Moreover, a second-conductivity separation layer may electrically separate first-conductivity well regions from each other on the single semiconductor layer. Consequently, the well regions may independently experience an erase operation of a three-dimensional semiconductor device including NAND Flash memory.

Although the present invention has been described in connection with the exemplary embodiments illustrated in the accompanying drawings, it will be understood to those skilled in the art that various changes and modifications may be made without departing from the technical spirit and essential feature of the disclosed concepts. It will be apparent to those skilled in the art that various substitution, modifications, and changes may be thereto without departing from the scope and spirit of the disclosed concepts.

What is claimed is:

1. A three-dimensional semiconductor device, comprising:
   a semiconductor substrate;
   a lower insulation layer covering a top surface of the semiconductor substrate;
   a semiconductor layer contacting a top surface of the lower insulation layer, the semiconductor layer including first, second, third, and fourth well regions doped with first conductivity impurities, the first and second well regions that are adjacent to each other in a first direction, the first and third well regions that are adjacent to each other in a second direction crossing the first direction, and the second and fourth well regions that are adjacent to each other in the second direction; and
   first, second, third, and fourth cell array structures disposed on the first, second, third, and fourth well regions of the semiconductor layer, respectively,
   wherein the first and the second directions are parallel to the top surface of the semiconductor substrate,
   wherein each of the first, second, third, and fourth cell array structures comprise:
      a stack structure including a plurality of stacked electrodes stacked in a vertical direction on a top surface of the semiconductor layer; and
      a plurality of vertical structures penetrating the stack structure and connected to a corresponding well region of the first, second, third, and fourth well regions,
   wherein the semiconductor layer further includes a separation impurity region between and in contact with the first, second, third, and fourth well regions, the separation impurity region comprising a pair of impurity regions doped with second conductivity impurities different from the first conductivity impurities,
   wherein the semiconductor layer further includes a dummy impurity region between the pair of impurity regions and doped with first conductivity impurities,
   wherein the pair of impurity regions doped with the second conductivity impurities comprise:
      a first region continuously extending along the second direction between the first and second well regions and between the third and fourth well regions; and
      a second region continuously extending along the first direction between the first and third well regions and between the second and fourth well regions,
   wherein entire bottom surfaces of the pair of impurity regions are at the same level as entire bottom surfaces of the first, second, third, and fourth well regions,
   wherein the pair of impurity regions and the dummy impurity region have the same doped depth in the vertical direction, and
   wherein the semiconductor layer includes a plurality of PN junctions formed by the dummy impurity region and the pair of impurity regions.

2. The three-dimensional semiconductor device of claim 1, wherein the semiconductor layer consists of a single layer that extends in the first and second directions.

3. The three-dimensional semiconductor device of claim 1, wherein the semiconductor layer includes a plurality of PN junctions formed between the first, second, third, and fourth well regions and the separation impurity region.

4. The three-dimensional semiconductor device of claim 1, wherein the separation impurity region has a width less than a width of one of the first, second, third, and fourth well regions, in the first direction.

5. The three-dimensional semiconductor device of claim 1, wherein the semiconductor layer has an opening that penetrates a portion of the separation impurity region.

6. The three-dimensional semiconductor device of claim 1, wherein the separation impurity region has substantially the same depth as those of the first, second, third, and fourth well regions.

7. A three-dimensional semiconductor device, comprising:
   a semiconductor substrate;
   a lower insulation layer covering a top surface of the semiconductor substrate;
   a semiconductor layer contacting a top surface of the lower insulation layer, the semiconductor layer including first and second well regions, first and second separation impurity regions spaced apart from each other and disposed between the first and second well regions and a dummy impurity region disposed between the first and second separation impurity regions, the first and second well regions doped with first conductivity impurities and the first and second separation impurity regions doped with second conductivity impurities, and the dummy impurity region doped with first conductivity impurities different from the second conductivity impurities; and
   first and second cell array structures disposed on the first and second well regions of the semiconductor layer, respectively,
   wherein each of the first and second cell array structures comprises a stack structure including a plurality of electrodes stacked in a vertical direction on a top surface of the semiconductor layer,
   wherein each of the first and second separation impurity regions includes a first portion extending along a first direction and a second portion extending along a second direction between the first and second well regions and intersecting the first portion,
   wherein the semiconductor layer consists of a single layer that extends in the first and second directions,
   wherein the semiconductor layer includes at least two PN junctions formed by the dummy impurity region and the first and second separation impurity regions, and
   wherein portions of the first and second separation impurity regions doped with the second conductivity impurities contact the first and second well regions,
   wherein the semiconductor layer has a first thickness in the vertical direction,
   wherein each of the first and second separation impurity regions has a first depth in the vertical direction, the first depth being the same as the first thickness,
   wherein the dummy impurity region has a second depth in the vertical direction, the second depth being the same as the first thickness,
   wherein the first and the second directions are parallel to a top surface of the semiconductor substrate, and
   wherein a first side surface of the dummy impurity region contacts a side surface of the first separation impurity region and a second side surface of the dummy impurity region contacts a side surface of the second separation impurity region.

8. The three-dimensional semiconductor device of claim 7, wherein each of the first and second separation impurity regions has a width less than a width of one of the first and second well regions, in the first direction.

9. The three-dimensional semiconductor device of claim 7, further comprising:
a peripheral logic structure including a semiconductor substrate, peripheral logic circuits on the semiconductor substrate, and a lower buried insulation layer covering the peripheral logic circuits,
wherein the semiconductor layer is disposed on a top surface of the lower buried insulation layer.

10. The three-dimensional semiconductor device of claim 9, further comprising:
an upper buried insulation layer on the semiconductor layer and covering the stack structure,
wherein the semiconductor layer comprises an opening between the first and second well regions adjacent to each other in one direction and exposing the lower buried insulation layer, the opening of the semiconductor layer being filled with the upper buried insulation layer.

11. The three-dimensional semiconductor device of claim 7, wherein each of the first and second well regions has a third depth in the vertical direction, the third depth being the same as the first thickness.

12. A three-dimensional semiconductor device, comprising:
a peripheral logic structure including a peripheral logic circuit integrated on a semiconductor substrate;
a semiconductor layer on the peripheral logic structure and including first and second well regions and a separation impurity region between the first and second well regions, the first and second well regions doped with first conductivity impurities and the separation impurity region doped with second conductivity impurities different from the first conductivity impurities; and
a cell array structure provided on each of the first and second well regions of the semiconductor layer,
wherein the cell array structure comprises:
a stack structure including a plurality of stacked electrodes stacked in a vertical direction on a top surface of the semiconductor layer; and
a plurality of vertical structures penetrating the stack structure and connected to one of the first and second well regions,
wherein the separation impurity region surrounds each of the first and second well regions, when viewed in a plan view,
wherein the semiconductor layer consists of a single layer,
wherein the separation impurity region comprises a pair of impurity regions doped with the second conductivity impurities,
wherein side surfaces of the separation impurity region contact side surfaces of the first and second well regions,
wherein top and bottom surfaces of the separation impurity region are coplanar with respective top and bottom surfaces of the semiconductor layer,
wherein top and bottom surfaces of the first and second well regions are coplanar with the respective top and bottom surfaces of the semiconductor layer, and
wherein the separation impurity region vertically overlaps a portion of the peripheral logic circuit.

13. The three-dimensional semiconductor device of claim 12,
wherein the peripheral logic structure further includes a lower buried insulation layer covering the peripheral logic circuit, and
wherein the semiconductor layer comprises an opening between the first and second well regions adjacent to each other in one direction and exposing the lower buried insulation layer.

14. The three-dimensional semiconductor device of claim 12,
wherein the peripheral logic structure further includes a lower buried insulation layer covering the peripheral logic circuit, and
wherein the first and second well regions and the separation impurity region are in contact with a top surface of the lower buried insulation layer.

15. The three-dimensional semiconductor device of claim 12, wherein the pair of impurity regions doped with the second conductivity impurities include:
first portions extending in a first direction and spaced apart from each other in a second direction crossing the first direction; and
second portions extending parallel to the second direction and spaced apart from each other in the first direction.

16. The three-dimensional semiconductor device of claim 12, wherein the separation impurity region has substantially the same depth as those of the first and second well regions.

17. The three-dimensional semiconductor device of claim 12, wherein the semiconductor layer includes a first PN junction formed between the first well region and the separation impurity region and a second PN junction formed between the second well region and the separation impurity region.

18. The three-dimensional semiconductor device of claim 17, further comprising:
an upper buried insulation layer on the semiconductor layer and covering the stack structure,
wherein the semiconductor layer comprises an opening between the first and second well regions and exposing the lower buried insulation layer.

19. The three-dimensional semiconductor device of claim 18, wherein the opening of the semiconductor layer is filled with the upper buried insulation layer.

* * * * *